(12) United States Patent
Lee et al.

(10) Patent No.: US 9,583,534 B2
(45) Date of Patent: Feb. 28, 2017

(54) SEMICONDUCTOR DEVICE INCLUDING MAGNETO-RESISTIVE DEVICE

(71) Applicants: Choong-jae Lee, Hwaseong-si (KR); Hong-kook Min, Yongin-si (KR); Bo-young Seo, Suwon-si (KR); Aliaksei Ivaniukovich, Hwaseong-si (KR); Yong-kyu Lee, Gwacheon-si (KR)

(72) Inventors: Choong-jae Lee, Hwaseong-si (KR); Hong-kook Min, Yongin-si (KR); Bo-young Seo, Suwon-si (KR); Aliaksei Ivaniukovich, Hwaseong-si (KR); Yong-kyu Lee, Gwacheon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/795,882

(22) Filed: Jul. 9, 2015

(65) Prior Publication Data
US 2016/0126289 A1    May 5, 2016

(30) Foreign Application Priority Data
Oct. 31, 2014    (KR) .......................... 10-2014-0150622

(51) Int. Cl.
*H01L 27/22*    (2006.01)
*H01L 43/02*    (2006.01)
(Continued)

(52) U.S. Cl.
CPC ........ *H01L 27/228* (2013.01); *H01L 29/1045* (2013.01); *H01L 29/7835* (2013.01); *H01L 43/08* (2013.01); *H01L 29/7833* (2013.01)

(58) Field of Classification Search
CPC ....... H01L 27/22; H01L 27/222; H01L 43/00; H01L 43/08; H01L 43/04
(Continued)

(56) References Cited

U.S. PATENT DOCUMENTS 4,843,594 A    6/1989   Tanaka et al.
5,311,465 A    5/1994   Mori et al.
(Continued)

FOREIGN PATENT DOCUMENTS

JP    4084089      2/2008
JP    4157582 B1   7/2008
(Continued)

*Primary Examiner* — Cuong Q Nguyen
(74) *Attorney, Agent, or Firm* — Renaissance IP Law Group LLP

(57) ABSTRACT

A semiconductor device comprises a magneto-resistive device capable of performing multiple functions with low power. The semiconductor device comprises a cell transistor in which a first impurity region and a second impurity region are respectively arranged on both sides of a channel region in a channel direction, a source line connected to the first impurity region of the cell transistor, and the magneto-resistive device connected to the second impurity region of the cell transistor. The first impurity region and the second impurity region are asymmetrical about a center of the cell transistor in the channel direction with respect to at least one of a shape and an impurity concentration distribution.

19 Claims, 42 Drawing Sheets

(51) Int. Cl.
*H01L 43/08* (2006.01)
*H01L 29/10* (2006.01)
*H01L 29/78* (2006.01)

(58) Field of Classification Search
USPC .................................................. 257/421–422
See application file for complete search history.

(56) References Cited

U.S. PATENT DOCUMENTS

| | | | |
|---|---|---|---|
| 5,654,913 | A | 8/1997 | Fukushima et al. |
| 6,856,537 | B2 | 2/2005 | Tanizaki et al. |
| 6,903,969 | B2 | 6/2005 | Bhattacharyya |
| 7,821,818 | B2 | 10/2010 | Dieny et al. |
| 7,825,478 | B2 * | 11/2010 | Jung ................... G11C 11/16 257/536 |
| 7,880,160 | B2 * | 2/2011 | Nirschl ............... H01L 27/2436 257/3 |
| 8,009,480 | B2 | 8/2011 | Abiko et al. |
| 8,111,538 | B2 | 2/2012 | Hosotani et al. |
| 8,149,610 | B2 | 4/2012 | Chen et al. |
| 8,203,885 | B2 | 6/2012 | Abiko et al. |
| 8,331,127 | B2 | 12/2012 | Chen et al. |
| 8,415,743 | B2 | 4/2013 | Cai et al. |
| 8,530,287 | B2 | 9/2013 | Cai et al. |
| 8,625,338 | B2 | 1/2014 | Zhu et al. |
| 8,670,201 | B2 | 3/2014 | Matsubara et al. |
| 2010/0208515 | A1 | 8/2010 | Aoki et al. |

FOREIGN PATENT DOCUMENTS

| | | |
|---|---|---|
| JP | 2010212661 | 9/2010 |
| JP | 5048860 | 7/2012 |
| JP | 5097028 | 9/2012 |
| KR | 20130125320 | 11/2013 |

* cited by examiner

SEMICONDUCTOR DEVICE INCLUDING MAGNETO-RESISTIVE DEVICE

CROSS-REFERENCE TO RELATED APPLICATIONS

This application claims the benefit of priority under 35 U.S.C. §119(a) from Korean Patent Application No. 10-2014-0150622, filed on Oct. 31, 2014, in the Korean Intellectual Property Office, the disclosure of which is incorporated herein in its entirety by reference.

BACKGROUND

Embodiments disclosed herein relate to semiconductor devices comprising magneto-resistive devices, and more particularly, to a semiconductor device comprising a transistor that is connected to a magneto-resistive device.

With rapid developments in the electronic industry and demands of users, electronic devices are becoming more compact and lightweight. The need for portable electronic devices is increasing. Thus, to satisfy the need for portable electronic devices, there is an increasing need for semiconductor devices capable of low-power multi-functional performance.

SUMMARY

Embodiments disclosed herein provide a semiconductor device comprising a magneto-resistive device capable of performing multiple functions with low power.

One exemplary embodiment provides a semiconductor device comprising a cell transistor in which a first impurity region and a second impurity region are respectively arranged on both sides of a channel region in a channel direction; a source line connected to the first impurity region of the cell transistor; and a magneto-resistive device connected to the second impurity region of the cell transistor. The first impurity region and the second impurity region are asymmetrical about a center of the cell transistor in the channel direction with respect to at least one of a shape or an impurity concentration distribution.

A lowermost surface of the first impurity region may be on a level that is lower than a lowermost surface of the second impurity region.

The first impurity region and the second impurity region may respectively include first and second source/drain regions that are symmetrical to each other about the center of the cell transistor in the channel direction of the cell transistor.

The first impurity region may further include a first hollow region formed in contact with a lower portion of the first source/drain region.

The first source/drain region and the first hollow region may be of different conductivity types.

The first and second impurity regions may further respectively include first and second hollow regions that are respectively formed in contact with lower portions of the first and second source/drain regions and are of different conductivity types from the first and second source/drain regions. An impurity concentration of the first hollow region may be greater than an impurity concentration of the second hollow region.

The first impurity region and the second impurity region may respectively include first and second Lightly Doped Drain (LDD) regions that respectively extend from the first and second source/drain regions toward the channel region and have a same conductivity type as the first and second source/drain regions. The first LDD region and the second LDD region may be asymmetrical about the center of the cell transistor in the channel direction of the cell transistor with respect to at least one of a shape and an impurity concentration distribution.

An impurity concentration of each of the first and second LDD regions may be less than an impurity concentration of each of the first and second source/drain regions.

The first LDD region and the second LDD region may have different widths in the channel direction.

The impurity concentration of the first LDD region may be less than the impurity concentration of the second LDD region.

A threshold voltage of the cell transistor with respect to a current flow in a direction from the first impurity region to the second impurity region may be lower than a threshold voltage of the cell transistor with respect to a current flow in a direction from the second impurity region to the first impurity region.

The cell transistor may be an n-type metal oxide semiconductor field effect transistor (n-MOSFET).

A flow of a current for reading data from the magneto-resistive device may be in the direction from the second impurity region to the first impurity region.

Embodiments disclosed herein provide a semiconductor device comprising two cell transistors comprising a common impurity region and a first individual impurity region and a second individual impurity region that are respectively disposed on both sides of the common impurity region to respectively define channel regions; a source line connected to the common impurity region; and first and second magneto-resistive devices respectively connected to the first and second individual impurity regions. Respective opposite portions of the common impurity region and the first individual impurity region are asymmetrical to each other about a center of the channel region of the first individual impurity region in the channel direction with respect to at least one of a shape and an impurity concentration distribution. Respective opposite portions of the common impurity region and the second individual impurity region are asymmetrical to each other about a center of the channel region of the second individual impurity region in the channel direction with respect to at least one of a shape and an impurity concentration distribution.

A lowermost surface of the common impurity region may be on a level that is lower than a lowermost surface of each of the first and second individual impurity regions.

The common impurity region, the first individual impurity region, and the second individual impurity region may include a common source/drain region, a first individual source/drain region, and a second individual source/drain region, respectively, having lowermost surfaces that are on an identical level. The common impurity region may further include first and second hollow regions respectively formed in contact with both ends of a lower portion of the common source/drain region to respectively face the first and second individual impurity regions.

The first and second individual impurity regions may further respectively include third and fourth hollow regions respectively formed in contact with respective lower portions of the first and second source/drain regions to face the common impurity region. An impurity concentration of each of the first and second hollow regions may be higher than an impurity concentration of each of the third and fourth hollow regions.

Embodiments disclosed herein provide a semiconductor device comprising a substrate comprising a cell region and a logic region; a cell transistor in which a first cell impurity region and a second cell impurity region are respectively arranged on both sides of a cell channel region in a channel direction, a source line connected to the first cell impurity region, and a magneto-resistive device connected to the second cell impurity region, the cell transistor, the source line, and the magneto-resistive device being formed in the cell region; and a logic transistor that is formed in the logic region and in which a first logic impurity region and a second logic impurity region are respectively arranged on both sides of a logic channel region in a channel direction. The first cell impurity region and the second cell impurity region are asymmetrical to each other about a center of the cell transistor in a cell channel direction with respect to at least one of a shape and an impurity concentration distribution, and the first logic impurity region and the second logic impurity region are symmetrical to each other about a center of the logic transistor in a logic channel direction.

A lowermost surface of the first cell impurity region may be on a level that is lower than a lowermost surface of the second cell impurity region.

A lowermost surface of the first cell impurity region may be on a level that is lower than a lowermost surface of each of the first and second logic impurity regions.

The first cell impurity region and the second cell impurity region may respectively include first and second cell source/drain regions that are symmetrical to each other about the center of the cell transistor in the cell channel direction, and the first logic impurity region and the second logic impurity region may respectively include first and second logic source/drain regions that are symmetrical to each other about the center of the logic transistor in the logic channel direction.

The first cell impurity region may further include a first cell hollow region formed in contact with a lower portion of the first cell source/drain region.

The first and second cell impurity regions may further respectively include first and second cell hollow regions respectively formed in contact with respective lower portions of the first and second cell source/drain regions, and an impurity concentration of the first cell hollow region may be greater than an impurity concentration of the second cell hollow region.

The first and second logic impurity regions may further respectively include first and second logic hollow regions respectively formed in contact with lower portions of the first and second logic source/drain regions, and an impurity concentration of the first cell hollow region may be greater than an impurity concentration of each of the first and second logic hollow regions.

An impurity concentration of each of the first and second logic hollow regions may be greater than an impurity concentration of the second cell hollow region.

The cell transistor may include a cell gate electrode and a cell gate dielectric layer, and the logic transistor may include a logic gate electrode and a logic gate dielectric layer. The cell gate dielectric layer and the logic gate dielectric layer may be formed of a substantially identical material.

The cell gate electrode and the logic gate electrode may have upper surfaces that are on a same level, and may be formed of a substantially identical material.

The cell gate dielectric layer and the logic gate dielectric layer may have substantially identical thicknesses.

A threshold voltage of the cell transistor, according to directions of current flows between the first cell impurity region and the second cell impurity region, may be higher if the current flow between the first cell impurity region and the second cell impurity region for reading data from the magneto-resistive device is in a first direction than if the current flow is in a second direction that is opposite to the first direction.

Threshold voltages of the logic transistor according to current flows in the first and second directions between the first logic impurity region and the second logic impurity region may be substantially the same as each other.

Some exemplary embodiments provide a semiconductor device comprising a cell transistor, a source line and a magneto-resistive device. The cell transistor comprises a channel region, a first impurity region and a second impurity region. The channel region comprises a first end and a second end. The first impurity region is disposed at the first end of the channel region and the second impurity region is disposed at the second end of the channel region. A threshold voltage of the cell transistor for a current flow in a direction from the first impurity region to the second impurity region is less than a threshold voltage of the cell transistor for a current flow in a direction from the second impurity region to the first impurity region. The source line is coupled to the first impurity region of the cell transistor, and the magneto-resistive device is coupled to the second impurity region of the cell transistor. In one exemplary embodiment, the cell transistor is an n-type metal oxide semiconductor field effect transistor (n-MOSFET), and a flow of a current for reading data from the magneto-resistive device is in the direction from the second impurity region to the first impurity region.

In one exemplary embodiment, the first impurity region and the second impurity region are asymmetrical about a center of the cell transistor in the channel direction with respect to at least one of a shape or an impurity concentration distribution. In another exemplary embodiment, the first impurity region and the second impurity region respectively comprise first and second source/drain regions that are symmetrical to each other about the center of the cell transistor in the channel direction.

In one exemplary embodiment, the first impurity region further comprises a first hollow region formed in contact with a lower portion of the first source/drain region. In another exemplary embodiment, the first source/drain region and the first hollow region comprise different conductivity types.

In one exemplary embodiment, the first and second impurity regions further respectively comprise first and second hollow regions that are respectively formed in contact with lower portions of the first and second source/drain regions, the first and second hollow regions comprising different conductivity types from the first and second source/drain regions, and an impurity concentration of the first hollow region is greater than an impurity concentration of the second hollow region.

In one exemplary embodiment, the first impurity region and the second impurity region respectively comprise first and second Lightly Doped Drain (LDD) regions that respectively extend from the first and second source/drain regions toward the channel region, the first and second LDD regions comprising a same conductive type as the first and second source/drain regions, and the first LDD region and the second LDD region are asymmetrical in terms of at least one a shape or an impurity concentration distribution about the center of the cell transistor in the channel direction.

In one exemplary embodiment, an impurity concentration of each of the first and second LDD regions is lower than an impurity concentration of each of the first and second source/drain regions. In another exemplary embodiment, the first LDD region and the second LDD region have different widths in the channel direction. In still another exemplary embodiment, the impurity concentration of the first LDD region is lower than the impurity concentration of the second LDD region.

In one exemplary embodiment, the semiconductor device further comprises a logic region comprising a logic transistor. The logic transistor comprises a logic channel region, a first logic impurity region and a second logic impurity region that are arranged on both sides of the logic channel region in a channel direction. The first threshold voltage of the logic transistor for a current flow in a first direction between the first logic impurity region and the second logic impurity region and a second threshold voltage of the logic transistor for a current flow in a second direction between the first logic impurity region and the second logic impurity region are substantially the same as each other in which the second direction is opposite to the first direction.

In one exemplary embodiment, the first logic impurity region and the second logic impurity region are substantially symmetrical to each other about a center of the logic transistor in a logic channel direction. In another exemplary embodiment, a lowermost surface of the first cell impurity region is on a level that is lower than a lowermost surface of each of the first and second logic impurity regions.

Exemplary embodiments provides that the semiconductor devices disclosed herein may be part of a computing device, a personal digital assistant (PDA), a laptop computer, a mobile computer, a web tablet, a wireless phone, a cell phone, a smart phone, a digital music player, or a wireline or wireless electronic device.

Exemplary embodiments provide a semiconductor device comprising first and second cell transistors, a source line and first and second magneto-resistive devices. The first and second cell transistors comprise a common impurity region, a first individual impurity region and a second individual impurity region. The common impurity region comprises a first end and a second end. A first channel region is disposed between the first end of the common impurity region and the first individual impurity region and a second channel region is disposed between the second end of the common impurity region and the second individual impurity region. A threshold voltage of the first cell transistor for a current flow in a direction from the first impurity region to the common impurity region is less than a threshold voltage of the first cell transistor for a current flow in a direction from the common impurity region to the first impurity region. A threshold voltage of the second cell transistor for a current flow in a direction from the second impurity region to the common impurity region is less than a threshold voltage of the second cell transistor for a current flow in a direction from the common impurity region to the second impurity region. The source line is coupled to the common impurity region. The first and second magneto-resistive devices are respectively coupled to the first and second individual impurity regions.

In one exemplary embodiment, the first end of the common impurity region and the first individual impurity region is asymmetrical to each other about a center of the first channel region with respect to at least one of a shape and an impurity concentration distribution about a center of the channel region of the first individual impurity region in the channel direction, and the second end of the common impurity region and the second individual impurity region is asymmetrical to each other about a center of the second channel region with respect to at least one of a shape and an impurity concentration distribution.

In one exemplary embodiment, a lowermost surface of the common impurity region is on a level that is lower than a lowermost surface of each of the first and second individual impurity regions.

In one exemplary embodiment, the common impurity region, the first individual impurity region, and the second individual impurity region respectively comprise a common source/drain region in which a first individual source/drain region, and a second individual source/drain region each have lowermost surfaces that are on an identical level, and the common impurity region further comprises first and second hollow regions respectively formed in contact with the first end and the second end of a lower portion of the common source/drain region in which the first and second hollow regions respectively face the first and second individual impurity regions.

In one exemplary embodiment, the first and second individual impurity regions further respectively comprise third and fourth hollow regions respectively formed in contact with respective lower portions of the first and second source/drain regions in which the third and fourth hollow regions respectively face the common impurity region, and an impurity concentration of each of the first and second hollow regions is greater than an impurity concentration of each of the third and fourth hollow regions.

Exemplary embodiments provides that the semiconductor devices disclosed herein may be part of a computing device, a personal digital assistant (PDA), a laptop computer, a mobile computer, a web tablet, a wireless phone, a cell phone, a smart phone, a digital music player, or a wireline or wireless electronic device.

BRIEF DESCRIPTION OF THE DRAWINGS

Exemplary embodiments disclosed herein will be more clearly understood from the following detailed description taken in conjunction with the accompanying drawings in which.

DETAILED DESCRIPTION OF THE EMBODIMENTS

Figure 1:
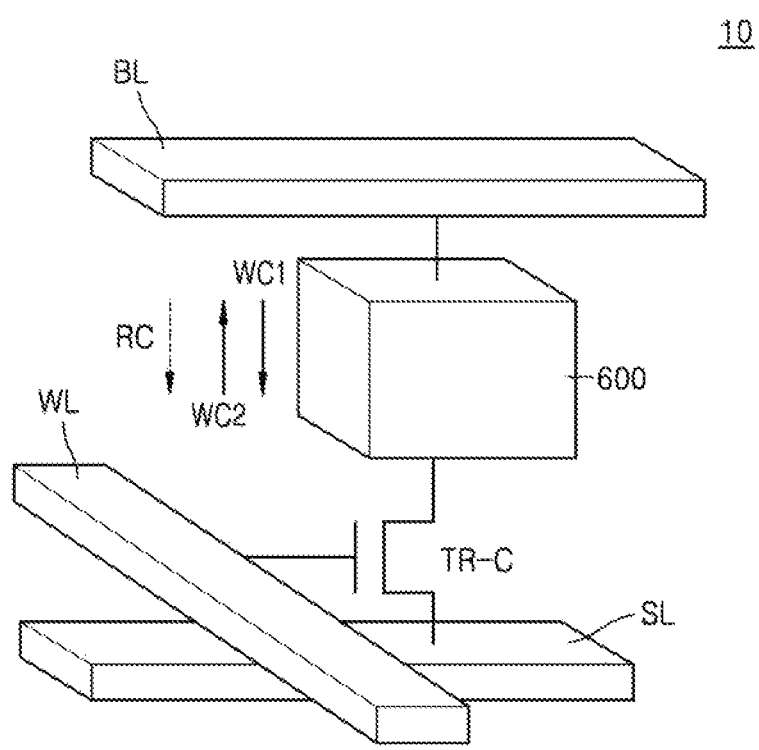
FIG. 1 is a schematic diagram showing a schematic structure of a semiconductor device including a magneto-resistive device according to an embodiment disclosed herein.

The embodiments disclosed herein will now be described more fully with reference to the accompanying drawings, in which exemplary embodiments of the inventive concept are shown. Like reference numerals in the drawings denote like elements, and thus their description will be omitted.

The embodiments disclosed herein may, however, be embodied in many different forms and should not be construed as being limited to the embodiments set forth herein; rather, these embodiments are provided so that this disclosure will be thorough and complete, and will fully convey the claimed subject matter to one of ordinary skill in the art. As used herein, the word "exemplary" means "serving as an example, instance, or illustration." Any embodiment described herein as "exemplary" is not to be construed as necessarily preferred or advantageous over other embodiments. Additionally, it will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third, etc., may be used herein to describe various components, these components should not be limited by these terms. These terms are only used to distinguish one component from another component. Thus, a first component discussed below could be termed a second component without departing from the teachings disclosed herein. For example, a first component discussed below could be termed a second component, and similarly, a second component may be termed a first component without departing from the teachings of this disclosure.

Unless otherwise defined, all terms (including technical and scientific terms) used herein have the same meaning as commonly understood by one of ordinary skill in the art to which the subject matter disclosed herein belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

If a certain embodiment may be implemented differently, a specific process order may be performed differently from the described order. For example, two consecutively described processes may be performed substantially at the same time or performed in an order opposite to the described order.

As such, variations from the shapes of the illustrations as a result, for example, of manufacturing techniques and/or tolerances, are to be expected. Thus, embodiments of the inventive concept should not be construed as being limited to the particular shapes of regions illustrated herein but are to include deviations in shapes that result, for example, from manufacturing.

As used herein, the term "and/or" includes any and all combinations of one or more of the associated listed items. Expressions such as "at least one of," if preceding a list of elements, modify the entire list of elements and do not modify the individual elements of the list.

FIG. 1 is a schematic diagram showing a schematic structure of a semiconductor device 10 including a magneto-resistive device 600 according to an embodiment disclosed herein.

Referring to FIG. 1, the semiconductor package 10 may comprise the magneto-resistive device 600 and a cell transistor TR-C. The semiconductor device 10 may include, for example, spin transfer torque-magnetic random access memory (STT-MRAM). A gate of the cell transistor TR-C is connected to a word line WL, and a source/drain region of the cell transistor TR-C is connected to a bit line BL via the magneto-resistive device 600. Another source/drain region of the cell transistor TR-C is connected to a source line SL.

The magneto-resistive device 600 may have, for example, a magnetic tunnel junction (MTJ) structure. A detailed description of the magneto-resistive device 600 will be given later with reference to FIGS. 33-41.

A resistance value of the magneto-resistive device 600 varies depending on a magnetization direction. If magnetization directions of two layers that constitute the magneto-resistive device 600 are parallel, the magneto-resistive device 600 may have a low-resistance value and may store data "0". If the magnetization directions of the two layers that constitute the magneto-resistive device 600 are anti-parallel, the magneto-resistive device 600 may have a high-resistance value and may store data "1". The magnetization directions of the two layers that constitute the magneto-resistive device 600 are not limited thereto, and their states of being parallel and being anti-parallel according to the data that is stored may be switched.

In the semiconductor device 10 of FIG. 1, to perform a write operation of STT-MRAM, a logic high voltage is applied to the word line WL to turn on the cell transistor TR-C, and write currents WC1 and WC2 are applied between the bit line BL and the source line SL. At this time, the magnetization directions may be determined according to the directions of the write currents WC1 and WC2. For example, if the first write current WC1 is applied, the two layers that constitute the magneto-resistive device 600 may be magnetized in parallel magnetization directions. Also, if the second write current WC2 is applied, the two layers that constitute the magneto-resistive device 600 may be magnetized in anti-parallel magnetization directions.

In the semiconductor device 10 of FIG. 1, to perform a read operation of STT-MRAM, a logic high voltage is applied to the word line WL to turn on the cell transistor TR-C, and the data stored in the magneto-resistive device 600 may be determined by supplying a read current RC in a direction from the bit line BL to the source line SL. In this case, because the magnitude of the read current RC is much less than the magnitudes of each of the write currents WC1 and WC2, the read current RC may not cause the magnetization direction inside of the magneto-resistive device 600 to change.

If a current is applied to read from or write data to the semiconductor device 10, a gate-to-source voltage $V_{GS}$ of the cell transistor TR-C may vary according to a direction of the current. For example, because the magneto-resistive device 600 has a resistance value, if an identical voltage difference exists between the bit line BL and the source line SL, the gate-to-source voltage $V_{GS}$ of the cell transistor TR-C may be changed due to a voltage drop that occurs in the magneto-resistive device 600. For example, the gate-to-source voltage $V_{GS}$ of the cell transistor TR-C may be greater if a current is applied in the direction from the bit line BL to the source line SL (hereinafter, referred to as a first current direction) than if a current is applied in a direction from the source line SL to the bit line BL (hereinafter, referred to as a second current direction).

If a threshold voltage of the cell transistor TR-C when a current is applied in the first current direction is identical to the threshold voltage of the cell transistor TR-C when a current is applied in the second current direction and the cell transistor TR-C is an n-MOSFET, the cell transistor TR-C may be turned on at a lower gate voltage $V_G$ if a current is applied in the first current direction than if a current is applied in the second current direction.

The cell transistor TR-C of the semiconductor device 10 may form a threshold voltage if a current is applied in the first current direction and different a threshold voltage if a current is applied in the second current direction. Accordingly, a difference between the gate voltages $V_G$ at which the cell transistor TR-C is turned on may be reduced if a current is applied in the first current direction and if a current is applied in the second current direction. Alternatively, the gate voltages $V_G$ at which the cell transistor TR-C is turned on if a current is applied in the first current direction and if a current is applied in the second current direction may be made identical with each other or similar to each other. Alternatively, the cell transistor TR-C may be set to be turned on at a lower gate voltage $V_G$ if a current is applied in the second current direction than if a current is applied in the first current direction.

For example, the threshold voltage of the cell transistor TR-C if a current is applied in the first current direction may be greater than that of the cell transistor TR-C if a current is applied in the second current direction.

In the semiconductor device 10 of FIG. 1, if a read current RC is applied to perform a read operation and a direction in which the read current RC is applied is in the first current direction, the threshold voltage of the cell transistor TR-C may be set to be relatively high, and thus a leakage current may decrease, a read margin may be provided, and power consumption may decrease. In the semiconductor device 10 of FIG. 1, if a second write current WC2 is applied to perform a write operation and a direction in which the second write current WC2 is applied is in the second current direction, the threshold voltage of the cell transistor TR-C may be set to be relatively low, and thus a current driving capability may be provided for the write operation.

In the semiconductor device 10 of FIG. 1, to perform a write operation, the first write current WC1 may be applied in which a current flowing direction is in the first current direction, or the second write current WC2 may be applied in which a current flowing direction is in the second current direction. In this case, if the threshold voltage of the cell transistor TR-C when a current flowing direction is in the first current direction is set to be greater than that if a current flowing direction is in the second current direction, a difference between the current driving capability may be reduced if the first write current WC1 is applied to the semiconductor device 10 and if the second write current WC2 is applied to the semiconductor device 10.

Although the semiconductor device 10 in which the cell transistor TR-C is an n-MOSFET has been described above with reference to FIG. 1, it should be understood that even if the cell transistor TR-C is a p-MOSFET, threshold voltages according to current directions may be asymmetrically formed according to the same principle as that described above with reference to FIG. 1. Thus, a detailed description thereof is omitted herein. Moreover, although a case in which an illustrated transistor is an n-MOSFET is described throughout the specification, it should be understood that the n-MOSFET may be replaced with a p-MOSFET or that both an n-MOSFET and a p-MOSFET may be used. Thus, a detailed description thereof is omitted herein.

Figure 2:
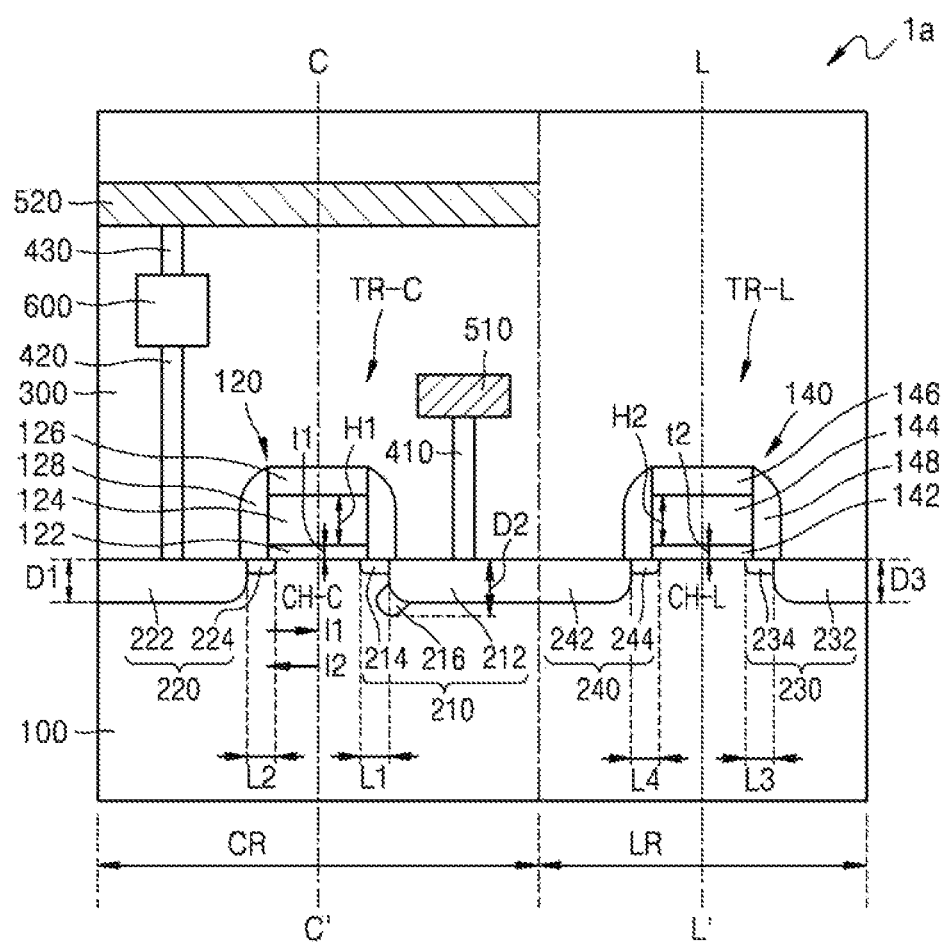
FIG. 2 is a cross-sectional view illustrating relevant portions of a semiconductor device including a magneto-resistive device according to an embodiment disclosed herein.

FIG. 2 is a cross-sectional view illustrating relevant portions of a semiconductor device 1a including the magneto-resistive device 600 according to an embodiment disclosed herein.

Referring to FIG. 2, the semiconductor device 1a comprises a substrate 100 having a cell region CR and a logic region LR. In the cell region CR, a cell transistor TR-C and the magneto-resistive device 600 are formed. In the logic region LR, a logic transistor TR-L is formed.

The substrate 100 may comprise, for example, silicon (Si). Alternatively, the substrate 100 may comprise a semiconductor element, such as, Ge, or a compound semiconductor, such as, Si carbide (SiC), gallium arsenide (GaAs), indium arsenide (InAs), or indium phosphide (InP). The substrate 100 may have a silicon-on-insulator (SOI) structure. For example, the substrate 100 may include a buried oxide (BOX) layer. The substrate 100 may include a conductivity region, for example, an impurity-doped well.

In the substrate 100, an active region where a cell channel region CH-C and a logic channel region CH-L are arranged is defined by an isolation layer (not shown). The substrate 100 of FIG. 2 may correspond to the active region. The isolation layer may be formed of, for example, a material comprising at least one of silicon oxide, silicon nitride, and silicon oxynitride. The isolation layer may be a single layer comprising one type of insulation layer, a dual layer comprising two types of insulation layers, or a multi-layer comprising at least three types of insulation layers. For example, the isolation layer may comprise two types of insulation layers. For example, the isolation layer may comprise a silicon oxide layer and a silicon nitride layer. For example, the isolation layer may be a triple layer comprising a silicon oxide layer, a silicon nitride layer, and a silicon oxide layer. The isolation layer may have a shallow trench isolation (STI) structure.

The cell transistor TR-C and the logic transistor TR-L respectively include a cell gate dielectric layer 122 and a logic gate dielectric layer 142, a cell gate electrode 124 and a logic gate electrode 144, first impurity regions 210 and 230, and second impurity regions 220 and 240. An upper surface and both lateral surfaces of the cell gate electrode 124 may be respectively insulated by a cell capping pattern 126 and a cell insulation spacer 128. An upper surface and both lateral surfaces of the logic gate electrode 144 may be respectively insulated by a logic capping pattern 146 and a logic insulation spacer 148. The cell gate dielectric layer 122, the cell gate electrode 124, the cell capping pattern 126, and the cell insulation spacer 128 may be collectively referred to as a gate structure 120; and the logic gate dielectric layer 142, the logic gate electrode 144, the logic capping pattern 146, and the logic insulation spacer 148 may be collectively referred to as a gate structure 140.

The cell and logic gate dielectric layers 122 and 142 and the cell and logic gate electrodes 124 and 144 of the cell transistor TR-C and the logic transistor TR-L may be formed together. In other words, by sequentially forming an insulative-material layer and a conductive-material layer on the substrate 100 and then patterning the same, the cell gate dielectric layer 122 and the cell gate electrode 124 in the cell region CR and the logic gate dielectric layer 142 and the logic gate electrode 144 in the logic region LR may be formed together. Accordingly, the cell and logic gate dielectric layers 122 and 142 may be formed of the same material.

Alternatively, a thickness t1 of the cell gate dielectric layer 122 may be substantially the same as a thickness t2 of the logic gate dielectric layer 142. The cell and logic gate electrodes 124 and 144 may be formed of the same material. A thickness H1 of the cell gate electrode 124 may be substantially the same as a thickness H2 of the logic gate electrode 144. Alternatively, the cell and logic gate electrodes 124 and 144 may respectively have upper surfaces that are substantially on the same level.

The cell and logic gate dielectric layers 122 and 142 may be formed of at least one layer selected from a silicon-oxide layer, a silicon-nitride layer, a silicon-oxynitride layer, an oxide/nitride/oxide (ONO), or a high-k dielectric film having a greater dielectric constant than a silicon-oxide layer. For example, each of the cell and logic gate dielectric layers 122 and 142 may have a dielectric constant of about 10 to about 25. In some embodiments, the cell and logic gate dielectric layers 122 and 142 may be formed of at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the cell and logic gate dielectric layers 122 and 142 may be formed of $HfO_2$, $Al_2O_3$, $HfAlO_3$, $Ta_2O_3$, or $TiO_2$.

The cell and logic gate dielectric layers 122 and 142 may be formed of at least one material selected from Ti, TiN, Ta, TaN, W, WN, TiSiN, and WSiN.

Portions of the first impurity regions 210 and 230 and the second impurity regions 220 and 240 of the cell transistor TR-C and the logic transistor TR-L may be formed together, and this will be described later.

An impurity region used herein denotes an impurity region that constitutes each of a source region and a drain region respectively formed on both ends of a transistor and contributes to an operation of the transistor. The impurity region used herein, however, may not include an impurity-injected region integrally formed to give the same effect to the source region and the drain region at both ends of the transistor, for example, a well and/or an impurity-injected region for controlling a threshold voltage.

Although components of the impurity region used herein are illustrated as being demarcated in this specification, this only indicates that the components are formed independently during a manufacturing process. Thus, it should be understood that because the components of an impurity region affect each other according to their impurity concentrations and their conductivity types, the components may appear to be electrically connected to each other. Thus, a detailed description thereof is omitted herein.

The first cell impurity region 210 of the cell transistor TR-C may be electrically connected to a source line 510. The first cell impurity region 210 of the cell transistor TR-C may be electrically connected to the source line 510 via a first contact plug 410.

The second cell impurity region 220 of the cell transistor TR-C may be connected to a bit line 520 with the magneto-resistive device 600 interposed therebetween. The second cell impurity region 220 of the cell transistor TR-C may be electrically connected to the magneto-resistive device 600 via a second contact plug 420. The magneto-resistive device 600 may be electrically connected to the bit line 520 via a third contact plug 430. The first, second, and third contact plugs 410, 420, and 430 are used for electrical connections among the cell transistor TR-C, the source line 510, the bit line 520, and the magneto-resistive device 600, but embodiments disclosed herein are not limited thereto. In other words, as long as the cell transistor TR-C, the source line 510, the bit line 520, and the magneto-resistive device 600 are able to be electrically connected to one another, at least one of the first, second, and third contact plugs 410, 420, and 430 may be omitted, or may be replaced by other components.

Depending on the type of a logic device that is desired to be formed in the logic region LR, components electrically connectable to the first logic impurity region 230 and the second logic impurity region 240 of the logic transistor TR-L and connection relationships therebetween may vary. Thus, detailed illustrations thereof are omitted. For example, the first logic impurity region 230 of the logic transistor TR-L may be electrically connected to a conductive pattern (not shown) that is on the same level as the source line 510, and the second logic impurity region 240 of the logic transistor TR-L may be electrically connected to a conductive pattern (not shown) that is on the same level as the bit line 520. Alternatively, the first and second logic impurity regions 230 and 240 of the logic transistor TR-L may be respectively electrically connected to different conductive patterns (not shown) that are on the same level as the source line 510, or may be respectively electrically connected to different conductive patterns (not shown) that are on the same level as the bit line 520. Alternatively, at least one of the first and second logic impurity regions 230 and 240 of the logic transistor TR-L may be electrically connected to a conductive pattern that is on a different level from the source line 510 and the bit line 520.

An interlayer-insulation layer 300 for electrical insulation between conductive components, such as the first, second, and third contact plugs 410, 420, and 430, the source line 510, the bit line 520, and the magneto-resistive device 600, may be formed on the substrate 100 on which the cell transistor TR-C and the logic transistor TR-L have been formed. The interlayer-insulation insulation layer 300 may be formed of oxide, nitride, oxynitride, or a combination thereof. In one exemplary embodiment, the interlayer-insulation layer 300 may be formed of, for example, silicon oxide. For example, the interlayer-insulation layer 300 may be formed of tetraethylorthosilicate (TEOS), high density plasma (HDP), or boro-phospho silicate glass (BPSG). The interlayer-insulation layer 300 may have a multi-layered structure in which a plurality of insulation layers is stacked.

The first impurity regions 210 and 230 and the second impurity regions 220 and 240 may respectively include first source/drain regions 212 and 232 and second source/drain regions 222 and 242. If the cell and logic channel regions CH-C and CH-L are of a first conductivity type, the first source/drain regions 212 and 232 and the second source/drain regions 222 and 242 may be of a second conductivity type that is different from the first conductivity type. The first source/drain regions 212 and 232 and the second source/drain regions 222 and 242 may be formed simultaneously.

The first impurity regions 210 and 230 and the second impurity regions 220 and 240 may further respectively include first Lightly Doped Drain (LDD) regions 214 and 234 and second LDD regions 224 and 244. The first LDD regions 214 and 234 and the second LDD regions 224 and 244 may be of the second conductivity type. The first LDD regions 214 and 234 and the second LDD regions 224 and 244 may respectively have lower impurity concentrations than the first source/drain regions 212 and 232 and the second source/drain regions 222 and 242. The first LDD regions 214 and 234 and the second LDD regions 224 and 244 may be formed simultaneously.

The first cell impurity region 210 may further include a first hollow region 216. The first hollow region 216 may be formed in contact with a lower portion of the first cell source/drain region 212. The first hollow region 216 may face the cell channel region CH-C by contacting the lower portion of the first cell source/drain region 212. The first hollow region 216 may be referred to as a first cell hollow region 216 because the first hollow region 216 is formed in the cell region CR. The first hollow region 216 may be of the first conductivity type. The first hollow region 216 may have a greater impurity concentration than the cell channel region CH-C.

The first hollow region 216 may be formed by exposing at least a portion of the first cell impurity region 210 on the substrate 100 on which the gate structures 120 and 140 have been formed, forming a mask pattern to cover the second cell impurity region 220 and the first and second logic impurity regions 230 and 240, and then performing ion injection. During the ion injection to form the first hollow region 216, ions may be injected obliquely with respect to a direction perpendicular to a surface of the substrate 100. During the ion injection to form the first hollow region 216, ions may be injected obliquely at a greater angle than an angle for preventing a typical channeling effect.

The first cell source/drain region 212 and the second cell source/drain region 222 may be symmetrical or substantially symmetrical to each other about a center C-C' of the cell transistor TR-C in a channel direction of the cell channel region CH-C. The second logic source/drain region 232 and the second logic source/drain region 242 may be symmetrical or substantially symmetrical to each other about a center L-L' of the logic transistor TR-L in a channel direction of the logic channel region CH-L.

The first cell LDD region 214 and the second cell LDD region 224 may be symmetrical or substantially symmetrical to each other about the center C-C' of the cell transistor TR-C in a channel direction of the cell channel region CH-C. The first logic LDD region 234 and the second logic LDD region 244 may be symmetrical or substantially symmetrical to each other about the center L-L' of the logic transistor TR-L in a channel direction of the logic channel region CH-L.

In one exemplary embodiment, the first cell impurity region 210 and the second cell impurity region 220 may be asymmetrical to each other about the center C-C' of the cell transistor TR-C in a channel direction of the cell channel region CH-C because the first cell impurity region 210 includes the first hollow region 216. The first logic impurity region 230 and the second logic impurity region 240 may be symmetrical or substantially symmetrical to each other about the center L-L' of the logic transistor TR-L in a channel direction of the logic channel region CH-L.

Throughout the specification, being symmetrical or substantially symmetrical to each other about a center of a transistor in a channel direction of a channel region may not only denote being symmetrical in terms of shape, but also in terms of impurity concentration distribution, and being asymmetrical to each other about a center of a transistor in a channel direction of a channel region may denote being asymmetrical in terms of shape and/or impurity concentration distribution.

The fact that impurity regions of a transistor are symmetrical or asymmetrical about a center of a transistor in a channel direction of a channel region means that respective portions of the impurity regions that face each other are symmetrical or asymmetrical about the center of the transistor in the channel direction of the channel region. This is because portions of the impurity regions that are opposite to the respective facing portions of the impurity regions may be defined to have different shapes by the isolation layer or may be portions of other transistors that perform source/drain functions and because the portions of the impurity regions opposite to the respective facing portions of the impurity regions do not substantially contribute to an operation of the corresponding transistor.

A source/drain region as used herein does not denote a region of a transistor that functions as a source/drain, but denotes a region corresponding to an illustrated source/drain in a basic MOSFET structure, and does not include regions for detailed performance control of the transistor, such as an LDD region and a hollow region, which will be described later.

A source/drain region as used herein may denote portions of an impurity region of a transistor that are formed to be symmetrical or substantially symmetrical to each other about a center of the transistor in the channel direction of a channel region of the transistor. Considering a manufacturing method, a source/drain region as used herein denotes an impurity region formed by injecting ions at an identical or substantially angle when identical structures, for example, the gate structures 120 and 140 and/or mask patterns (not shown), are formed on the substrate 100. Thus, although the first LDD regions 214 and 234 are symmetrical or substantially symmetrical to the second LDD regions 224 and 244, respectively, in FIG. 2, because the first LDD regions 214 and 234 and the second LDD regions 224 and 244 are impurity regions formed using a different process from a process of forming the first source/drain regions 212 and 232 and the second source/drain regions 222 and 242 using an ion-injection process that is performed before the insulation spacers 128 and 148 are formed.

The first cell source/drain region 212 and the second cell source/drain region 222 may be formed so that their lowermost surfaces are at a first depth D1 from an upper surface of the substrate 100. The first hollow region 216 may be formed such that its lowermost surface is at a second depth D2 from the upper surface of the substrate 100. The second depth D2 may be greater than the first depth D1. Accordingly, the lowermost surface of the first cell impurity region 210 is at a lower level than the lowermost surface of the second cell impurity region 220.

The first logic source/drain region 232 and the second logic source/drain region 242 may be formed such that their lowermost surfaces are at a third depth D3 from the upper surface of the substrate 100. The third depth D3 may have substantially the same value as the first depth D1. The third depth D3 may have a smaller value than the second depth D2.

The first cell LDD region 214 and the second cell LDD region 224 may respectively have a first width L1 and a second width L2 in the channel direction of the cell channel region CH-C of the cell transistor TR-C. The first width L1 and the second width L2 may have substantially the same values.

The first logic LDD region 234 and the second logic LDD region 244 may respectively have a third width L3 and a fourth width L4 in the channel direction of the logic channel region CH-L of the logic transistor TR-L. The third width L3 and the fourth width L4 may have substantially the same values. The first, second, third, and fourth widths L1, L2, L3, and L4 may have substantially the same values.

The cell transistor TR-C may have different threshold voltages in a first current direction I1 and a second current direction I2 that are opposite directions because the first cell impurity region 210 and the second cell impurity region 220 are formed asymmetrically. For example, the threshold voltage of the cell transistor TR-C if a current flows in the first current direction I1 may be greater than that of the cell transistor TR-C if a current flows in the second current direction I2. Accordingly, in the semiconductor device 1a of FIG. 2, if a read current is applied in the first current direction I1 to read data from the magneto-resistive device 600, the threshold voltage of the cell transistor TR-C is relatively high, and thus a leakage current may decrease, a read margin may be provided, and power consumption may decrease.

With a voltage drop that occurs in the magneto-resistive device 600, a difference between a voltage that is to be applied to the cell gate electrode 124 to turn on the cell transistor TR-C if a current flows in the second current direction I2 and a voltage that is to be applied to the cell gate electrode 124 to turn on the cell transistor TR-C if a current flows in the first current direction I1 may be reduced or offset by a difference between the above-described threshold voltages. Therefore, in the semiconductor device 1a of FIG. 2, a difference between a current driving capability may be reduced if a write current is applied in the first current direction I1 to store data of "0" or "1" in the magneto-resistive device 600 and that if a write current is applied in the second current direction I2 to store data of "0" or "1" in the magneto-resistive device 600.

Details described above with reference to FIG. 2 and that appear in FIGS. 3-15 are omitted in the descriptions of FIGS. 3-15. Additionally, details described with reference to FIGS. 1-3 and that appear in FIGS. 4-15 are omitted in the descriptions of FIGS. 4-15.

Figure 3:
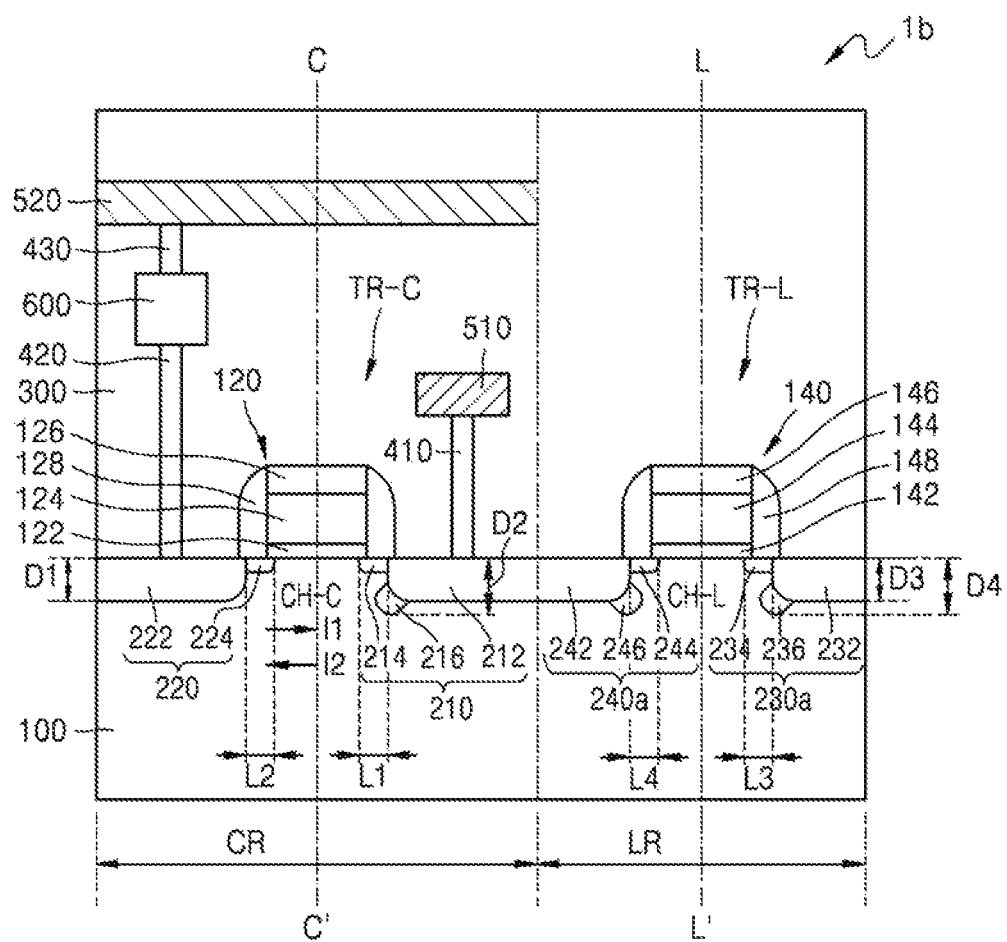
FIG. 3 is a cross-sectional view illustrating relevant portions of a semiconductor device including a magneto-resistive device according to an embodiment disclosed herein.

FIG. 3 is a cross-sectional view illustrating relevant portions of a semiconductor device 1b including the magneto-resistive device 600 according to an embodiment disclosed herein.

Referring to FIG. 3, the semiconductor device 1b comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210 and 230a, and second impurity regions 220 and 240a.

The first impurity regions 210 and 230a and the second impurity regions 220 and 240a may respectively include first source/drain regions 212 and 232 and second source/drain regions 222 and 242. The first impurity regions 210 and 230a and the second impurity regions 220 and 240a may further respectively include first LDD regions 214 and 234 and second LDD regions 224 and 244.

The first cell impurity region 210 may further include a first cell hollow region 216. The first cell hollow region 216 may be formed in contact with a lower portion of the first cell source/drain region 212. The first and second logic impurity regions 230a and 240a may further respectively include first and second logic hollow regions 236 and 246.

The first and second logic hollow regions 236 and 246 may be respectively formed in contact with lower portions of the first and second logic source/drain regions 232 and 242.

The first and second logic hollow regions 236 and 246 may be of the first conductivity type. The first and second logic hollow regions 236 and 246 may have greater impurity concentrations than the logic channel region CH-L. The first and second logic hollow regions 236 and 246 may be formed such that their lowermost surfaces are each at a fourth depth D4 from the upper surface of the substrate 100. The fourth depth D4 may be greater than the third depth D3.

The first cell hollow region 216 and the first and second logic hollow regions 236 and 246 may be formed simultaneously. Thus, the fourth depth D4 may have substantially the same value as the second depth D2.

The first cell impurity region 210 and the second cell impurity region 220 may be asymmetrical to each other about the center C-C' of the cell transistor TR-C in the channel direction of the cell channel region CH-C because the first cell impurity region 210 includes the first cell hollow region 216. The first logic impurity region 230a and the second logic impurity region 240a may be symmetrical or substantially symmetrical to each other about the center of the logic transistor TR-L L-L' in the channel direction of the logic channel region CH-L because the first logic impurity region 230a and the second logic impurity region 240a respectively include the first and second logic hollow regions 236 and 246.

The cell transistor TR-C may have different threshold voltages in a first current direction I1 and a second current direction I2 that are opposite directions because the first cell impurity region 210 and the second cell impurity region 220 are formed asymmetrically. For example, the threshold voltage of the cell transistor TR-C if a current flows in the first current direction I1 may be greater than that of the cell transistor TR-C if a current flows in the second current direction I2.

If FIGS. 2 and 3 are compared with each other, the logic transistor TR-L of FIG. 3 may have a greater threshold voltage than the logic transistor TR-L of FIG. 2 because the logic transistor TR-L of FIG. 3 includes the first and second logic hollow regions 236 and 246. In other words, if a special ion-injection process for controlling a threshold voltage is not provided, the threshold voltage of the logic transistor TR-L of FIG. 2 may be the same as or similar to the threshold voltage of the cell transistor TR-C if a current flows in the second current direction I2, but the threshold voltage of the logic transistor TR-L of FIG. 3 may be the same as or similar to the threshold voltage of the cell transistor TR-C if a current flows in the first current direction I1.

A special process for forming the first cell hollow region 216 does not need to be additionally performed because the first cell hollow region 216 and the first and second logic hollow regions 236 and 246 may be formed simultaneously in the semiconductor device 1b of FIG. 3.

Alternatively, the logic transistor TR-L of FIG. 2 and the logic transistor TR-L of FIG. 3 may be formed together in order to form transistors having different threshold voltages in the logic region LR.

Figure 4:
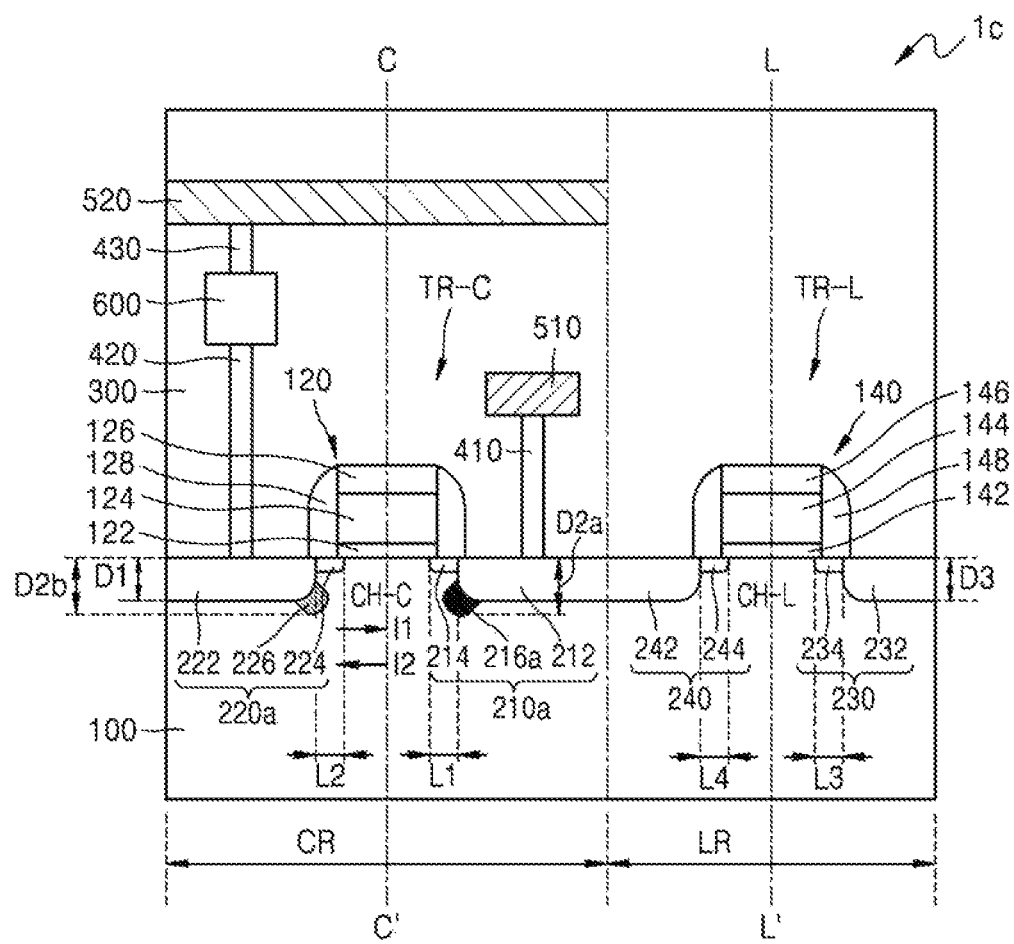
FIG. 4 is a cross-sectional view illustrating relevant portions of a semiconductor device including a magneto-resistive device according to an embodiment disclosed herein.

FIG. 4 is a cross-sectional view illustrating relevant portions of a semiconductor device 1c including the magneto-resistive device 600 according to an embodiment disclosed herein.

Referring to FIG. 4, the semiconductor device 1c comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210a and 230, and second impurity regions 220a and 240.

The first impurity regions 210a and 230 and the second impurity regions 220a and 240 may respectively include first source/drain regions 212 and 232 and second source/drain regions 222 and 242. The first impurity regions 210a and 230 and the second impurity regions 220a and 240 may further respectively include first LDD regions 214 and 234, and second LDD regions 224 and 244.

The first cell impurity region 210a may further include a first cell hollow region 216a. The second cell impurity region 220a may further include a second cell hollow region 226.

The first cell hollow region 216a and the second cell hollow region 226 may be respectively formed in contact with lower portions of the first cell source/drain region 212 and the second cell source/drain region 222.

The first and second cell hollow regions 216a and 226 may be of the first conductivity type. The first and second cell hollow regions 216a and 226 may have greater impurity concentrations than the cell channel region CH-C. The first cell hollow region 216a may have a greater impurity concentration than the second cell hollow region 226. A depth D2a of a lowermost surface of the first cell hollow region 216a from the upper surface of the substrate 100 may be greater than a depth D2b of a lowermost surface of the second cell hollow region 226.

The first cell hollow region 216a and the second cell hollow region 226 may be respectively formed using independent ion-injection processes.

Impurity concentrations of the first cell impurity region 210a and the second cell impurity region 220a may be asymmetrical to each other about the center C-C' of the cell transistor TR-C in the channel direction of the cell channel region CH-C because the first cell hollow region 216a and the second cell hollow region 226 have different impurity concentrations.

The cell transistor TR-C may have different threshold voltages in a first current direction I1 and a second current direction I2 that are opposite directions because the first cell impurity region 210a and the second cell impurity region 220a are formed asymmetrically. For example, the threshold voltage of the cell transistor TR-C if a current flows in the first current direction I1 may be greater than that of the cell transistor TR-C if a current flows in the second current direction I2. The threshold voltages of the cell transistor TR-C in the first and second current directions I1 and I2 may be greater than the threshold voltage of the logic transistor TR-L.

Figure 5:
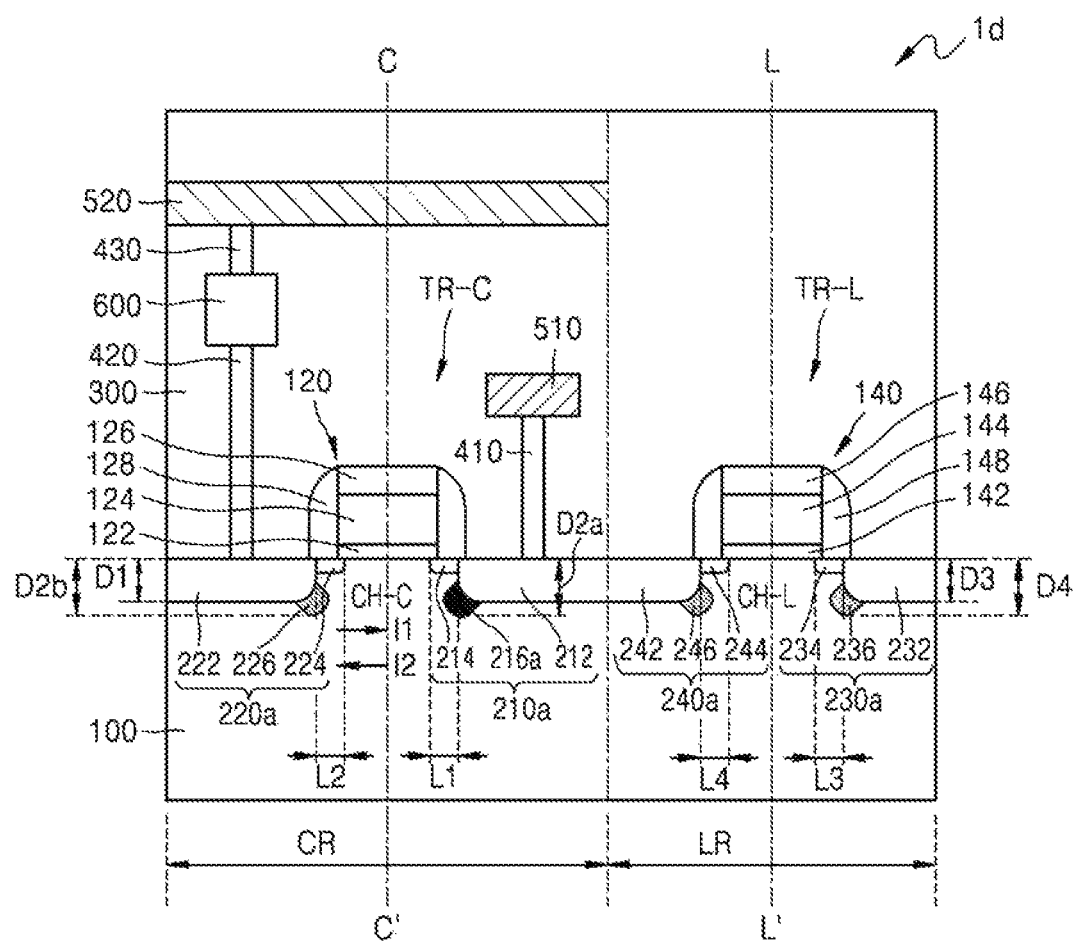
FIG. 5 is a cross-sectional view illustrating relevant portions of a semiconductor device including a magneto-resistive device according to an embodiment disclosed herein.

FIG. 5 is a cross-sectional view illustrating relevant portions of a semiconductor device 1d including the magneto-resistive device 600 according to an embodiment disclosed herein.

Referring to FIG. 5, the semiconductor device 1d comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210a and 230a, and second impurity regions 220a and 240a.

The first impurity regions 210a and 230a and the second impurity regions 220a and 240a may respectively include first source/drain regions 212 and 232 and second source/drain regions 222 and 242. The first impurity regions 210a and 230a and the second impurity regions 220a and 240a may further respectively include first LDD regions 214 and 234 and second LDD regions 224 and 244.

The first cell impurity region 210a may further include a first cell hollow region 216a. The second cell impurity region 220a may further include a second cell hollow region 226. The first cell hollow region 216a and the second cell hollow region 226 may be respectively formed in contact with lower portions of the first cell source/drain region 212 and the second cell source/drain region 222.

The first and second logic impurity regions 230a and 240a may further respectively include first and second logic hollow regions 236 and 246. The first logic hollow region 236 and the second logic hollow region 246 may be respectively formed in contact with lower portions of the first logic source/drain region 232 and the second logic source/drain region 242.

The first and second cell hollow regions 216a and 226 may be of the first conductivity type. The first and second cell hollow regions 216a and 226 may have greater impurity concentrations than the cell channel region CH-C. The first cell hollow region 216a may have a greater impurity concentration than the second cell hollow region 226. A depth D2a of a lowermost surface of the first cell hollow region 216a from the upper surface of the substrate 100 may be greater than a depth D2b of a lowermost surface of the second cell hollow region 226.

The first and second logic hollow regions 236 and 246 may be of the first conductivity type. The first and second logic hollow regions 236 and 246 may have greater impurity concentrations than the logic channel region CH-L. The first logic hollow region 236 and the second logic hollow region 246 may have substantially the same impurity concentrations. A fourth depth D4 of a lowermost surface of each of the first and second logic hollow regions 236 and 246 from the upper surface of the substrate 100 may be greater than a third depth D3 of a lowermost surface of each of the first and second logic source/drain regions 232 and 242.

The first cell hollow region 216a and the second cell hollow region 226 may be respectively formed using independent ion-injection processes.

The second cell hollow region 226 and the first and second logic hollow regions 236 and 246 may be formed simultaneously. The second cell hollow region 226 and the first and second logic hollow regions 236 and 246 may have substantially the same impurity concentrations. Thus, the fourth depth D4 may have substantially the same value as the depth D2b of the second cell hollow region 226.

Impurity concentrations of the first cell impurity region 210a and the second cell impurity region 220a may be asymmetrical to each other about the center C-C' of the cell transistor TR-C in the channel direction of the cell channel region CH-C because the first cell hollow region 216a and the second cell hollow region 226 have different impurity concentrations.

The cell transistor TR-C may have different threshold voltages in a first current direction I1 and a second current direction I2 that are opposite directions because the first cell impurity region 210a and the second cell impurity region 220a are formed asymmetrically. For example, the threshold voltage of the cell transistor TR-C if a current flows in the first current direction I1 may be greater than that of the cell transistor TR-C if a current flows in the second current direction I2.

If FIGS. 4 and 5 are compared with each other, the logic transistor TR-L of FIG. 5 may have a greater threshold voltage than the logic transistor TR-L of FIG. 4 because the logic transistor TR-L of FIG. 5 includes the first and second logic hollow regions 236 and 246. If a special ion-injection process for controlling a threshold voltage is not provided, the threshold voltage of the logic transistor TR-L of FIG. 5 may be the same as or similar to that of the cell transistor TR-C if a current flows in the second current direction I2.

A special process for forming the second cell hollow region 226 does not need to be additionally performed because the second cell hollow region 226 and the first and second logic hollow regions 236 and 246 may be formed simultaneously in the semiconductor device 1d of FIG. 5.

Alternatively, the logic transistor TR-L of FIG. 4 and the logic transistor TR-L of FIG. 5 may be formed together in order to form transistors having different threshold voltages in the logic region LR.

Figure 6:
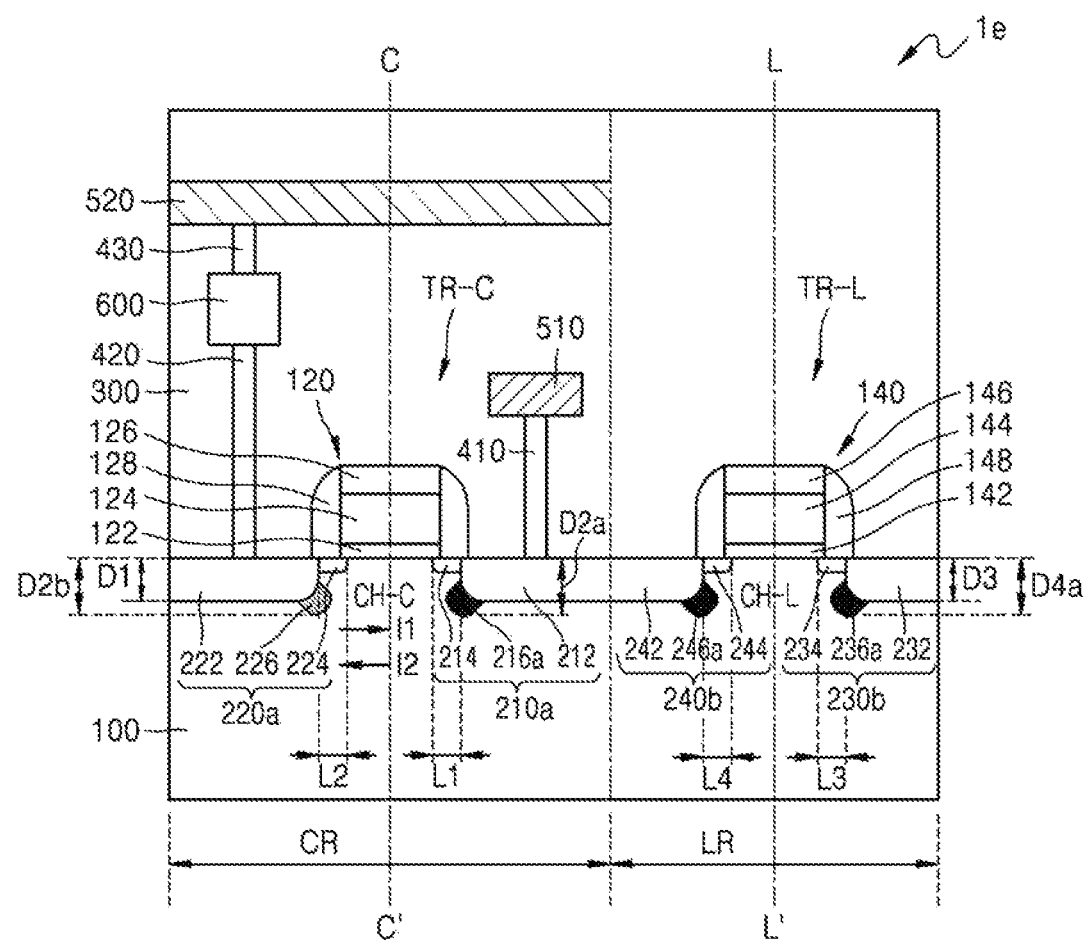
FIG. 6 is a cross-sectional view illustrating relevant portions of a semiconductor device including a magneto-resistive device according to an embodiment disclosed herein.

FIG. 6 is a cross-sectional view illustrating relevant portions of a semiconductor device 1e including the magneto-resistive device 600 according to an embodiment disclosed herein.

Referring to FIG. 6, the semiconductor device 1e comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210a and 230b, and second impurity regions 220a and 240b.

The first impurity regions 210a and 230b and the second impurity regions 220a and 240b may respectively include first source/drain regions 212 and 232 and second source/drain regions 222 and 242. The first impurity regions 210a and 230b and the second impurity regions 220a and 240b may further respectively include first LDD regions 214 and 234 and second LDD regions 224 and 244.

The first cell impurity region 210a may further include a first cell hollow region 216a. The second cell impurity region 220a may further include a second cell hollow region 226.

The first and second logic impurity regions 230b and 240b may further respectively include first and second logic hollow regions 236a and 246a. The first logic hollow region 236a and the second logic hollow region 246a may be respectively formed in contact with lower portions of the first logic source/drain region 232 and the second logic source/drain region 242.

The first and second logic hollow regions 236a and 246a may be of the first conductivity type. The first and second logic hollow regions 236a and 246a may have greater impurity concentrations than the logic channel region CH-L. The first logic hollow region 236a and the second logic hollow region 246a may have substantially the same impurity concentrations. A fourth depth D4a of a lowermost surface of each of the first and second logic hollow regions 236a and 246a from the upper surface of the substrate 100 may be greater than a third depth D3 of a lowermost surface of each of the first and second logic source/drain regions 232 and 242.

The first cell hollow region 216a and the second cell hollow region 226 may be respectively formed using independent ion-injection processes.

The first cell hollow region 216a and the first and second logic hollow regions 236a and 246a may be formed simultaneously. Thus, the fourth depth D4a may have substantially the same value as a depth D2a.

If FIGS. 5 and 6 are compared with each other, the first and second logic hollow regions 236a and 246a of FIG. 6 may have greater impurity concentrations than the first and second logic hollow regions 236 and 246 of FIG. 5. Accordingly, the logic transistor TR-L of FIG. 6 may have a greater threshold voltage than the logic transistor TR-L of FIG. 5. If a special ion-injection process for controlling a threshold voltage is not provided, the threshold voltage of the logic transistor TR-L of FIG. 6 may be the same as or similar to that of the cell transistor TR-C if a current flows in the first current direction I1

A special process for forming the first cell hollow region 216a does not need to be additionally performed because the first cell hollow region 216a and the first and second logic hollow regions 236a and 246a may be formed simultaneously in the semiconductor device 1e of FIG. 6.

Alternatively, the logic transistor TR-L of FIG. 4 and/or the logic transistor TR-L of FIG. 5 may be formed together with the logic transistor TR-L of FIG. 6 in order to form transistors having different threshold voltages in the logic region LR.

Figure 7:
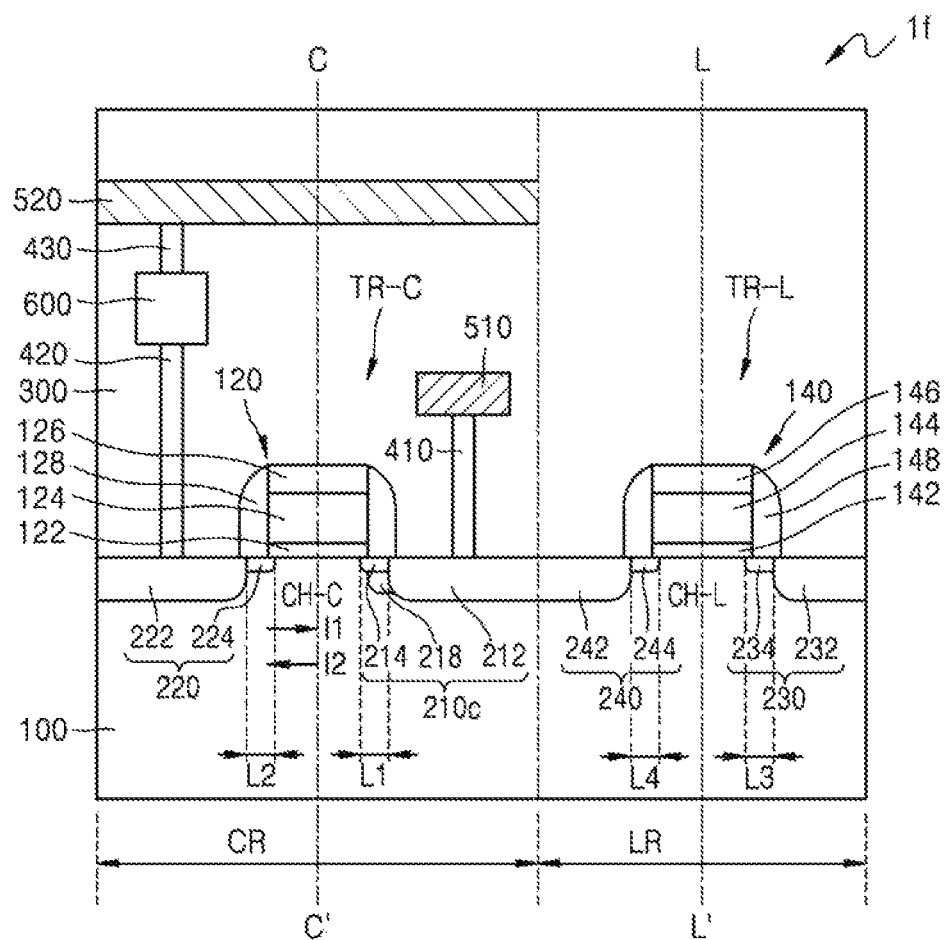
FIG. 7 is a cross-sectional view illustrating relevant portions of a semiconductor device including a magneto-resistive device according to an embodiment disclosed herein.

FIG. 7 is a cross-sectional view illustrating relevant portions of a semiconductor device 1f including the magneto-resistive device 600 according to an embodiment disclosed herein.

Referring to FIG. 7, the semiconductor device 1f comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210c and 230a, and second impurity regions 220 and 240a.

The first impurity regions 210c and 230 and the second impurity regions 220 and 240 may respectively include first source/drain regions 212 and 232 and second source/drain regions 222 and 242. The first impurity regions 210c and 230 and the second impurity regions 220 and 240 may further respectively include first LDD regions 214 and 234 and second LDD regions 224 and 244.

The first cell impurity region 210c may further include a first cell hollow region 218. The first cell hollow region 218 may be formed in contact with a lateral surface of the first cell source/drain region 212 and a lower surface of the first cell LDD region 214. The first cell hollow region 218 may be of the first conductivity type. The first cell hollow region 218 may have a greater impurity concentration than the cell channel region CH-C.

The first cell impurity region 210 and the second cell impurity region 220 may be asymmetrical to each other about the center C-C' of the cell transistor TR-C in the channel direction of the cell channel region CH-C because the first cell impurity region 210c includes the first hollow region 218. The first logic impurity region 230 and the second logic impurity region 240 may be symmetrical or substantially symmetrical to each other about the center L-L' of the logic transistor TR-L in the channel direction of the logic channel region CH-L.

The cell transistor TR-C may have different threshold voltages in a first current direction I1 and a second current direction I2 that are opposite directions because the first cell impurity region 210c and the second cell impurity region 220 are formed asymmetrically. For example, the threshold voltage of the cell transistor TR-C if a current flows in the first current direction I1 may be greater than that of the cell transistor TR-C if a current flows in the second current direction I2.

Figure 8:
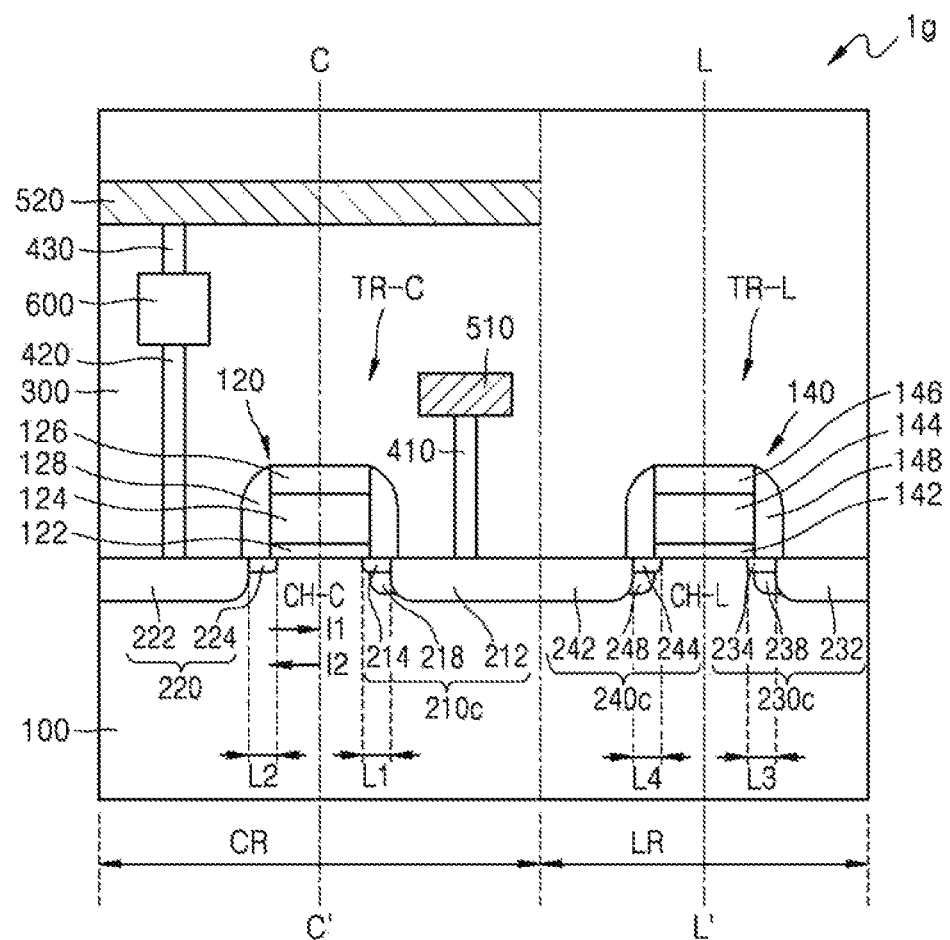
FIG. 8 is a cross-sectional view illustrating relevant portions of a semiconductor device including a magneto-resistive device according to an embodiment disclosed herein.

FIG. 8 is a cross-sectional view illustrating relevant portions of a semiconductor device 1g including the magneto-resistive device 600 according to an embodiment disclosed herein.

Referring to FIG. 8, the semiconductor device 1g comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210c and 230c, and second impurity regions 220 and 240c.

The first impurity regions 210c and 230c and the second impurity regions 220 and 240c may respectively include first source/drain regions 212 and 232 and second source/drain regions 222 and 242. The first impurity regions 210c and 230c and the second impurity regions 220 and 240c may further respectively include first LDD regions 214 and 234 and second LDD regions 224 and 244.

The first cell impurity region 210c may further include a first cell hollow region 218. The first and second logic impurity regions 230c and 240c may further respectively include first and second logic hollow regions 238 and 248. The first and second logic hollow regions 238 and 248 may be respectively formed in contact with lateral surfaces of the first and second logic source/drain regions 232 and 242 and lower surfaces of the first and second logic LDD regions 234 and 244.

The first and second logic hollow regions 238 and 248 may be of the first conductivity type. The first and second logic hollow regions 238 and 248 may have greater impurity concentrations than the logic channel region CH-L.

The first cell hollow region 218 and the first and second logic hollow regions 238 and 248 may be formed simultaneously.

The first cell impurity region 210c and the second cell impurity region 220 may be asymmetrical to each other about the center C-C' of the cell transistor TR-C in the channel direction of the cell channel region CH-C because the first cell impurity region 210c includes the first hollow region 218. The first logic impurity region 230c and the second logic impurity region 240c may be symmetrical or substantially symmetrical to each other about the center L-L' of the logic transistor TR-L in the channel direction of the logic channel region CH-L because the first logic impurity region 230c and the second logic impurity region 240c respectively include the first and second logic hollow regions 238 and 248.

The cell transistor TR-C may have different threshold voltages in a first current direction I1 and a second current direction I2 that are opposite directions because the first cell impurity region 210c and the second cell impurity region 220 are formed asymmetrically. For example, the threshold voltage of the cell transistor TR-C if a current flows in the first current direction I1 may be greater than that of the cell transistor TR-C if a current flows in the second current direction I2.

If FIGS. 7 and 8 are compared with each other, the logic transistor TR-L of FIG. 8 may have a greater threshold voltage than the logic transistor TR-L of FIG. 7 because the logic transistor TR-L of FIG. 8 includes the first and second logic hollow regions 238 and 248. In other words, if a special ion-injection process for controlling a threshold voltage is not provided, the threshold voltage of the logic transistor TR-L of FIG. 7 may be the same as or similar to the threshold voltage of the cell transistor TR-C if a current flows in the second current direction I2, but the threshold voltage of the logic transistor TR-L of FIG. 8 may be the same as or similar to the threshold voltage of the cell transistor TR-C if a current flows in the first current direction I1.

A special process for forming the first cell hollow region 218 does not need to be additionally performed because the first cell hollow region 218 and the first and second logic hollow regions 238 and 248 may be formed simultaneously in the semiconductor device 1g of FIG. 8.

Alternatively, the logic transistor TR-L of FIG. 7 and the logic transistor TR-L of FIG. 8 may be formed together in order to form transistors having different threshold voltages in the logic region LR.

Figure 9:
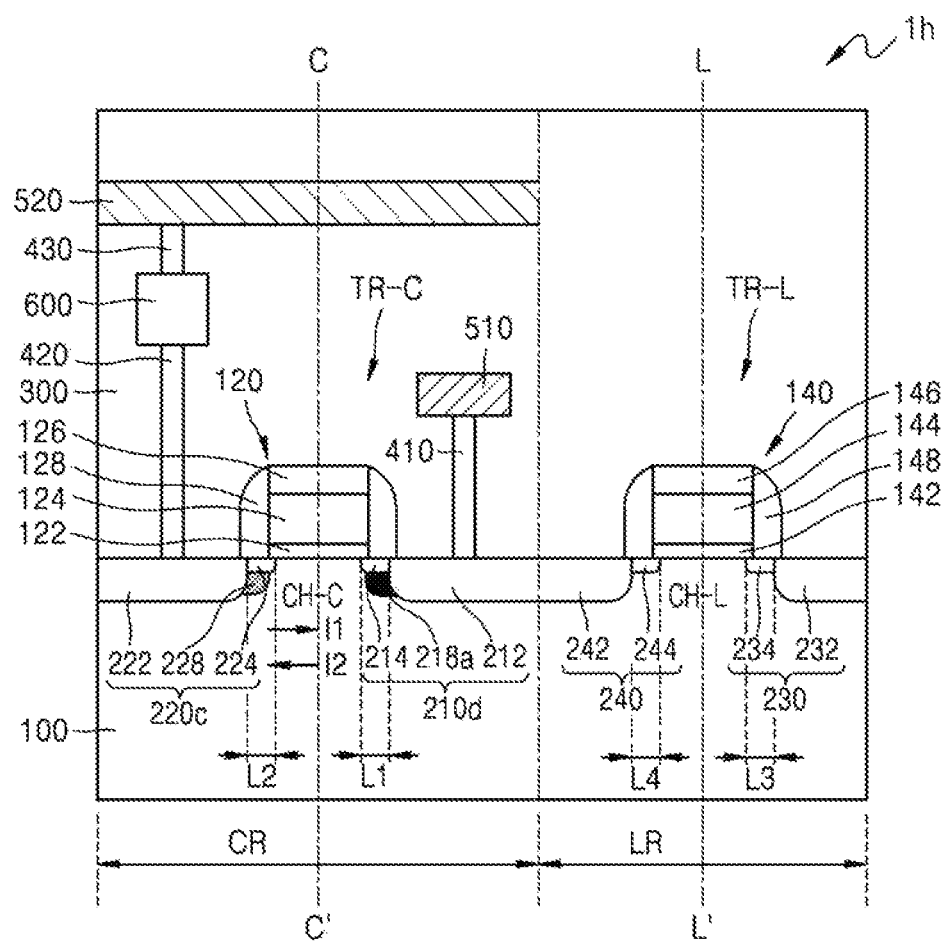
FIG. 9 is a cross-sectional view illustrating relevant portions of a semiconductor device including a magneto-resistive device according to an embodiment disclosed herein.

FIG. 9 is a cross-sectional view illustrating relevant portions of a semiconductor device 1h including the magneto-resistive device 600 according to an embodiment disclosed herein.

Referring to FIG. 9, the semiconductor device 1h comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210d and 230, and second impurity regions 220c and 240.

The first impurity regions 210d and 230 and the second impurity regions 220c and 240 may respectively include first source/drain regions 212 and 232 and second source/drain regions 222 and 242. The first impurity regions 210d and 230 and the second impurity regions 220c and 240 may further respectively include first LDD regions 214 and 234 and second LDD regions 224 and 244.

The first cell impurity region 210d may further include a first cell hollow region 218a. The second cell impurity region 220c may further include a second cell hollow region 228.

The first and second cell hollow regions 218a and 228 may be respectively formed in contact with lateral surfaces of the first and second cell source/drain regions 212 and 222 and lower surfaces of the first and second cell LDD regions 212 and 214.

The first and second cell hollow regions 218a and 228 may be of the first conductivity type. The first and second cell hollow regions 218a and 228 may have greater impurity concentrations than the cell channel region CH-C. The first cell hollow region 218a may have a greater impurity concentration than the second cell hollow region 228. A depth of a lowermost surface of the first cell hollow region 218a from the upper surface of the substrate 100 may be greater than a depth of a lowermost surface of the second cell hollow region 228.

The first cell hollow region 218a and the second cell hollow region 228 may be formed using independent ion-injection processes, respectively.

Impurity concentrations of the first cell impurity region 210d and the second cell impurity region 220c may be asymmetrical to each other about the center C-C' of the cell transistor TR-C in the channel direction of the cell channel region CH-C because the first cell hollow region 218a and the second cell hollow region 228 have different impurity concentrations.

The cell transistor TR-C may have different threshold voltages in a first current direction I1 and a second current direction I2 that are opposite directions because the first cell impurity region 210d and the second cell impurity region 220c are formed asymmetrically. For example, the threshold voltage of the cell transistor TR-C if a current flows in the first current direction I1 may be greater than that of the cell transistor TR-C if a current flows in the second current direction I2. The threshold voltages of the cell transistor TR-C in the first and second current directions I1 and I2 may be greater than the threshold voltage of the logic transistor TR-L.

Figure 10:
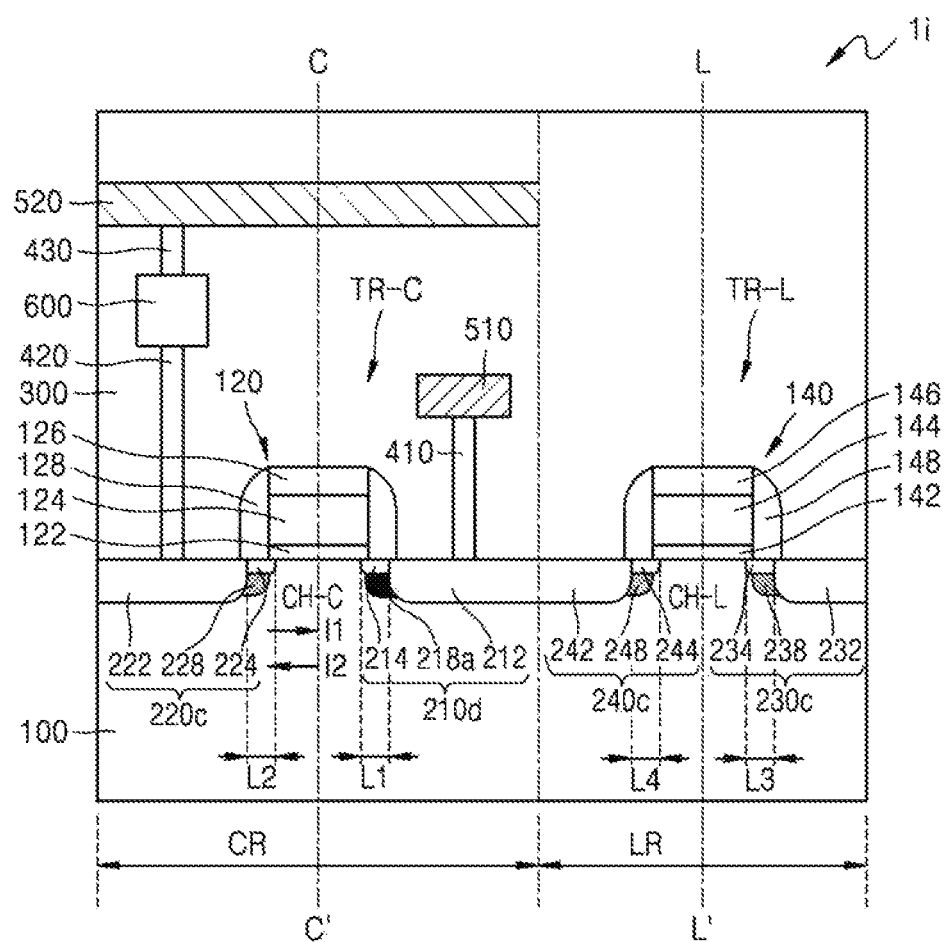
FIG. 10 is a cross-sectional view illustrating relevant portions of a semiconductor device including a magneto-resistive device according to an embodiment disclosed herein.

FIG. 10 is a cross-sectional view illustrating relevant portions of a semiconductor device 1i including the magneto-resistive device 600 according to an embodiment disclosed herein.

Referring to FIG. 10, the semiconductor device 1i comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively a cell gate dielectric layer 122 and a logic gate dielectric layer 142, a cell gate electrode 124 and a logic gate electrode 144, first impurity regions 210d and 230c, and second impurity regions 220c and 240c.

The first impurity regions 210d and 230c and the second impurity regions 220c and 240c may respectively include first source/drain regions 212 and 232 and second source/drain regions 222 and 242. The first impurity regions 210d and 230c and the second impurity regions 220c and 240c may further respectively include first LDD regions 214 and 234 and second LDD regions 224 and 244.

The first cell impurity region 210d may further include a first cell hollow region 218a. The second cell impurity region 220c may further include a second cell hollow region 228.

The first and second logic impurity regions 230c and 240c may further respectively include first and second logic hollow regions 238 and 248. The first and second logic hollow regions 238 and 248 may be respectively formed in contact with lateral surfaces of the first and second logic source/drain regions 232 and 242 and lower surfaces of the first and second logic LDD regions 234 and 244. The second cell hollow region 228 and the first and second logic hollow regions 238 and 248 may have substantially the same impurity concentrations.

The first and second cell hollow regions 218a and 228 may be of the first conductivity type. The first and second cell hollow regions 218a and 228 may have greater impurity concentrations than the cell channel region CH-C. The first cell hollow region 218a may have a greater impurity concentration than the second cell hollow region 228. A lowermost surface of the first cell hollow region 218a from the upper surface of the substrate 100 may be at a lower level than a lowermost surface of the second cell hollow region 228.

The first cell hollow region 218a and the second cell hollow region 228 may be respectively formed using independent ion-injection processes. The second cell hollow region 228 and the first and second logic hollow regions 238 and 248 may be formed simultaneously. The second cell hollow region 228 and the first and second logic hollow regions 238 and 248 may have substantially the same impurity concentrations.

Impurity concentrations of the first cell impurity region 210d and the second cell impurity region 220c may be asymmetrical to each other about the center C-C' of the cell transistor TR-C in the channel direction of the cell channel region CH-C because the first cell hollow region 218a and the second cell hollow region 228 have different impurity concentrations.

The cell transistor TR-C may have different threshold voltages in a first current direction I1 and a second current direction I2 that are opposite directions because the first cell impurity region 210d and the second cell impurity region 220c are formed asymmetrically. For example, the threshold voltage of the cell transistor TR-C if a current flows in the first current direction I1 may be greater than that of the cell transistor TR-C if a current flows in the second current direction I2.

If FIGS. 9 and 10 are compared with each other, the logic transistor TR-L of FIG. 10 may have a greater threshold voltage than the logic transistor TR-L of FIG. 9 because the logic transistor TR-L of FIG. 10 includes the first and second logic hollow regions 238 and 248. If a special ion-injection process for controlling a threshold voltage is not provided, the threshold voltage of the logic transistor TR-L of FIG. 10 may be the same as or similar to that of the cell transistor TR-C if a current flows in the second current direction I2.

A special process for forming the second cell hollow region 228 does not need to be additionally performed because the second cell hollow region 228 and the first and second logic hollow regions 238 and 248 may be formed simultaneously in the semiconductor device 1i of FIG. 10.

Alternatively, the logic transistor TR-L of FIG. 9 and the logic transistor TR-L of FIG. 10 may be formed together in order to form transistors having different threshold voltages in the logic region LR.

Figure 11:
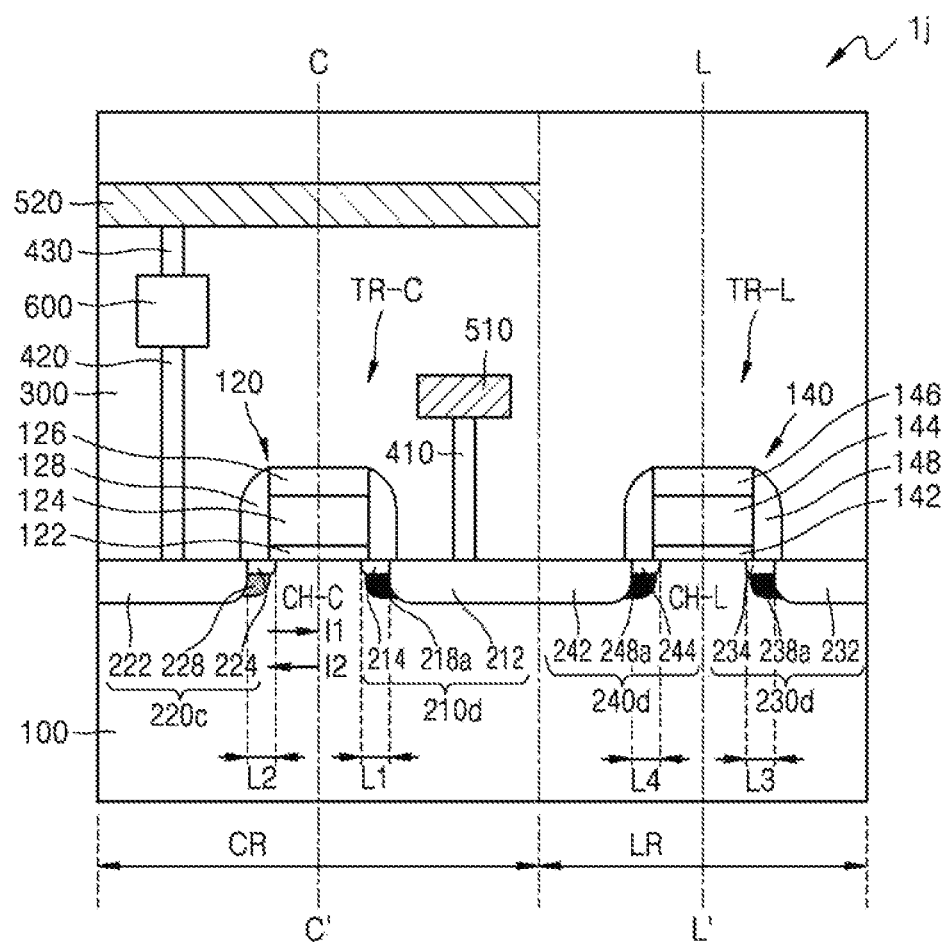
FIG. 11 is a cross-sectional view illustrating relevant portions of a semiconductor device including a magneto-resistive device according to an embodiment disclosed herein.

FIG. 11 is a cross-sectional view illustrating relevant portions of a semiconductor device 1j including the magneto-resistive device 600 according to an embodiment disclosed herein.

Referring to FIG. 11, the semiconductor device 1j comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210d and 230d, and second impurity regions 220c and 240d.

The first impurity regions 210d and 230d and the second impurity regions 220c and 240d may respectively include first source/drain regions 212 and 232 and second source/drain regions 222 and 242. The first impurity regions 210d and 230d and the second impurity regions 220c and 240d may further respectively include first LDD regions 214 and 234 and second LDD regions 224 and 244.

The first cell impurity region 210d may further include a first cell hollow region 218a. The second cell impurity region 220c may further include a second cell hollow region 228.

The first and second logic impurity regions 230d and 240d may further respectively include first and second logic hollow regions 238a and 248a. The first and second logic hollow regions 238a and 248a may be respectively formed in contact with lateral surfaces of the first and second logic source/drain regions 232 and 242 and lower surfaces of the first and second logic LDD regions 234 and 244.

The first and second logic hollow regions 238a and 248a may be of the first conductivity type. The first and second logic hollow regions 238a and 248a may have greater impurity concentrations than the logic channel region CH-L. The first logic hollow region 238a and the second logic hollow region 248a may have substantially the same impurity concentrations.

The first cell hollow region 218a and the second cell hollow region 228 may be formed using independent ion-injection processes, respectively. The first cell hollow region 218a and the first and second logic hollow regions 238a and 248a may be formed simultaneously.

If FIGS. 10 and 11 are compared with each other, the first and second logic hollow regions 238a and 248a of FIG. 11 may have greater impurity concentrations than the first and second logic hollow regions 238 and 248 of FIG. 10. Accordingly, the logic transistor TR-L of FIG. 11 may have a greater threshold voltage than the logic transistor TR-L of FIG. 10. If a special ion-injection process for controlling a threshold voltage is not provided, the threshold voltage of the logic transistor TR-L of FIG. 11 may be the same as or similar to that of the cell transistor TR-C if a current flows in the first current direction I1.

A special process for forming the first cell hollow region 218a does not need to be additionally performed because the first cell hollow region 218a and the first and second logic hollow regions 238a and 248a may be formed simultaneously in the semiconductor device 1j of FIG. 11.

Alternatively, the logic transistor TR-L of FIG. 9 and/or the logic transistor TR-L of FIG. 10 may be formed together with the logic transistor TR-L of FIG. 11 in order to form transistors having different threshold voltages in the logic region LR.

Figure 12:
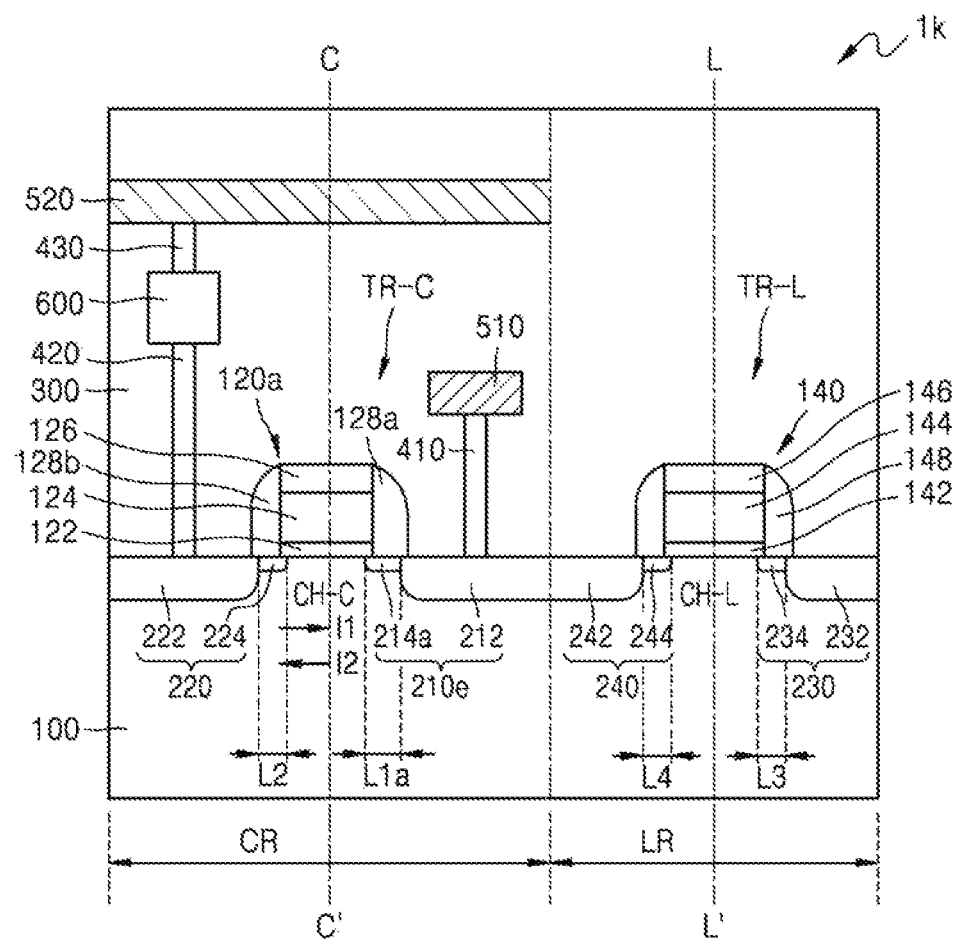
FIG. 12 is a cross-sectional view illustrating relevant portions of a semiconductor device including a magneto-resistive device according to an embodiment disclosed herein.

FIG. 12 is a cross-sectional view illustrating relevant portions of a semiconductor device 1k including the magneto-resistive device 600 according to an embodiment disclosed herein.

Referring to FIG. 12, the semiconductor device 1k comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210e and 230, and second impurity regions 220 and 240. An upper surface and both lateral surfaces of the cell gate electrode 124 may be respectively insulated by a cell capping pattern 126 and first and second cell insulation spacers 128a and 128b. The first and second cell insulation spacers 128a and 128b respectively formed on both lateral surfaces of the cell gate electrode 124 may have different widths. For example, the first cell insulation spacer 128a on the side of the first impurity region 210e may have a greater width than the second cell insulation spacer 128b on the side of the second impurity region 220. An upper surface and both lateral surfaces of the logic gate electrode 144 may be respectively insulated by a logic capping pattern 146 and a logic insulation spacer 148. The cell gate dielectric layer 122, the cell gate electrode 124, the cell capping pattern 126, and the first and second cell insulation spacers 128a and 128b may be collectively referred to as a gate structure 120, and the logic gate dielectric layer 142, the logic gate electrode 144, the logic capping pattern 146, and the logic insulation spacer 148 may be collectively referred to as a gate structure 140.

The first cell insulation spacer 128a may be formed independently from the second cell insulation spacer 128b. Alternatively, one portion of the first cell insulation spacer 128a may be formed together with the second cell insulation spacer 128b, and a remaining portion of the first cell insulation spacer 128a may be formed independently.

The first impurity regions 210e and 230 and the second impurity regions 220 and 240 may respectively include first source/drain regions 212 and 232 and second source/drain regions 222 and 242. The first impurity regions 210e and 230 and the second impurity regions 220 and 240 may further respectively include first LDD regions 214a and 234 and second LDD regions 224 and 244.

Before the first and second cell insulation spacers 128a and 128b and the logic insulation spacer 148 are formed, the first LDD regions 214a and 234 and the second LDD regions 224 and 244 are first formed. After the first and second cell insulation spacers 128a and 128b and the logic insulation spacer 148 are formed, the first source/drain regions 212 and 232 and the second source/drain regions 222 and 242 are formed. Thus, widths of the first LDD regions 214a and 234 and widths of the second LDD regions 224 and 244 may depend on widths of the first and second cell insulation spacers 128a and 128b and the logic insulation spacer 148 formed on the first LDD regions 214a and 234 and widths of the second LDD regions 224 and 244. Accordingly, if the width of the first cell insulation spacer 128a is greater than that of the second cell insulation spacer 128b, a first width L1a of the first cell LDD region 214a may be greater than a second width L2 of the second cell LDD region 224. If the width of the second cell insulation spacer 128b is substantially the same as that of the logic insulation spacer 148, the second width L2 of the second cell LDD region 224, a third width L3 of the first logic LDD region 234, and a fourth width L4 of the second logic LDD region 244 may be substantially the same as one another.

The first cell impurity region 210e and the second cell impurity region 220 may be asymmetrical to each other about the center C-C' of the cell transistor TR-C in the channel direction of the cell channel region CH-C because the first cell impurity region 210e includes the first cell LDD region 214a having a relatively large width. The first logic impurity region 230 and the second logic impurity region 240 may be symmetrical or substantially symmetrical to each other about the center L-L' of the logic transistor TR-L in the channel direction of the logic channel region CH-L.

The cell transistor TR-C may have different threshold voltages in a first current direction I1 and a second current direction I2 that are opposite directions because the first cell impurity region 210e and the second cell impurity region 220 are formed asymmetrically. For example, the threshold voltage of the cell transistor TR-C if a current flows in the first current direction I1 may be greater than that of the cell transistor TR-C if a current flows in the second current direction I2.

Figure 13:
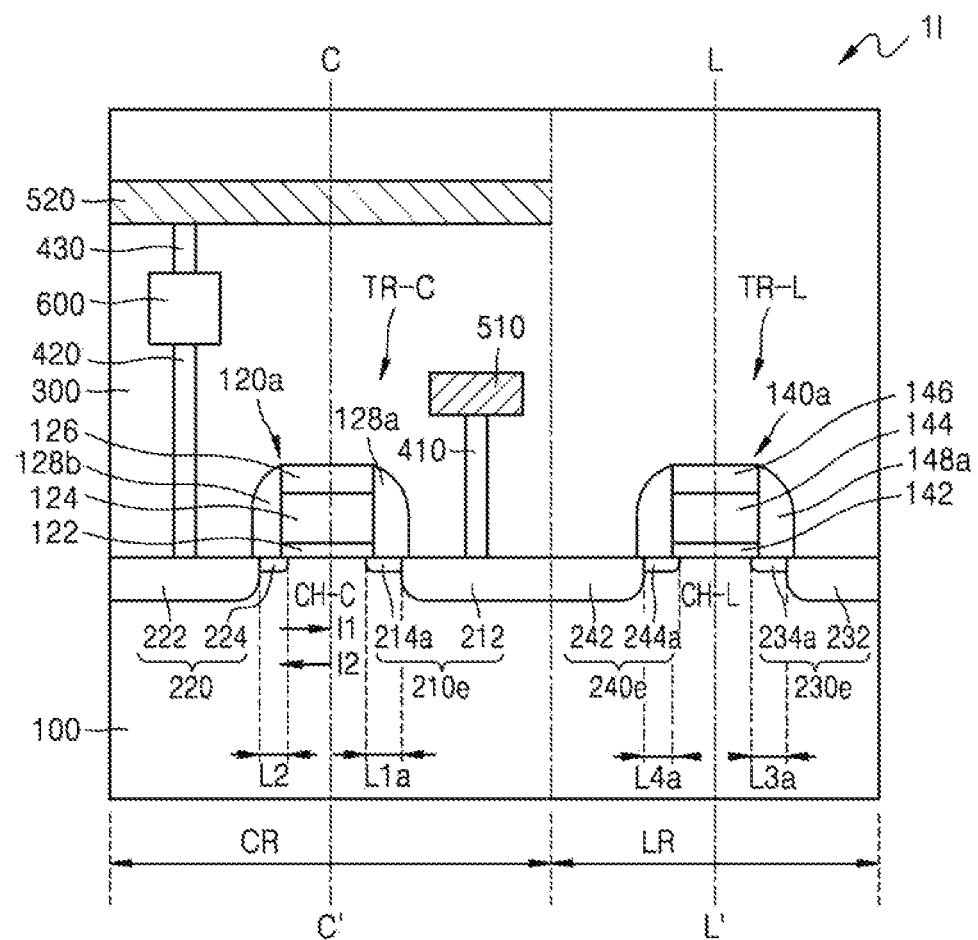
FIG. 13 is a cross-sectional view illustrating relevant portions of a semiconductor device including a magneto-resistive device according to an embodiment disclosed herein.

FIG. 13 is a cross-sectional view illustrating relevant portions of a semiconductor device 1l including the magneto-resistive device 600 according to an embodiment disclosed herein.

Referring to FIG. 13, the semiconductor device 1l comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210e and 230e, and second impurity regions 220 and 240e. An upper surface and both lateral surfaces of the cell gate electrode 124 may be respectively insulated by a cell capping pattern 126 and first and second cell insulation spacers 128a and 128b. The first and second cell insulation spacers 128a and 128b respectively formed on the both lateral surfaces of the cell gate electrode 124 may have different widths. For example, the first cell insulation spacer 128a at the side of the first impurity region 210e may have a greater width than the second cell insulation spacer 128b at the side of the second impurity region 220. An upper surface and both lateral surfaces of the logic gate electrode 144 may be respectively insulated by a logic capping pattern 146 and a logic insulation spacer 148a.

The first impurity regions 210e and 230 and the second impurity regions 220e and 240e may respectively include first source/drain regions 212 and 232 and second source/drain regions 222 and 242. The first impurity regions 210e and 230 and the second impurity regions 220e and 240e may further respectively include first LDD regions 214a and 234a and second LDD regions 224 and 244a.

A first width L1a of the first cell LDD region 214a may be greater than a second width L2 of the second cell LDD region 224. If the width of the first cell insulation spacer 128a is substantially the same as that of the logic insulation spacer 148a, the second width L1a of the second cell LDD region 214a, a third width L3a of the first logic LDD region 234a, and a fourth width L4a of the second logic LDD region 244a may be substantially the same as one another.

The first cell impurity region 210e and the second cell impurity region 220 may be asymmetrical to each other about the center C-C' of the cell transistor TR-C in the channel direction of the cell channel region CH-C because the first cell impurity region 210e includes the first cell LDD region 214a having a relatively large width. The first logic impurity region 230e and the second logic impurity region 240e may be symmetrical or substantially symmetrical to each other about the center L-L' of the logic transistor TR-L in the channel direction of the logic channel region CH-L.

The cell transistor TR-C may have different threshold voltages in a first current direction I1 and a second current direction I2 that are opposite directions because the first cell impurity region 210e and the second cell impurity region 220 are formed asymmetrically. For example, the threshold voltage of the cell transistor TR-C if a current flows in the first current direction I1 may be greater than that of the cell transistor TR-C if a current flows in the second current direction I2.

If FIGS. 12 and 13 are compared with each other, the logic transistor TR-L of FIG. 13 may have a greater threshold voltage than the logic transistor TR-L of FIG. 12 because the logic transistor TR-L of FIG. 13 includes the first and second logic LDD regions 234a and 244a having relatively large widths. In other words, if a special ion-injection process for controlling a threshold voltage is not provided, the threshold voltage of the logic transistor TR-L of FIG. 12 may be the same as or similar to the threshold voltage of the cell transistor TR-C if a current flows in the second current direction I2, but the threshold voltage of the logic transistor TR-L of FIG. 13 may be the same as or similar to the threshold voltage of the cell transistor TR-C if a current flows in the first current direction I1.

A special process for forming the first cell LDD region 214a does not need to be additionally performed because the first cell LDD region 214a and the first and second logic LDD regions 234a and 244a may be formed using an identical process in the semiconductor device 1l of FIG. 13.

Alternatively, the logic transistor TR-L of FIG. 12 and the logic transistor TR-L of FIG. 13 may be formed together in order to form transistors having different threshold voltages in the logic region LR.

Figure 14:
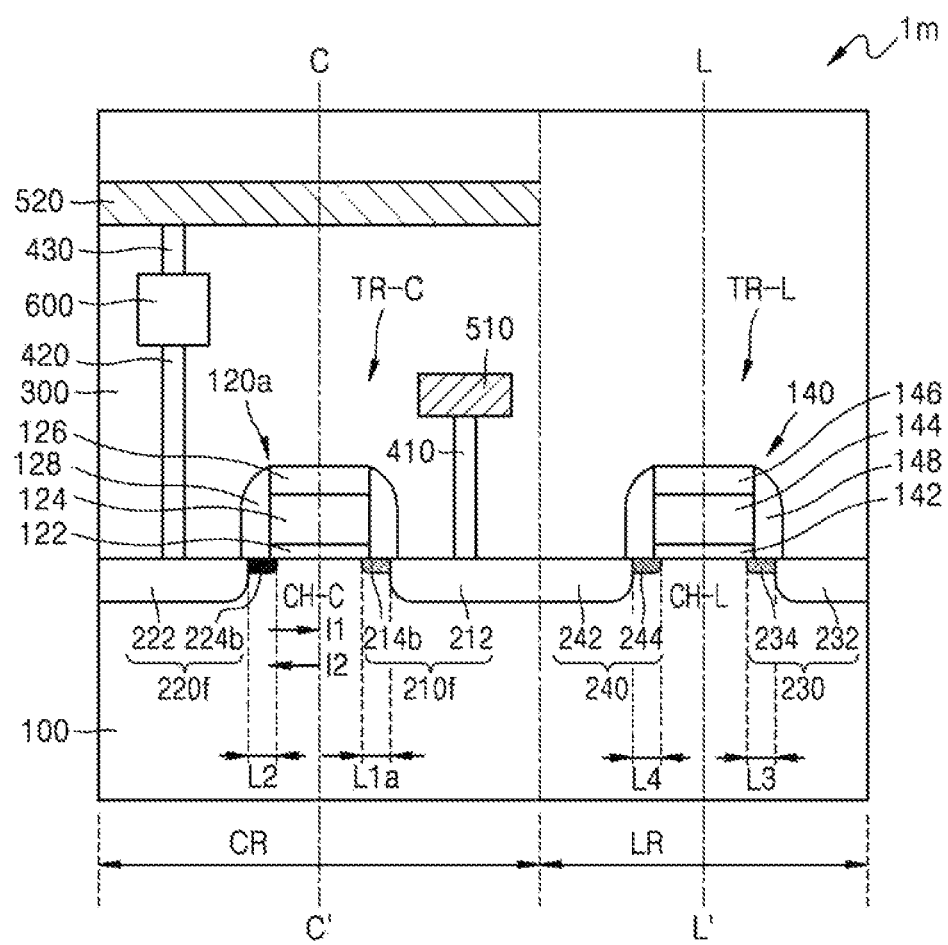
FIG. 14 is a cross-sectional view illustrating relevant portions of a semiconductor device including a magneto-resistive device according to an embodiment disclosed herein.

FIG. 14 is a cross-sectional view illustrating relevant portions of a semiconductor device 1m including the magneto-resistive device 600 according to an embodiment disclosed herein.

Referring to FIG. 14, the semiconductor device 1m comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively include a cell gate dielectric layer 122 and a logic gate dielectric layer 142, a cell gate electrode 124 and a logic gate electrode 144, first impurity regions 210f and 230, and second impurity regions 220f and 240.

The first impurity regions 210f and 230 and the second impurity regions 220f and 240 may respectively include first source/drain regions 212 and 232 and second source/drain regions 222 and 242. The first impurity regions 210f and 230 and the second impurity regions 220f and 240 may further respectively include first LDD regions 214b and 234 and second LDD regions 224b and 244.

The second cell LDD region 224b may have a greater impurity concentration than the first cell LDD region 214b. For example, to form the second cell LDD region 224b such that its impurity concentration is greater than that of the first cell LDD region 214b, primary ion injection may be performed on the first and second cell LDD regions 214b and 224b, a mask pattern that covers the first cell LDD region 214b may be formed, and then secondary ion injection may be performed.

The first and second logic LDD regions 234 and 244 may have substantially the same impurity concentrations as that of the first cell LDD region 214b.

Impurity concentrations of the first cell impurity region 210f and the second cell impurity region 220f may be asymmetrical to each other about the center C-C' of the cell transistor TR-C in the channel direction of the cell channel region CH-C because the first cell LDD region 214b and the second cell LDD region 224b have different impurity concentrations. The first logic impurity region 230 and the second logic impurity region 240 may be symmetrical or substantially symmetrical to each other about the center L-L' of the logic transistor TR-L in the channel direction of the logic channel region CH-L.

The cell transistor TR-C may have different threshold voltages in a first current direction I1 and a second current direction I2 that are opposite directions because the first cell impurity region 210f and the second cell impurity region 220f are formed asymmetrically. For example, the threshold voltage of the cell transistor TR-C if a current flows in the second current direction I2 may be greater than that of the cell transistor TR-C if a current flows in the first current direction I1.

If a special ion-injection process for controlling a threshold voltage is not provided, the threshold voltage of the logic transistor TR-L may be the same as or similar to that of the cell transistor TR-C if a current flows in the first current direction I1.

Figure 15:
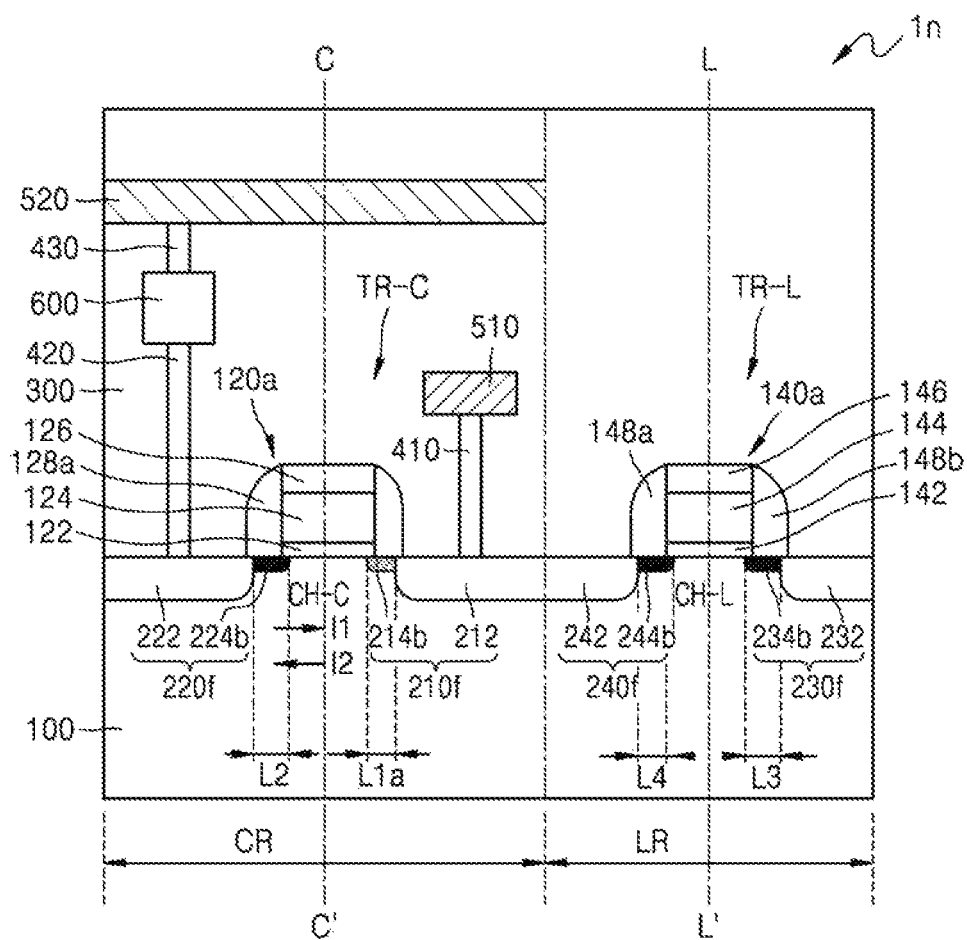
FIG. 15 is a cross-sectional view illustrating relevant portions of a semiconductor device including a magneto-resistive device according to an embodiment disclosed herein.

FIG. 15 is a cross-sectional view illustrating relevant portions of a semiconductor device 1*n* including the magneto-resistive device 600 according to an embodiment disclosed herein.

Referring to FIG. 15, the semiconductor device 1*n* comprises a substrate 100 having a cell region CR and a logic region LR. In the cell region CR, a cell transistor TR-C and the magneto-resistive device 600 are formed. In the logic region LR, a logic transistor TR-L is formed.

The cell transistor TR-C and the logic transistor TR-L respectively a cell gate dielectric layer 122 and a logic gate dielectric layer 142, a cell gate electrode 124 and a logic gate electrode 144, first impurity regions 210*f* and 230*f*, and second impurity regions 220*f* and 240*f*.

The first impurity regions 210*f* and 230*f* and the second impurity regions 220*f* and 240*f* may respectively include first source/drain regions 212 and 232 and second source/drain regions 222 and 242. The first impurity regions 210*f* and 230*f* and the second impurity regions 220*f* and 240*f* may further respectively include first LDD regions 214*b* and 234*b* and second LDD regions 224*b* and 244*b*.

The second cell LDD region 224*b* may have a greater impurity concentration than the first cell LDD region 214*b*. The first and second logic LDD regions 234*b* and 244*b* may have substantially the same impurity concentrations as that of the second cell LDD region 224*b*.

Impurity concentrations of the first cell impurity region 210*f* and the second cell impurity region 220*f* may be asymmetrical to each other about the center C-C' of the cell transistor TR-C in the channel direction of the cell channel region CH-C because the first cell LDD region 214*b* and the second cell LDD region 224*b* have different impurity concentrations. The first logic impurity region 230 and the second logic impurity region 240 may be symmetrical or substantially symmetrical to each other about the center L-L' of the logic transistor TR-L in the channel direction of the logic channel region CH-L.

The cell transistor TR-C may have different threshold voltages in a first current direction I1 and a second current direction I2 that are opposite directions because the first cell impurity region 210*f* and the second cell impurity region 220*f* are formed asymmetrically. For example, the threshold voltage of the cell transistor TR-C if a current flows in the second current direction I2 may be greater than that of the cell transistor TR-C if a current flows in the first current direction I1.

If FIGS. 14 and 15 are compared with each other, the logic transistor TR-L of FIG. 15 may have lower threshold voltages than the logic transistor TR-L of FIG. 14 because the logic transistor TR-L of FIG. 15 includes the first and second logic LDD regions 234*b* and 244*b* having relatively greater impurity concentrations. If a special ion-injection process for controlling a threshold voltage is not provided, the threshold voltage of the logic transistor TR-L of FIG. 15 may be the same as or similar to that of the cell transistor TR-C if a current flows in the second current direction I2.

Alternatively, the logic transistor TR-L of FIG. 14 and the logic transistor TR-L of FIG. 15 may be formed together in order to form transistors having different threshold voltages in the logic region LR.

Figure 16:
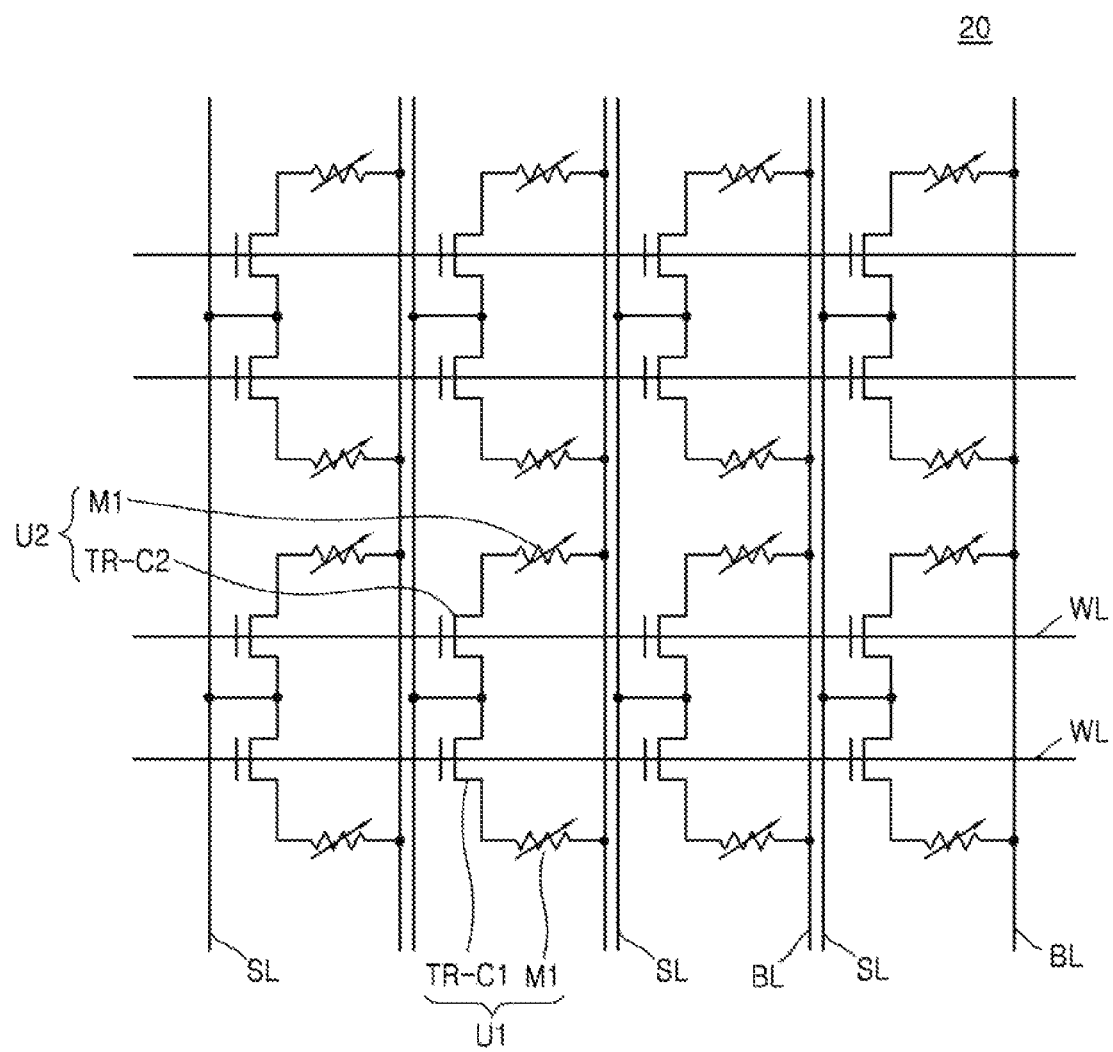
FIG. 16 is a circuit diagram of a magnetic memory array including a magneto-resistive device according to an embodiment disclosed herein.

FIG. 16 is a circuit diagram of a magnetic memory array including a magneto-resistive device according to an embodiment disclosed herein.

Referring to FIG. 16, the memory cell array of the magneto-resistive device 20 comprises a plurality of unit cells U1 and U2 arranged in a matrix form. The plurality of unit cells U1 and U2 respectively include access units TR-C1 and TR-C2, and memory units M1 and M2. Each of the unit cells U1 and U2 may be electrically connected to a word line WL and a bit line BL. A plurality of word lines WL parallel to one another and a plurality of bit lines BL parallel to one another may be arranged in two dimensions to intersect with each other. A plurality of source lines SL may be arranged parallel to one another. The plurality of source lines SL may extend in the same direction as the plurality of bit lines BL. Embodiments disclosed herein, however, are not limited thereto, and the plurality of source lines SL may extend in the same direction as the plurality of word lines WL. The access units TR-C1 and TR-C2 are implemented using transistors, and one end of each of the access units TR-C1 and TR-C2 is connected to the source lines SL.

The access units TR-C1 and TR-C2 control current supply to the memory units M1 and M2 according to voltage of the word lines WL. In some embodiments, the access units TR-C1 and TR-C2 may be MOS transistors, bipolar transistors, or diodes. In some embodiments, the access units TR-C1 and TR-C2 may be n-MOSFETs.

The memory units M1 and M2 may include a magnetic material. In some embodiments, the memory units M1 and M2 may include magnetic tunnel junctions (MTJs). In some embodiments, the memory units M1 and M2 may perform a memory function by using a spin transfer torque (STT) phenomenon whereby a magnetization direction of a magnetic body is changed according to an input current.

A first access unit TR-C1 and a second access unit TR-C2 may be commonly connected to a source line SL. A first access unit TR-C1 and a second access unit TR-C2 may be formed together in a single active region, and the first access unit TR-C1 and the second access unit TR-C2 formed together in the single active region may be connected to a single source line SL by using a single impurity region. Thus, two unit cells U1 and U2 may be formed in the single active region.

Figure 17:
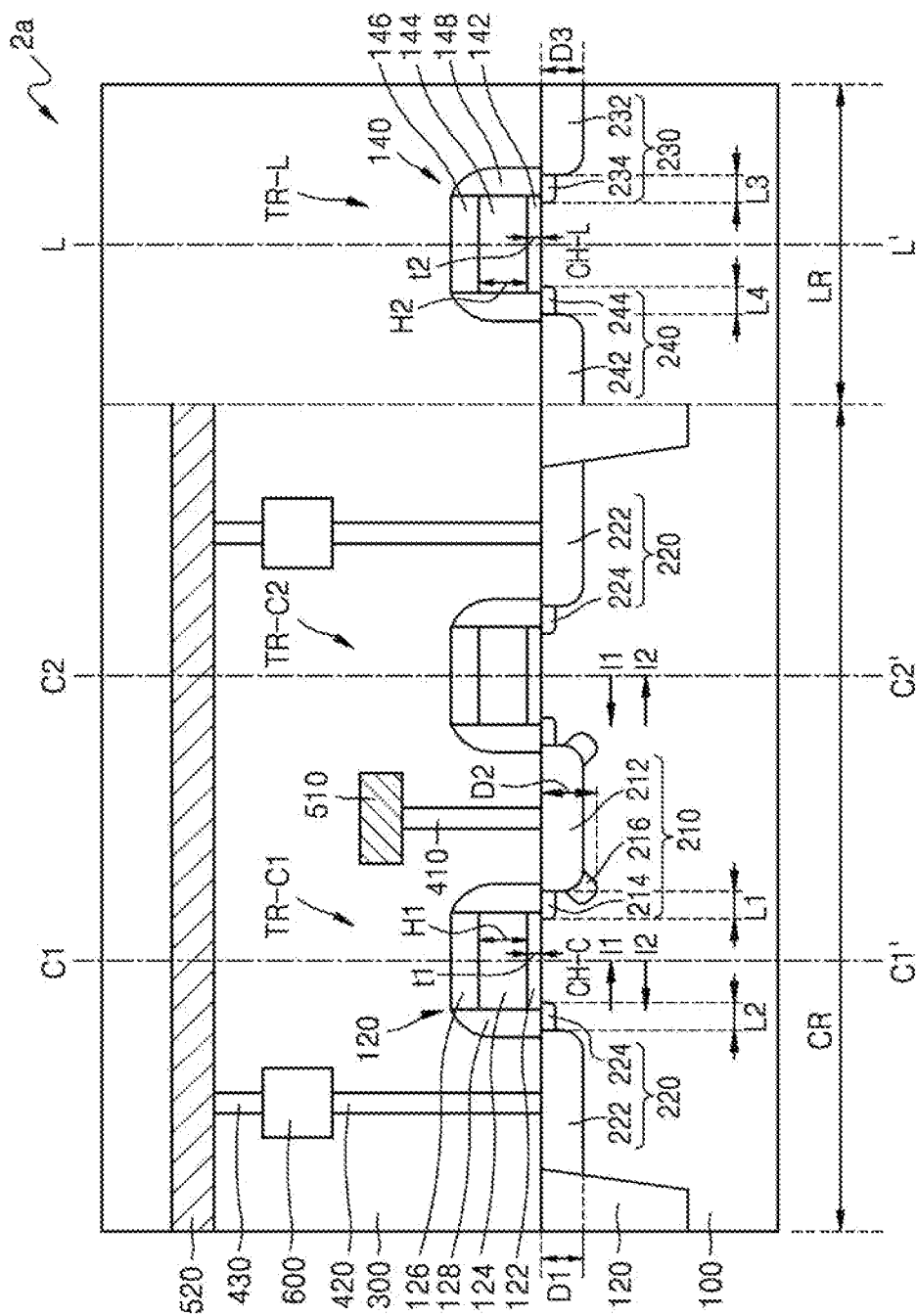
FIG. 17 is a cross-sectional view illustrating relevant portions of a semiconductor device including a magneto-resistive device according to an embodiment disclosed herein.

FIG. 17 is a cross-sectional view illustrating relevant portions of a semiconductor device 2*a* including first and second magneto-resistive devices 600 according to an embodiment disclosed herein. A repeated description of details described above with reference to FIG. 2 is omitted in the description of FIG. 17.

Referring to FIG. 17, the semiconductor device 2*a* comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed. In the cell region CR, an active region in which cell channel regions CH-C of the two first and second cell transistors TR-C1 and TR-C2 are arranged is defined by an isolation layer 120.

The first and second cell transistors TR-C1 and TR-C2 may share a common impurity region 210, and the common impurity region 210 may be electrically connected to a source line 510.

First and second individual impurity regions 220 of the first and second cell transistors TR-C1 and TR-C2 may be respectively connected to a bit line 520 via the first and second magneto-resistive devices 600.

The common impurity region 210 and the first and second individual impurity regions 220 may respectively include a common source/drain region 212 and first and second individual source/drain regions 222.

The common impurity region 210 may further include common LDD regions 214, and the first and second individual impurity regions 220 may further respectively include first and second individual LDD regions 224.

The common impurity region 210 may further include first and second hollow regions 216. The first and second hollow regions 216 may be respectively formed in contact with both ends of a lower portion of the common source/drain region 212 to respectively face the first and second individual impurity regions 220.

The common impurity region 210 and the first individual impurity region 220 may be asymmetrical to each other in terms of opposite portions about a center C1-C1' of the first cell transistor TR-C1 that are in a channel direction of the channel region CH-C because the common impurity region 210 includes the first and second hollow regions 216, and the common impurity region 210 and the second individual impurity region 220 may be asymmetrical to each other in terms of opposite portions about a center C2-C2' of the second cell transistor TR-C2 that are in a channel direction of the channel region CH-C.

A lowermost surface of the common impurity region 210 may be at a lower level than a lowermost surface of each of the first and second individual impurity regions 220 because the common impurity region 210 includes the first and second hollow regions 216 formed in contact with both ends of the lower portion of the common source/drain region 212.

Referring to FIGS. 2 and 17, the semiconductor device 2a of FIG. 17 includes the first cell transistor TR-C1 and the second cell transistor TR-C2, which are symmetrical or substantially symmetrical to each other about the common impurity region 210. The first cell transistor TR-C1 and the second cell transistor TR-C2 may have the same structures as that of the cell transistor TR-C of FIG. 2 except that the first and second cell transistors TR-C1 and TR-C2 share the common impurity region 210. In other words, the semiconductor device 2a of FIG. 17 may be the same as the semiconductor device 1a of FIG. 2 except that the semiconductor device 2a of FIG. 17 includes the two cell transistors TR-C1a and TR-C2 sharing the common impurity region 210, and thus a detailed description thereof is omitted herein.

In other words, the common impurity region 210 and the first individual impurity region 220 of the first cell transistor TR-C1 of FIG. 17 may respectively correspond to the first impurity region 210 and the second impurity region 220 of the cell transistor TR-C of FIG. 2. The common impurity region 210 and the second individual impurity region 220 of the second cell transistor TR-C2 of FIG. 17 may respectively correspond to the first impurity region 210 and the second impurity region 220 of the cell transistor TR-C of FIG. 2. Accordingly, the first and second cell transistors TR-C1 and TR-C2 may have different threshold voltages in a first current direction I1 and a second current direction I2 that are opposite directions.

Repeated descriptions of details described above with reference to FIG. 3-15 and FIG. 17 may be omitted in the following descriptions of FIGS. 18-30.

Figure 18:
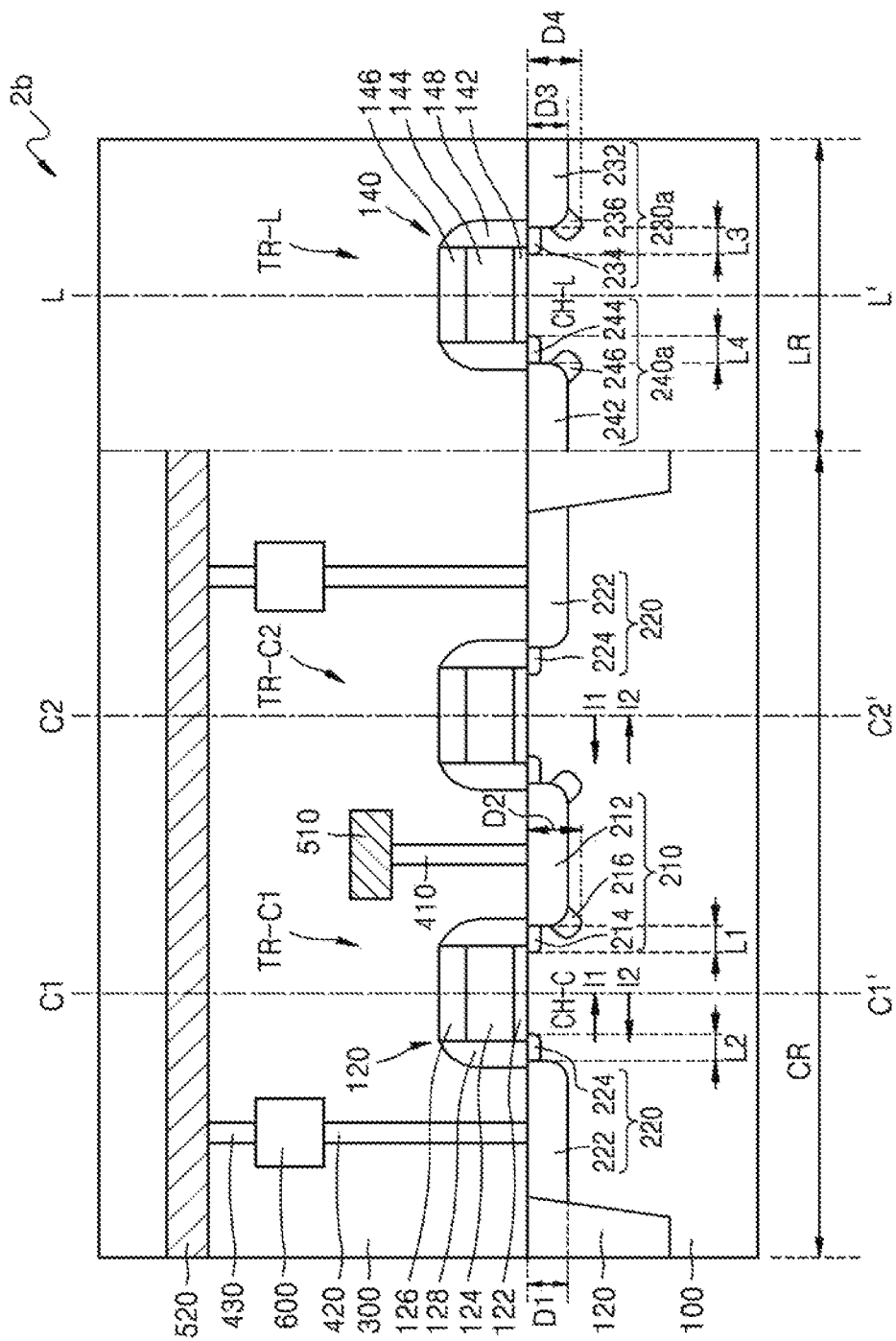
FIG. 18 is a cross-sectional view illustrating relevant portions of a semiconductor device including a magneto-resistive device according to an embodiment disclosed herein.

FIG. 18 is a cross-sectional view illustrating relevant portions of a semiconductor device 2b including the first and second magneto-resistive devices 600 according to an embodiment disclosed herein.

Referring to FIG. 18, the semiconductor device 2b comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed. In the cell region CR, an active region in which cell channel regions CH-C of the two first and second cell transistors TR-C1 and TR-C2 are arranged is defined by an isolation layer 120.

A common impurity region 210 and first and second individual impurity regions 220 may respectively include a common source/drain region 212 and first and second individual source/drain regions 222. The common impurity region 210 may further include common LDD regions 214 and the first and second individual impurity regions 220 may further respectively include first and second individual LDD regions 224. The common impurity region 210 may further include first and second hollow regions 216.

First and second logic impurity regions 230a and 240a may further respectively include first and second logic hollow regions 236 and 246. The first and second logic hollow regions 236 and 246 may be respectively formed in contact with lower portions of the first and second logic source/drain regions 232 and 242.

The first and second logic hollow regions 236 and 246 may be of the first conductivity type. The first and second logic hollow regions 236 and 246 may have greater impurity concentrations than a logic channel region CH-L.

Referring to FIGS. 3 and 18, the semiconductor device 2b of FIG. 18 includes the first cell transistor TR-C1 and the second cell transistor TR-C2, which are symmetrical or substantially symmetrical to each other about the common impurity region 210. The first cell transistor TR-C1 and the second cell transistor TR-C2 may have the same structures as that of the cell transistor TR-C of FIG. 3 except that the first and second cell transistors TR-C1 and TR-C2 share the common impurity region 210.

Figure 19:
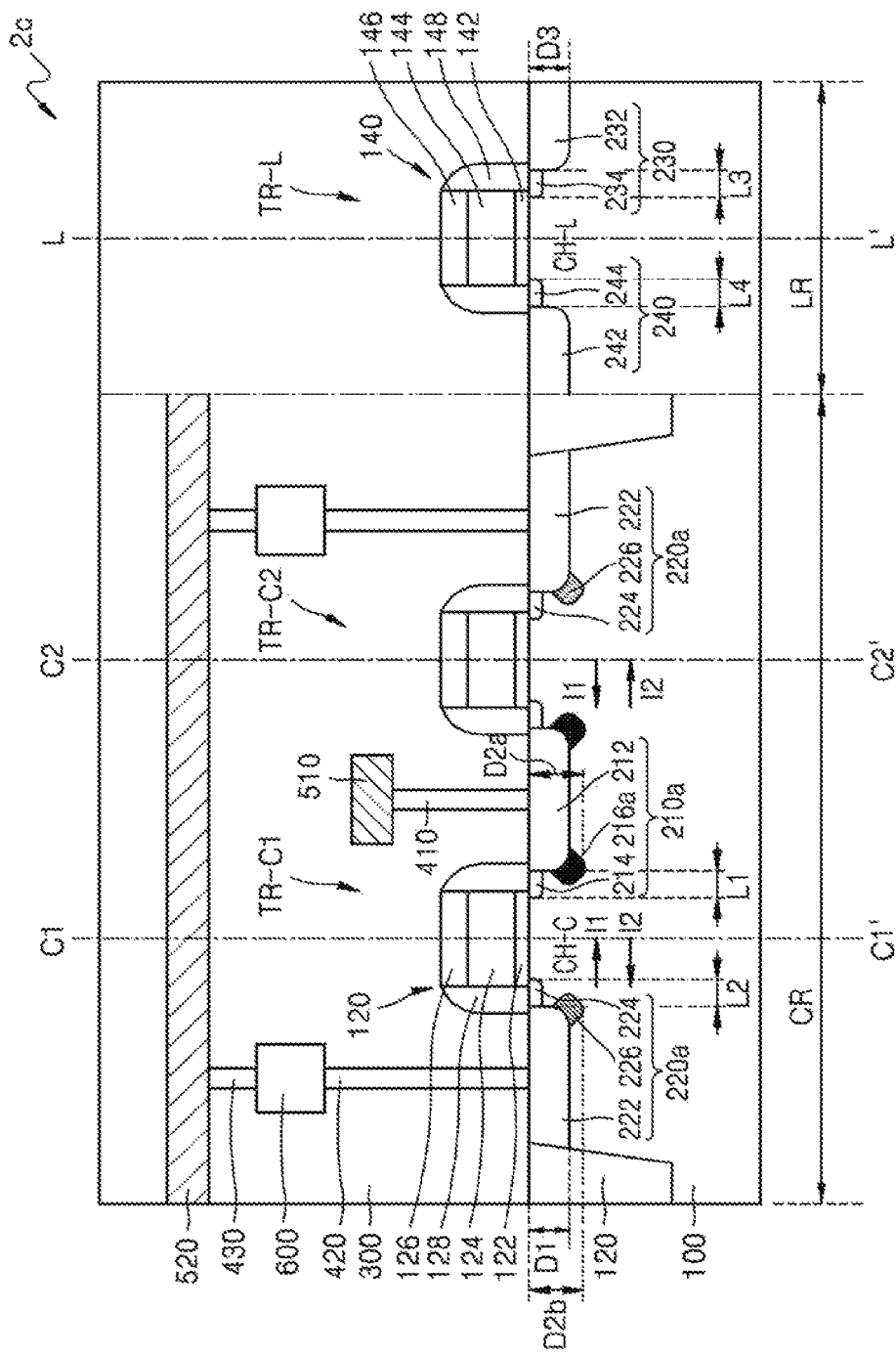
FIG. 19 is a cross-sectional view illustrating relevant portions of a semiconductor device including a magneto-resistive device according to an embodiment disclosed herein.

FIG. 19 is a cross-sectional view illustrating relevant portions of a semiconductor device 2c including the first and second magneto-resistive devices 600 according to an embodiment disclosed herein.

Referring to FIG. 19, the semiconductor device 2c comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210a and first and second individual impurity regions 220a may respectively include a common source/drain region 212 and first and second individual source/drain regions 222. The common impurity region 210a may further include common LDD regions 214 and the first and second individual impurity regions 220a may further respectively include first and second individual LDD regions 224. The common impurity region 210a may further include first and second hollow regions 216a. The first and second individual impurity regions 220a may further respectively include third and fourth hollow regions 226.

The third and fourth hollow regions 226 may be respectively formed in contact with respective ends of respective lower portions of the first and second individual impurity regions 220a that respectively face the common impurity regions 210a.

The first and second hollow regions 216a may have greater impurity concentrations than the third and fourth hollow regions 226.

Referring to FIGS. 4 and 19, the semiconductor device 2c of FIG. 19 includes the first cell transistor TR-C1 and the second cell transistor TR-C2, which are symmetrical or substantially symmetrical to each other about the common impurity region 210a. The first cell transistor TR-C1 and the second cell transistor TR-C2 may have the same structures as that of the cell transistor TR-C of FIG. 4 except that the first and second cell transistors TR-C1 and TR-C2 share the common impurity region 210a.

Figure 20:
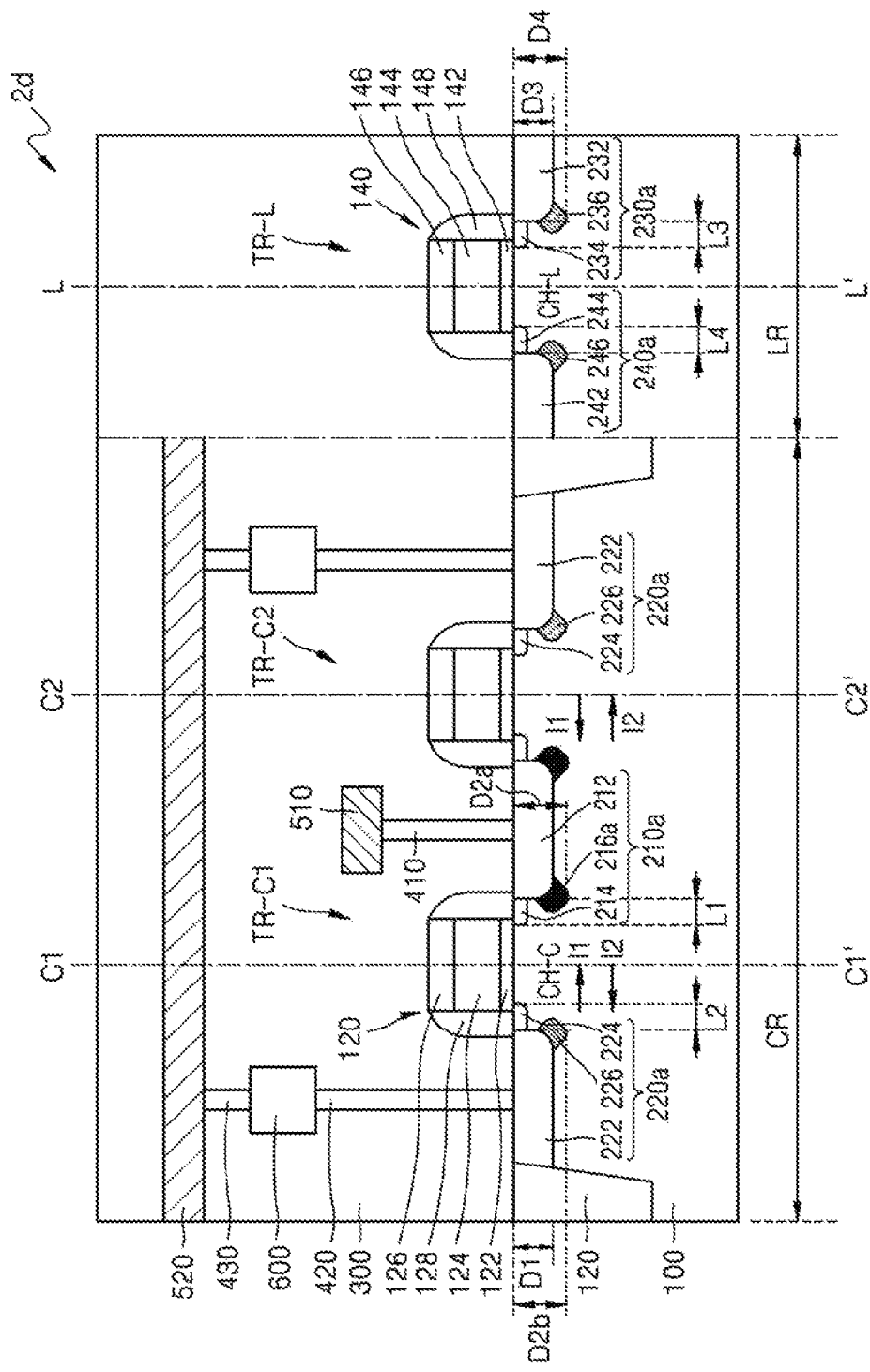
FIG. 20 is a cross-sectional view illustrating relevant portions of a semiconductor device including a magneto-resistive device according to an embodiment disclosed herein.

FIG. 20 is a cross-sectional view illustrating relevant portions of a semiconductor device 2d including the first and second magneto-resistive devices 600 according to an embodiment disclosed herein.

Referring to FIG. 20, the semiconductor device 2d comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210a and first and second individual impurity regions 220a may respectively include a common source/drain region 212 and first and second individual source/drain regions 222. The common impurity region 210a may further include common LDD regions 214 and the first and second individual impurity regions 220a may further respectively include first and second individual LDD regions 224. The common impurity region 210a may further include first and second hollow regions 216a. The first and second individual impurity regions 220a may further respectively include third and fourth hollow regions 226.

First and second logic impurity regions 230a and 240a may further respectively include first and second logic hollow regions 236 and 246. The first and second logic hollow regions 236 and 246 may be respectively formed in contact with lower portions of the first and second logic source/drain regions 232 and 242. The third and fourth hollow regions 226 and the first and second logic hollow regions 236 and 246 may have substantially the same impurity concentrations.

Referring to FIGS. 5 and 20, the semiconductor device 2d of FIG. 20 includes the first cell transistor TR-C1 and the second cell transistor TR-C2, which are symmetrical or substantially symmetrical to each other about the common impurity region 210a. The first cell transistor TR-C1 and the second cell transistor TR-C2 may have the same structures as that of the cell transistor TR-C of FIG. 5 except that the first and second cell transistors TR-C1 and TR-C2 share the common impurity region 210a.

Figure 21:
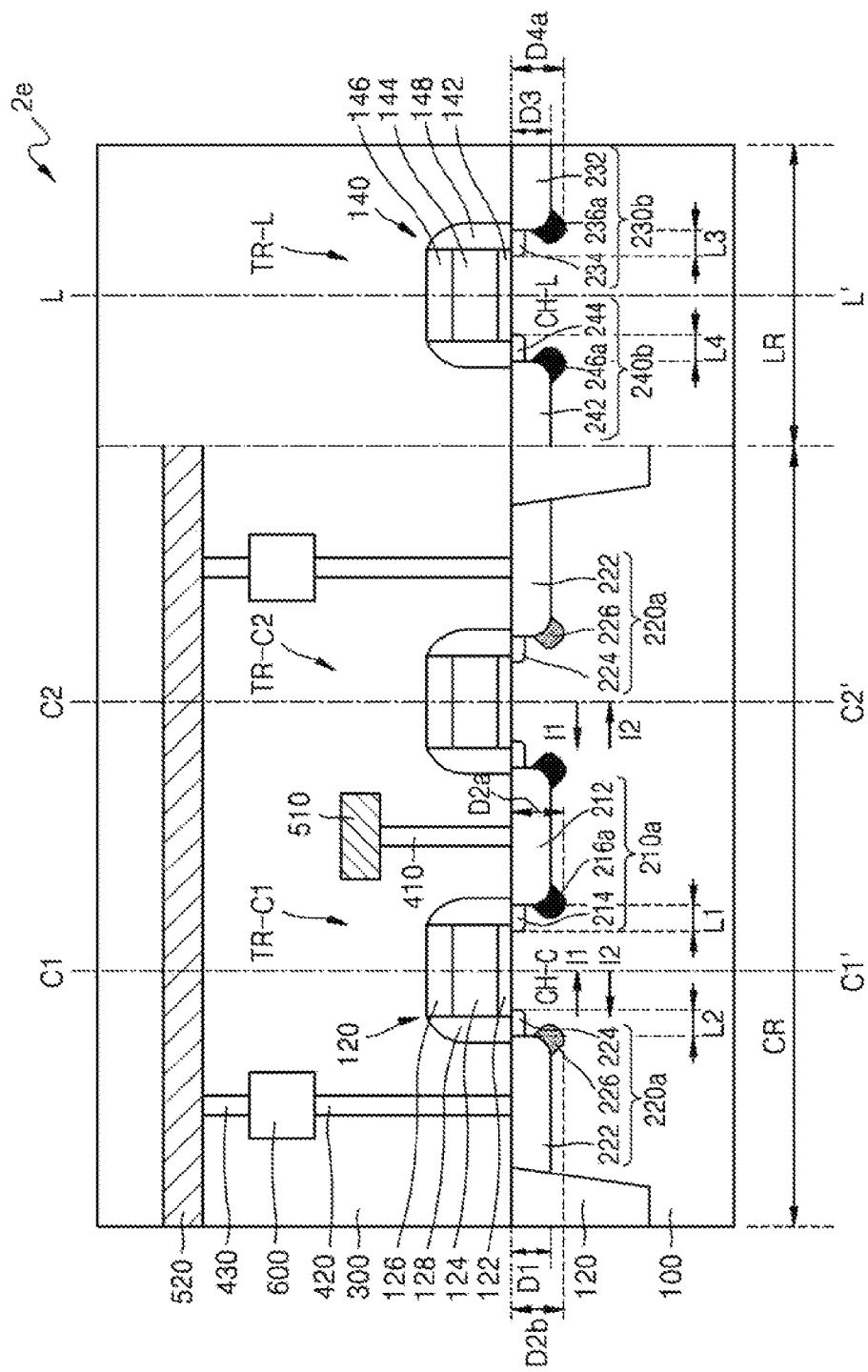
FIG. 21 is a cross-sectional view illustrating relevant portions of a semiconductor device including a magneto-resistive device according to an embodiment.

FIG. 21 is a cross-sectional view illustrating relevant portions of a semiconductor device 2e including the first and second magneto-resistive devices 600 according to an embodiment disclosed herein.

Referring to FIG. 21, the semiconductor device 2e comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210a and first and second individual impurity regions 220a may respectively include a common source/drain region 212 and first and second individual source/drain regions 222. The common impurity region 210a may further include common LDD regions 214 and the first and second individual impurity regions 220a may further respectively include first and second individual LDD regions 224. The common impurity region 210a may further include first and second hollow regions 216a. The first and second individual impurity regions 220a may further respectively include third and fourth hollow regions 226.

First and second logic impurity regions 230b and 240b may further respectively include first and second logic hollow regions 236a and 246a. The first and second logic hollow regions 236a and 246a may be respectively formed in contact with lower portions of the first and second logic source/drain regions 232 and 242. The first and second hollow regions 216a and the first and second logic hollow regions 236a and 246a may have substantially the same impurity concentrations.

Referring to FIGS. 6 and 21, the semiconductor device 2e of FIG. 21 includes the first cell transistor TR-C1 and the second cell transistor TR-C2, which are symmetrical or substantially symmetrical to each other about the common impurity region 210a. The first cell transistor TR-C1 and the second cell transistor TR-C2 may have the same structures as that of the cell transistor TR-C of FIG. 6 except that the first and second cell transistors TR-C1 and TR-C2 share the common impurity region 210a.

Figure 22:
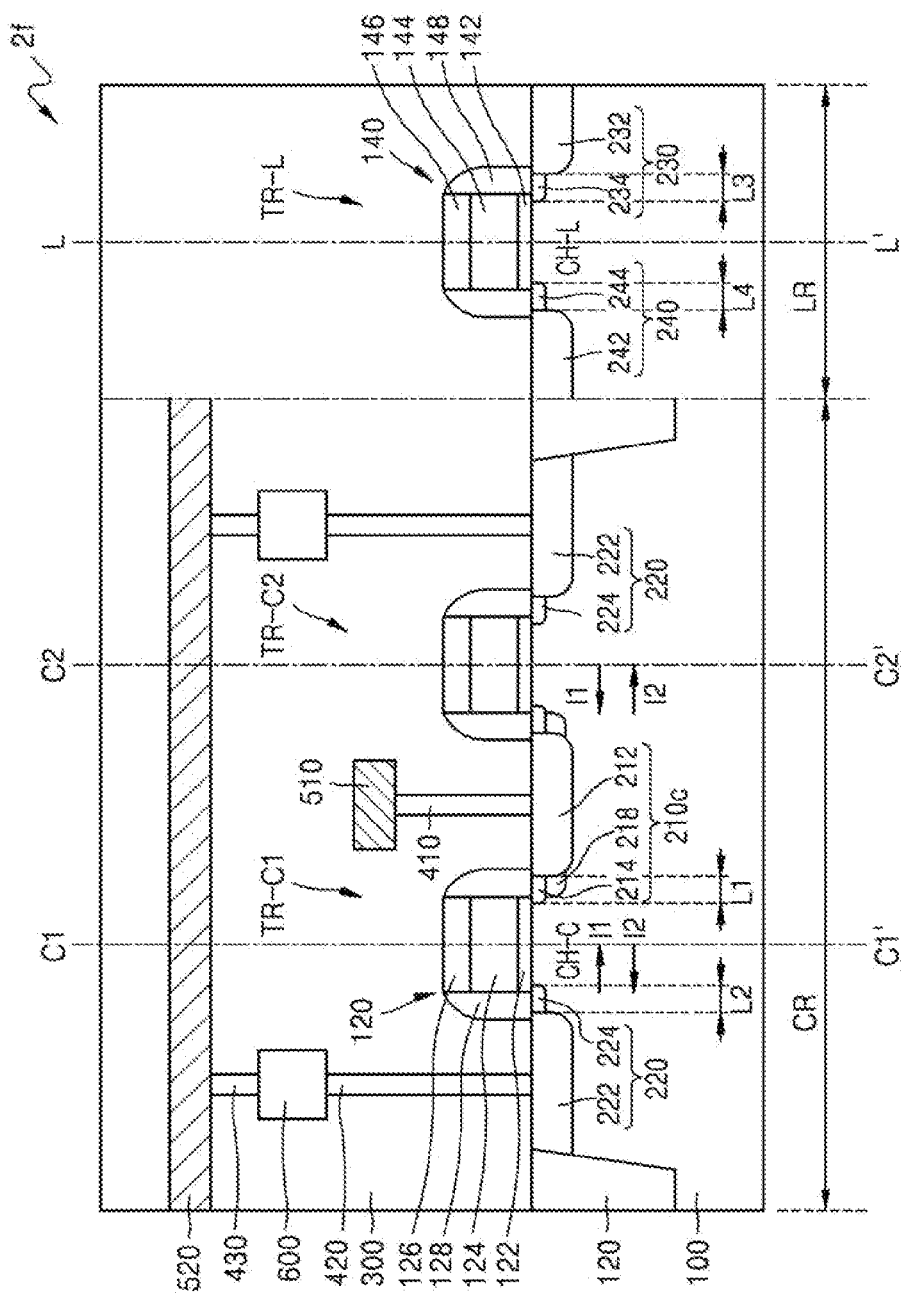
FIG. 22 is a cross-sectional view illustrating relevant portions of a semiconductor device including a magneto-resistive device according to an embodiment disclosed herein.

FIG. 22 is a cross-sectional view illustrating relevant portions of a semiconductor device 2f including the first and second magneto-resistive devices 600 according to an embodiment disclosed herein.

Referring to FIG. 22, the semiconductor device 2f comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210c and first and second individual impurity regions 220 may respectively include a common source/drain region 212 and first and second individual source/drain regions 222. The common impurity region 210c may further include common LDD regions 214 and the first and second individual impurity regions 220 may further respectively include first and second individual LDD regions 224. The common impurity region 210c may further include first and second hollow regions 218. The first and second hollow regions 218 may be formed in contact with both lateral surfaces of the first cell source/drain region 212 and lower surfaces of the common LDD regions 214, respectively. The first and second hollow regions 218 may be of the first conductivity type. The first and second hollow regions 218 may have greater impurity concentrations than the cell channel region CH-C.

Referring to FIGS. 7 and 22, the semiconductor device 2f of FIG. 22 includes the first cell transistor TR-C1 and the second cell transistor TR-C2, which are symmetrical or substantially symmetrical to each other about the common impurity region 210c. The first cell transistor TR-C1 and the second cell transistor TR-C2 may have the same structures as that of the cell transistor TR-C of FIG. 7 except that the first and second cell transistors TR-C1 and TR-C2 share the common impurity region 210c.

Figure 23:
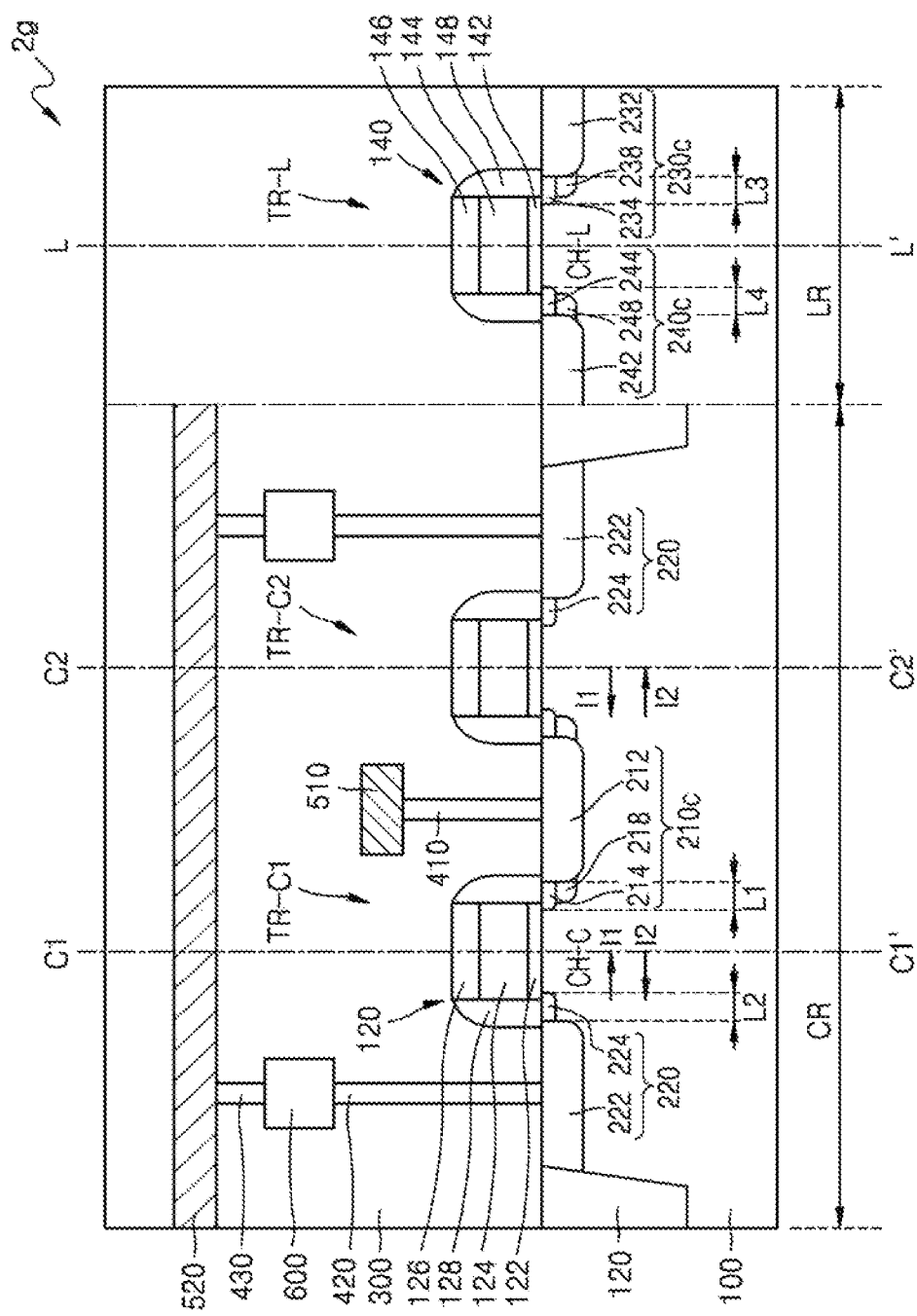
FIG. 23 is a cross-sectional view illustrating relevant portions of a semiconductor device including a magneto-resistive device according to an embodiment disclosed herein.

FIG. 23 is a cross-sectional view illustrating relevant portions of a semiconductor device 2g including the first and second magneto-resistive devices 600 according to an embodiment disclosed herein.

Referring to FIG. 23, the semiconductor device 2g comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210c and first and second individual impurity regions 220 may respectively include a common source/drain region 212 and first and second individual source/drain regions 222. The common impurity region 210c may further include common LDD regions 214 and the first and second individual impurity regions 220 may further respectively include first and second individual LDD regions 224. The common impurity region 210c may further include first and second hollow regions 218.

First and second logic impurity regions 230c and 240c may further respectively include first and second logic hollow regions 238 and 248. The first and second logic hollow regions 238 and 248 may be respectively formed in contact with lateral surfaces of the first and second logic source/drain regions 232 and 242 and lower surfaces of the first and second logic LDD regions 234 and 244.

The first and second logic hollow regions 238 and 248 may be of the first conductivity type. The first and second logic hollow regions 238 and 248 may have greater impurity concentrations than a logic channel region CH-L. The first and second hollow regions 218 and the first and second logic hollow regions 238 and 248 may be formed simultaneously.

Referring to FIGS. 8 and 23, the semiconductor device 2g of FIG. 23 includes the first cell transistor TR-C1 and the second cell transistor TR-C2, which are symmetrical or substantially symmetrical to each other about the common impurity region 210c. The first cell transistor TR-C1 and the second cell transistor TR-C2 may have the same structures as that of the cell transistor TR-C of FIG. 8 except that the first and second cell transistors TR-C1 and TR-C2 share the common impurity region 210c.

Figure 24:
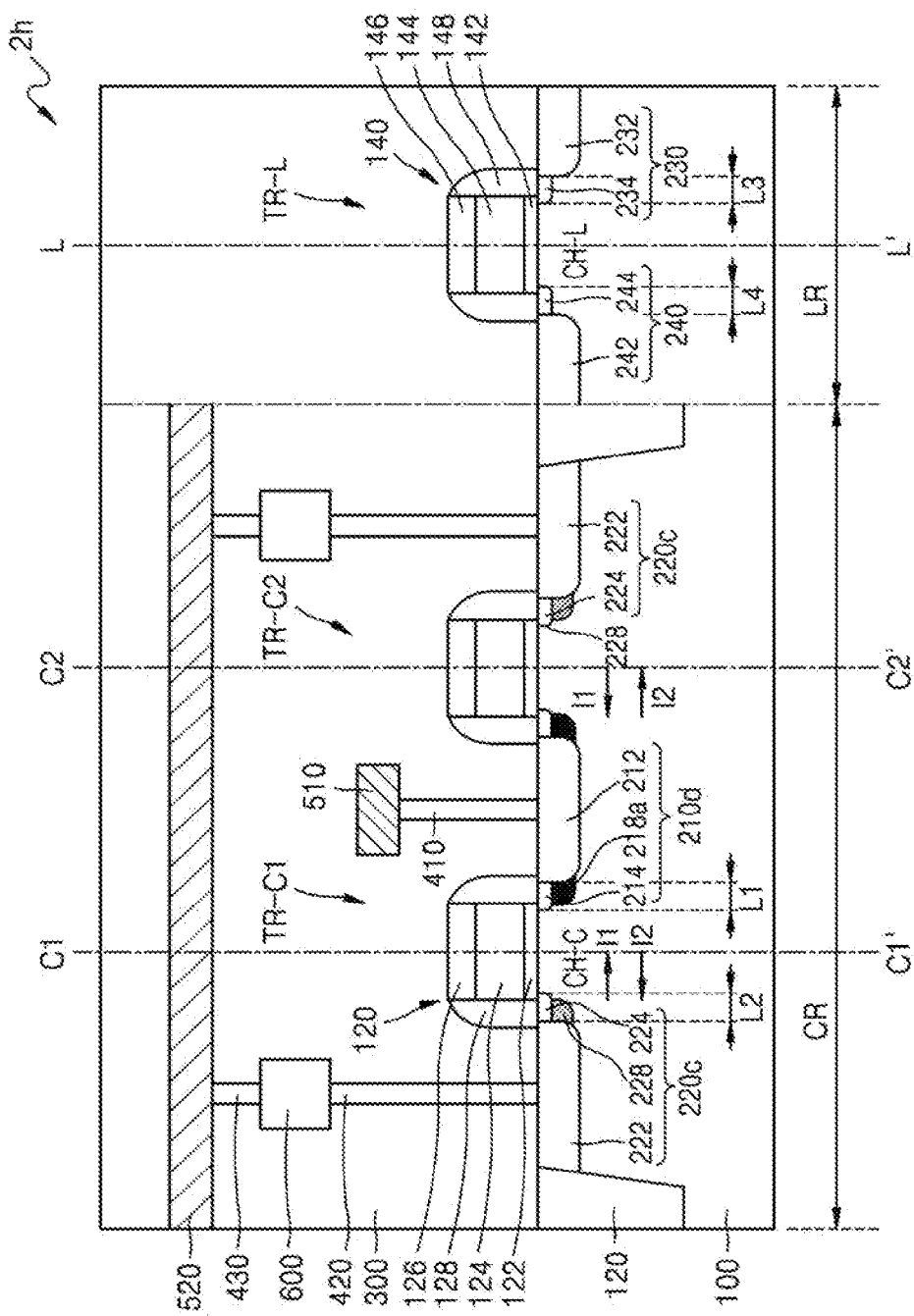
FIG. 24 is a cross-sectional view illustrating relevant portions of a semiconductor device including a magneto-resistive device according to an embodiment disclosed herein.

FIG. 24 is a cross-sectional view illustrating relevant portions of a semiconductor device 2h including the first and second magneto-resistive devices 600 according to an embodiment disclosed herein.

Referring to FIG. 24, the semiconductor device 2h includes a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210d and first and second individual impurity regions 220c may respectively include a common source/drain region 212 and first and second individual source/drain regions 222. The common impurity region 210d may further include common LDD regions 214 and the first and second individual impurity regions 220c may further respectively include first and second individual LDD regions 224. The common impurity region 210d may further include first and second hollow regions 218a.

The first and second individual impurity regions 220c may further include third and fourth hollow regions 228, respectively. The third and fourth hollow regions 228 may be respectively formed in contact with respective lateral surfaces of the first and second cell source/drain regions 222, and respective lower surfaces of the first and second individual LDD regions 224 that that the third and fourth hollow regions 228 face the common impurity region 210d. The first and second hollow regions 218a may have greater impurity concentrations than the third and fourth hollow regions 228.

Referring to FIGS. 9 and 24, the semiconductor device 2h of FIG. 24 includes the first cell transistor TR-C1 and the second cell transistor TR-C2, which are symmetrical or substantially to each other about the common impurity region 210d. The first cell transistor TR-C1 and the second cell transistor TR-C2 may have the same structures as that of the cell transistor TR-C of FIG. 9 except that the first and second cell transistors TR-C1 and TR-C2 share the common impurity region 210d.

Figure 25:
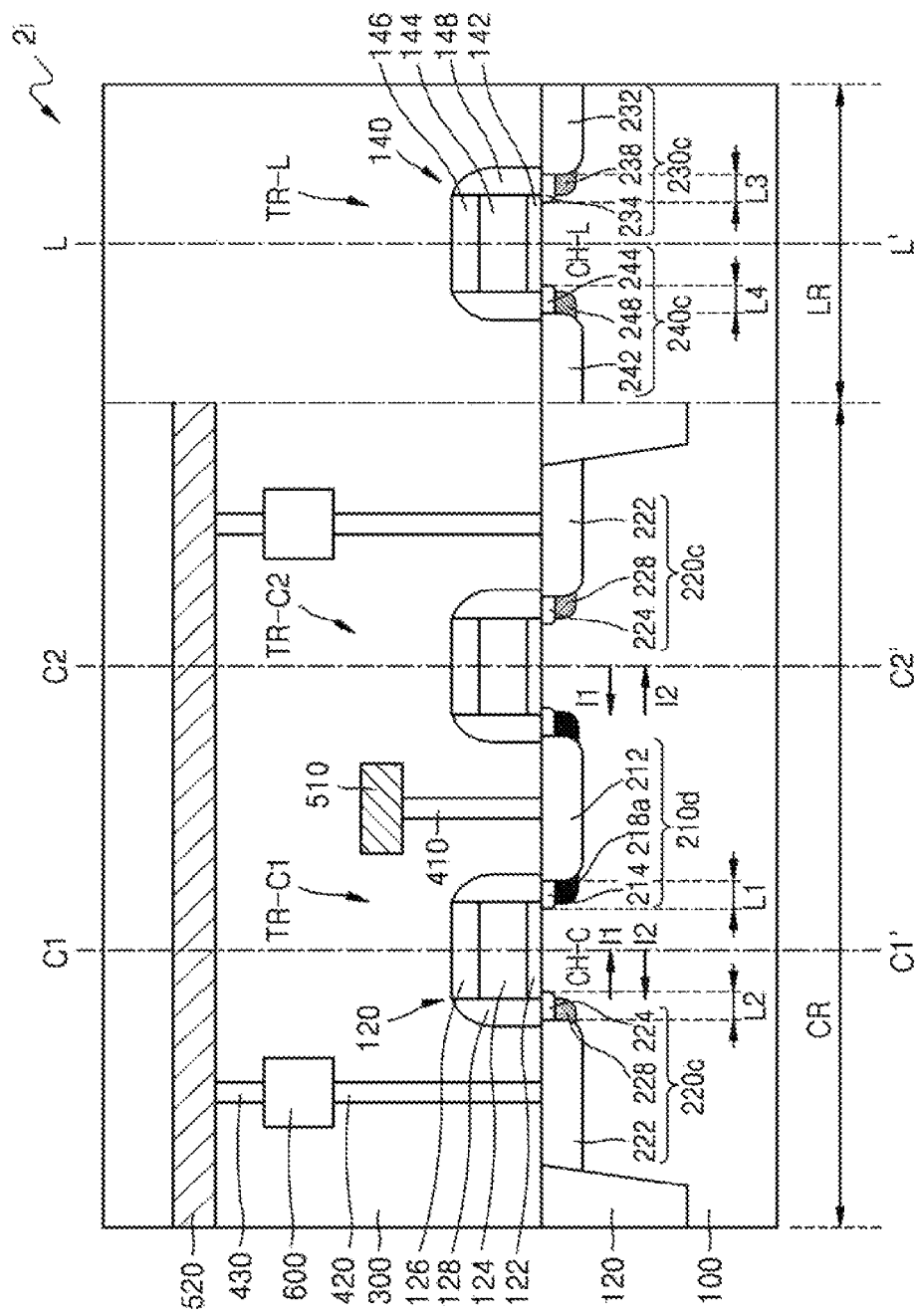
FIG. 25 is a cross-sectional view illustrating relevant portions of a semiconductor device including a magneto-resistive device according to an embodiment disclosed herein.

FIG. 25 is a cross-sectional view illustrating relevant portions of a semiconductor device 2i including the first and second magneto-resistive devices 600 according to an embodiment disclosed herein.

Referring to FIG. 25, the semiconductor device 2i comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210d and first and second individual impurity regions 220c may respectively include a common source/drain region 212 and first and second individual source/drain regions 222. The common impurity region 210d may further include common LDD regions 214 and the first and second individual impurity regions 220c may further respectively include first and second individual LDD regions 224. The common impurity region 210d may further include first and second hollow regions 218a. The first and second individual impurity regions 220c may further respectively include third and fourth hollow regions 228.

First and second logic impurity regions 230c and 240c may further respectively include first and second logic hollow regions 238 and 248. The first and second logic hollow regions 238 and 248 may be respectively formed in contact with respective lateral surfaces of the first and second logic source/drain regions 232 and 242 and respective lower surfaces of the first and second logic LDD regions 234 and 244. The third and fourth hollow regions 228 and the first and second logic hollow regions 238 and 248 may have substantially the same impurity concentrations.

Referring to FIGS. 10 and 25, the semiconductor device 2i of FIG. 25 includes the first cell transistor TR-C1 and the second cell transistor TR-C2, which are symmetrical or substantially symmetrical to each other about the common impurity region 210d. The first cell transistor TR-C1 and the second cell transistor TR-C2 may have the same structures as that of the cell transistor TR-C of FIG. 10 except that the first and second cell transistors TR-C1 and TR-C2 share the common impurity region 210d.

Figure 26:
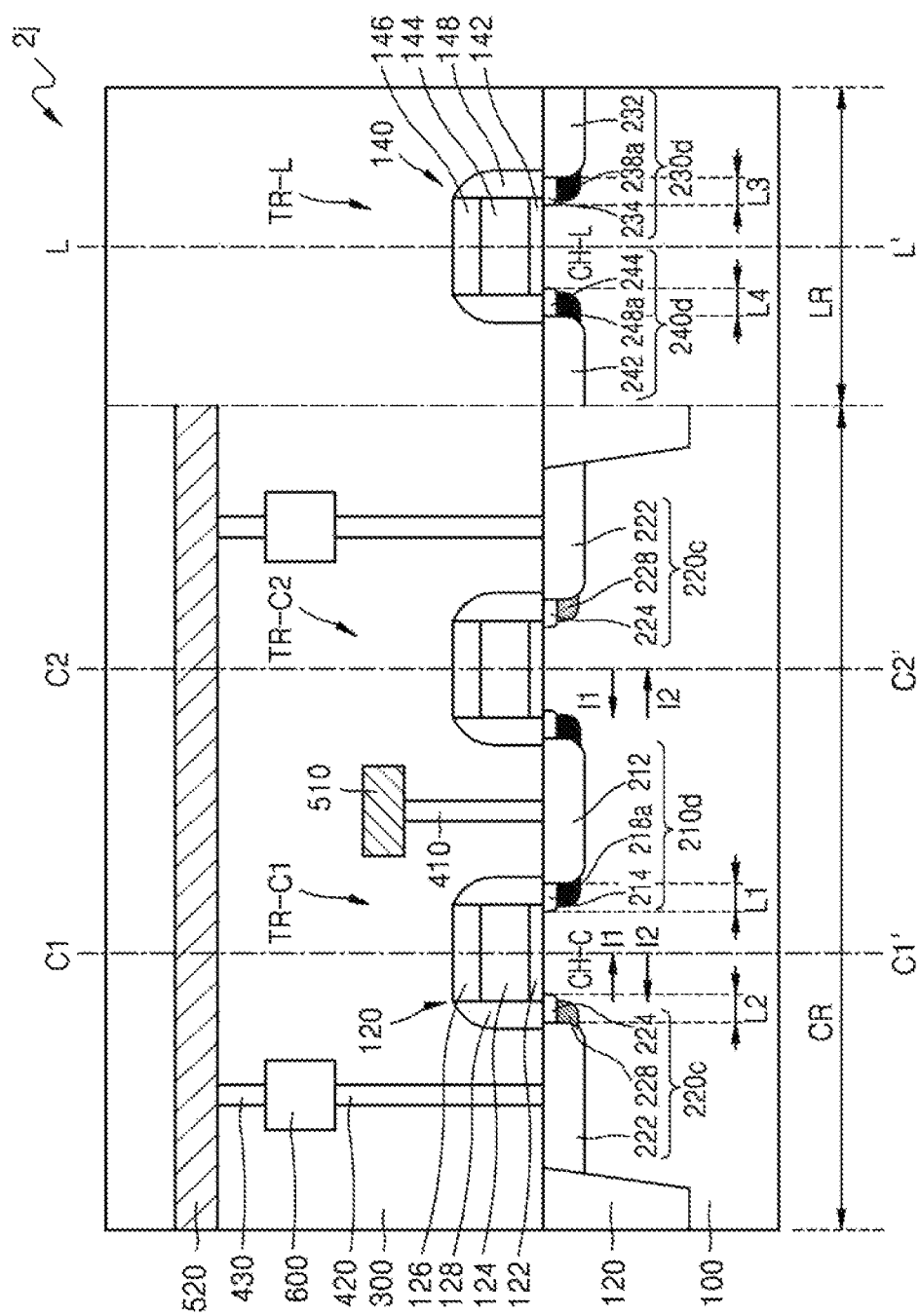
FIG. 26 is a cross-sectional view illustrating relevant portions of a semiconductor device including a magneto-resistive device according to an embodiment disclosed herein.

FIG. 26 is a cross-sectional view illustrating relevant portions of a semiconductor device 2j including first and second magneto-resistive devices 600 according to an embodiment disclosed herein.

Referring to FIG. 26, the semiconductor device 2j comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210d and first and second individual impurity regions 220c may respectively include a common source/drain region 212 and first and second individual source/drain regions 222. The common impurity region 210d may further include common LDD regions 214, and the first and second individual impurity regions 220c may further respectively include first and second individual LDD regions 224. The common impurity region 210d may further include first and second hollow regions 218a. The first and second individual impurity regions 220c may further respectively include third and fourth hollow regions 228.

First and second logic impurity regions 230d and 240d may further respectively include first and second logic hollow regions 238a and 248a. The first and second logic hollow regions 238a and 248a may be respectively formed in contact with respective lateral surfaces of the first and second logic source/drain regions 232 and 242 and respective lower surfaces of the first and second logic LDD regions 234 and 244. The first and second hollow regions 218a and the first and second logic hollow regions 238a and 248a may have substantially the same impurity concentrations.

Referring to FIGS. 11 and 26, the semiconductor device 2j of FIG. 26 includes the first cell transistor TR-C1 and the second cell transistor TR-C2, which are symmetrical or substantially symmetrical to each other about the common impurity region 210d. The first cell transistor TR-C1 and the second cell transistor TR-C2 may have the same structures as that of the cell transistor TR-C of FIG. 11 except that the first and second cell transistors TR-C1 and TR-C2 share the common impurity region 210d.

Figure 27:
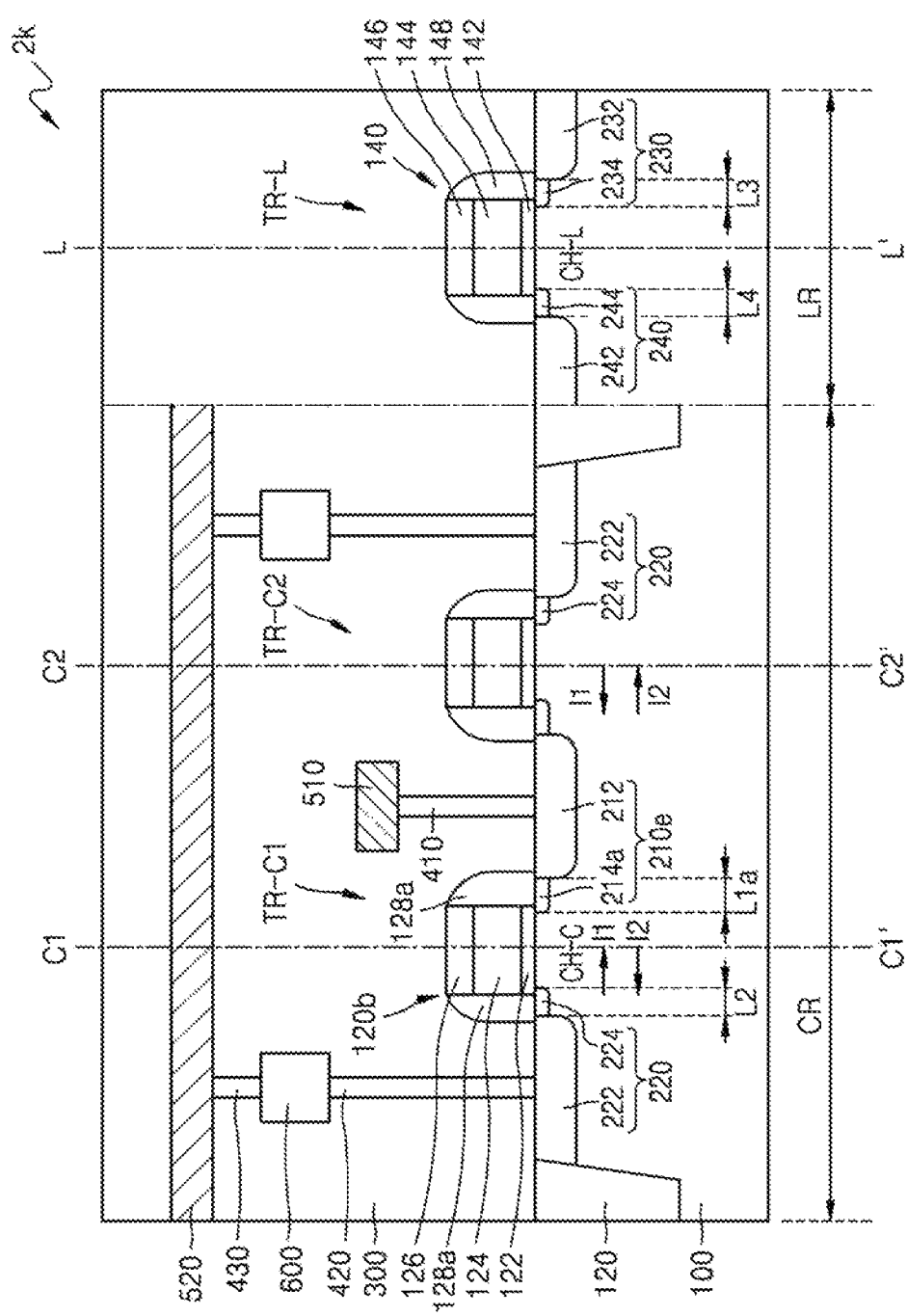
FIG. 27 is a cross-sectional view illustrating relevant portions of a semiconductor device including a magneto-resistive device according to an embodiment disclosed herein.

FIG. 27 is a cross-sectional view illustrating relevant portions of a semiconductor device 2k including first and second magneto-resistive devices 600 according to an embodiment disclosed herein.

Referring to FIG. 27, the semiconductor device 2k includes a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210e and first and second individual impurity regions 220 may respectively include a common source/drain region 212 and first and second individual source/drain regions 222. The common impurity region 210e may further include common LDD regions 214a and the first and second individual impurity regions 220 may further respectively include first and second individual LDD regions 224.

A first width L1a of each of the common LDD regions 214a may be greater than a second width L2 of each of the first and second individual LDD regions 224. The second width L2 of each of the first and second individual LDD regions 224, a third width L3 of a first logic LDD region 234, and a fourth width L4 of a second logic LDD region 244 may be substantially the same as one another.

Referring to FIGS. 12 and 27, the semiconductor device 2k of FIG. 27 includes the first cell transistor TR-C1 and the second cell transistor TR-C2, which are symmetrical or substantially symmetrical to each other about the common impurity region 210e. The first cell transistor TR-C1 and the second cell transistor TR-C2 may have the same structures as that of the cell transistor TR-C of FIG. 12 except that the first and second cell transistors TR-C1 and TR-C2 share the common impurity region 210e.

Figure 28:
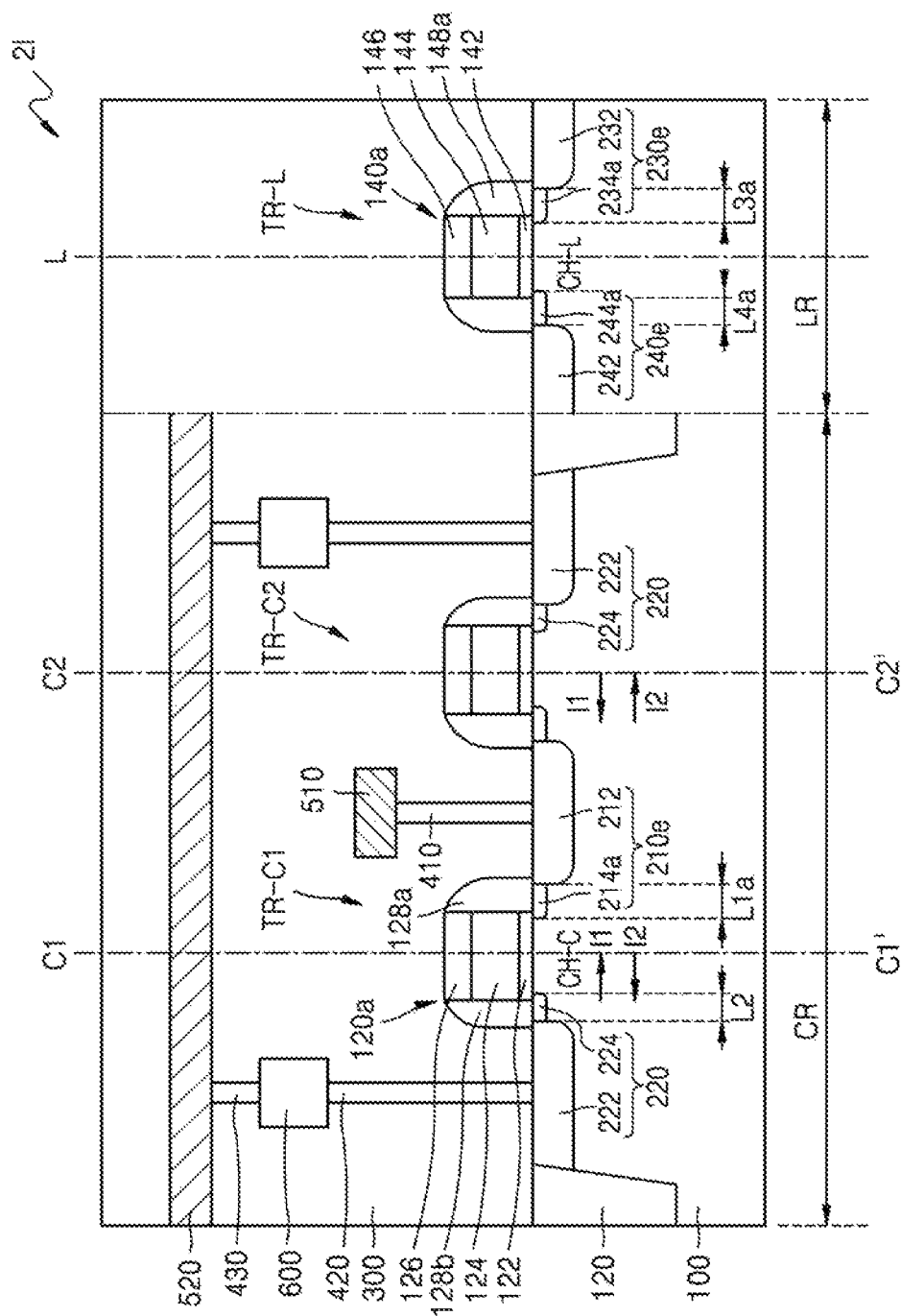
FIG. 28 is a cross-sectional view illustrating relevant portions of a semiconductor device including a magneto-resistive device according to an embodiment disclosed herein.

FIG. 28 is a cross-sectional view illustrating relevant portions of a semiconductor device 2l including first and second magneto-resistive devices 600 according to an embodiment disclosed herein.

Referring to FIG. 28, the semiconductor device 2l comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210e and first and second individual impurity regions 220 may respectively include a common source/drain region 212 and first and second individual source/drain regions 222. The common impurity region 210e may further include common LDD regions 214a and the first and second individual impurity regions 220 may further respectively include first and second individual LDD regions 224.

A first width L1a of each of the common LDD regions 214a may be greater than a second width L2 of each of the first and second individual LDD regions 224. The first width L1a of each of the common LDD regions 214a, a third width L3 of a first logic LDD region 234a, and a fourth width L4a of a second logic LDD region 244a may be substantially the same as one another.

Referring to FIGS. 13 and 28, the semiconductor device 2l of FIG. 28 includes the first cell transistor TR-C1 and the second cell transistor TR-C2, which are symmetrical or substantially symmetrical to each other about the common impurity region 210e. The first cell transistor TR-C1 and the second cell transistor TR-C2 may have the same structures as that of the cell transistor TR-C of FIG. 13 except that the first and second cell transistors TR-C1 and TR-C2 share the common impurity region 210e.

Figure 29:
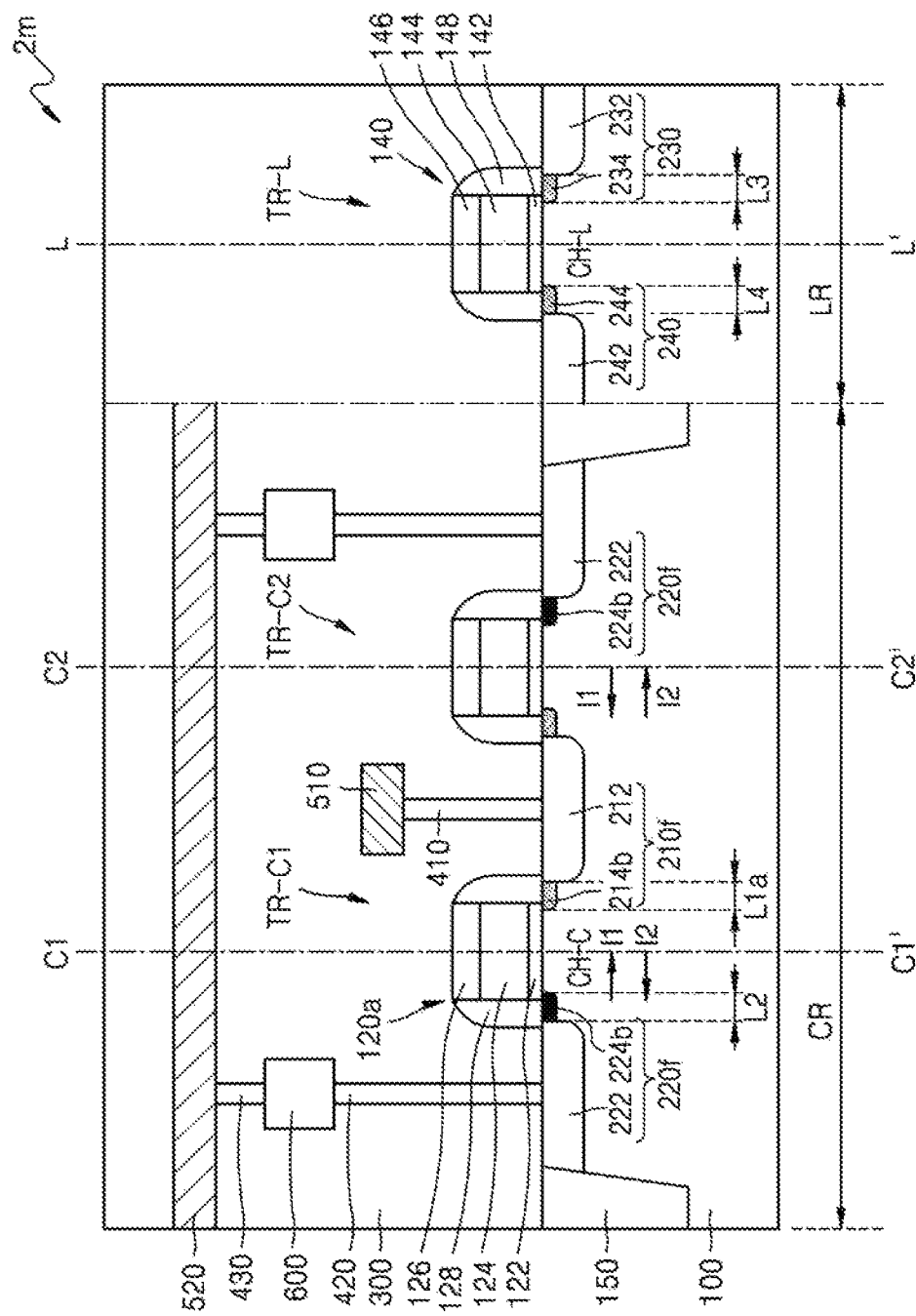
FIG. 29 is a cross-sectional view illustrating relevant portions of a semiconductor device including a magneto-resistive device according to an embodiment disclosed herein.

FIG. 29 is a cross-sectional view illustrating relevant portions of a semiconductor device 2m including the first and second magneto-resistive devices 600 according to an embodiment disclosed herein.

Referring to FIG. 29, the semiconductor device 2m includes a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210f and first and second individual impurity regions 220f may respectively include a common source/drain region 212 and first and second individual source/drain regions 222. The common impurity region 210f may further include common LDD regions 214b and the first and second individual impurity regions 220f may further respectively include first and second individual LDD regions 224b.

The first and second individual LDD regions 224b may have greater impurity concentrations than the common LDD regions 214b. The common LDD regions 214b and the first and second logic LDD regions 234 and 244 may have substantially the same impurity concentrations.

Referring to FIGS. 14 and 29, the semiconductor device 2m of FIG. 29 includes the first cell transistor TR-C1 and the second cell transistor TR-C2, which are symmetrical or substantially symmetrical to each other about the common impurity region 210f. The first cell transistor TR-C1 and the second cell transistor TR-C2 may have the same structures as that of the cell transistor TR-C of FIG. 14 except that the first and second cell transistors TR-C1 and TR-C2 share the common impurity region 210f.

Figure 30:
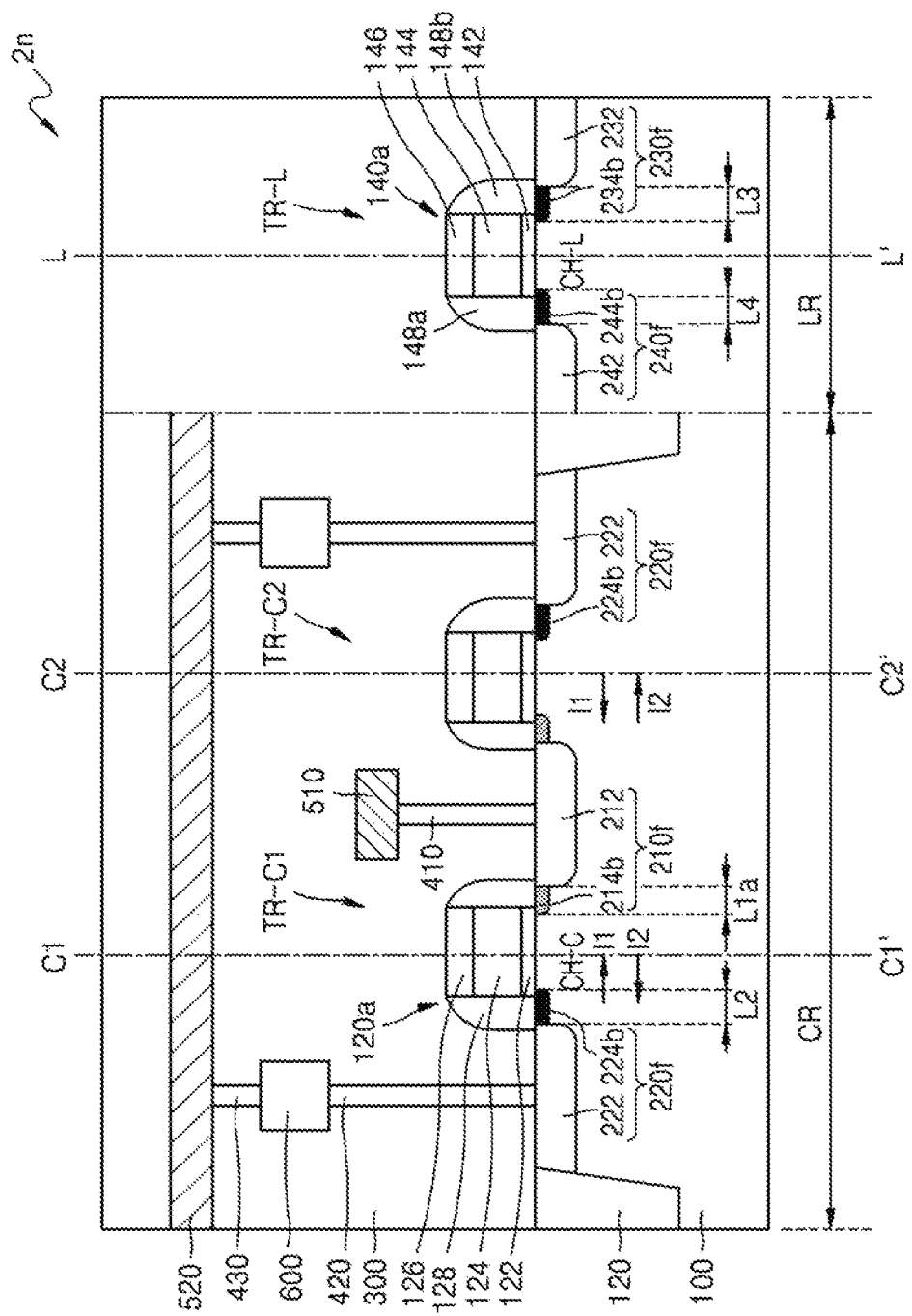
FIG. 30 is a cross-sectional view illustrating relevant portions of a semiconductor device including a magneto-resistive device according to an embodiment disclosed herein.

FIG. 30 is a cross-sectional view illustrating relevant portions of a semiconductor device 2n including first and second magneto-resistive devices 600 according to an embodiment disclosed herein.

Referring to FIG. 30, the semiconductor device 2n comprises a substrate 100 having a cell region CR and a logic region LR. In the cell region CR, two first and second cell transistors TR-C1 and TR-C2 and the first and second magneto-resistive devices 600 are formed. In the logic region LR, a logic transistor TR-L is formed.

A common impurity region 210f and first and second individual impurity regions 220f may respectively include a common source/drain region 212 and first and second individual source/drain regions 222. The common impurity region 210f may further include common LDD regions 214b and the first and second individual impurity regions 220f may further respectively include first and second individual LDD regions 224b.

The first and second individual LDD regions 224b may have greater impurity concentrations than the common LDD regions 214b. The first and second individual LDD regions 224B and first and second logic LDD regions 234b and 244b may have substantially the same impurity concentrations.

Referring to FIGS. 15 and 30, the semiconductor device 2n of FIG. 30 includes the first cell transistor TR-C1 and the second cell transistor TR-C2, which are symmetrical or substantially symmetrical to each other about the common impurity region 210f. The first cell transistor TR-C1 and the second cell transistor TR-C2 may have the same structures as that of the cell transistor TR-C of FIG. 15 except that the first and second cell transistors TR-C1 and TR-C2 share the common impurity region 210f.

Figure 31:
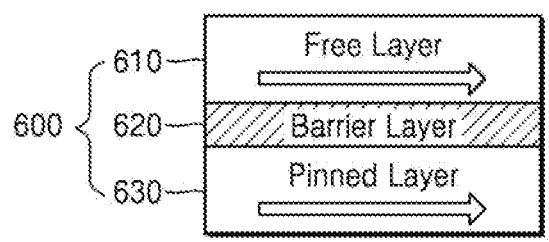
FIG. 31 is a cross-sectional view illustrating relevant portions of a magneto-resistive device included in a semiconductor device according to an embodiment disclosed herein.

FIG. 31 is a cross-sectional view illustrating relevant portions of a magneto-resistive device 600 included in a semiconductor device according to an embodiment disclosed herein.

Referring to FIG. 31, the magneto-resistive device 600 comprises a free layer 610, a pinned layer 630, and a barrier layer 620 interposed between the free layer 610 and the pinned layer 630.

The free layer 610 has a magnetization easy axis in a direction perpendicular to a surface of a film that constitutes the free layer 610, and a magnetization direction of the free layer 610 varies according to conditions. The pinned layer 630 has a magnetization easy axis in a direction perpendicular to a surface of a film that constitutes the pinned layer 630, and a magnetization direction of the pinned layer 630 is fixed. A resistance value of the magneto-resistive device 600 varies depending on the magnetization direction of the free layer 610. If the magnetization direction of the free layer 610 and that of the pinned layer 630 are parallel to each other, the magneto-resistive device 600 may have a low-resistance value and may store a data bit having binary value of 0. If the magnetization directions of the free layer 610 and the pinned layer 630 are anti-parallel, the magneto-resistive device 600 may have a high-resistance value and may store a data bit having binary value of 1. Positions of the pinned layer 630 and the free layer 610 are not limited to those illustrated in FIG. 31, and may be switched. Alternatively, opposite pieces of data may be stored in the magneto-resistive device 600 according to the magnetization directions of the free layer 610.

The free layer 610 may have interface perpendicular magnetic anisotropy (IPMA) at an interface (i.e., a contact surface) between the free layer 610 and the barrier layer 620. The pinned layer 630 may have IPMA at an interface (i.e., a contact surface) between the pinned layer 630 and the barrier layer 620.

To this end, the free layer 610 and the pinned layer 630 may be formed of a ferromagnetic material. The ferromagnetic material may have relatively high magnetic anisotropy energy Ku of, for example, about 106 to about 107 erg/cc. The free layer 610 and the pinned layer 630 may have magnetization easy axes that are perpendicular to the interfaces due to such high magnetic anisotropy energy.

The free layer 610 is a magnetic layer having a variable magnetization direction. In other words, the free layer 610 may include a ferromagnetic material having a magnetic moment, of which a magnetization direction varies freely from a direction perpendicular to a surface of the free layer 610, for example, at least one selected from Co, Fe, and Ni, and may further include another element, such as B, Cr, Pt, or Pd. The free layer 610 may be formed of a different material from a material used to form the pinned layer 630, or may be formed of the same material as that used to form the pinned layer 630.

The pinned layer 630 is a magnetic layer having a fixed magnetization direction. A ferromagnetic material used to form the pinned layer 630 may include at least one selected from Co, Fe, and Ni, and may further include another element, such as B, Cr, Pt, or Pd.

According to the present embodiment, the pinned layer 630 is a single layer. Embodiments disclosed herein, however, are not limited thereto, and the pinned layer 630 may have a multi-layered structure.

In some embodiments, the pinned layer 630 may have a multi-layered structure in which a first layer formed of at least one selected from Co and a Co alloy and a second layer formed of at least one selected from Pt, Ni and Pd are stacked, or may be an FePt layer or CoPt layer having an $L_{10}$ structure or an alloy layer of a rare-earth element and a transition metal. The rare-earth element may be at least one selected from Tb and Gd, and the transition metal may be at least one selected from Ni, Fe and Co. Various alloys of various combinations of a rare-earth element and a transition material may be used. Among them, CoFeB or CoFe may be used to form the pinned layer 630.

The barrier layer 620 is interposed between the free layer 610 and the pinned layer 630 in order to increase a tunnel magnetoresistance ratio (TMR) of the magneto-resistive device 600. The barrier layer 620 may have a thickness of about 8 Å to about 15 Å. The barrier layer 620 may have a thickness that is less than a Spin Diffusion Distance. The barrier layer 620 may include a non-magnetic material. The barrier layer 620 may include at least one material selected from, for example, magnesium (Mg), titanium (Ti), aluminum (Al), oxide of Mg-zinc (MgZn), oxide of Mg-boron (MgB), nitride of Ti and nitride of vanadium (V). The barrier layer 620 may have, for example, a multi-layered structure.

In some embodiments, the free layer 610, the barrier layer 620, and the pinned layer 630 may have identical crystal structures. For example, each of the free layer 610, the barrier layer 620, and the pinned layer 630 may have a body centered cubic (BCC) crystal structure.

Figure 32:
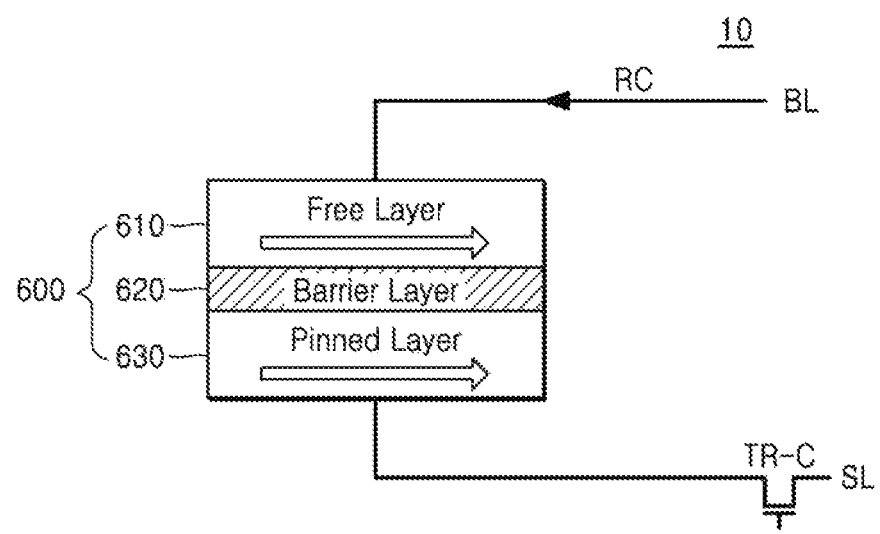
FIG. 32 is a schematic diagram showing an operation of reading data from a magneto-resistive device included in a semiconductor device according to an embodiment disclosed herein.

FIG. 32 is a schematic diagram showing an operation of reading data from the magneto-resistive device 600 included in the semiconductor device 10 according to an embodiment disclosed herein.

Figure 33:
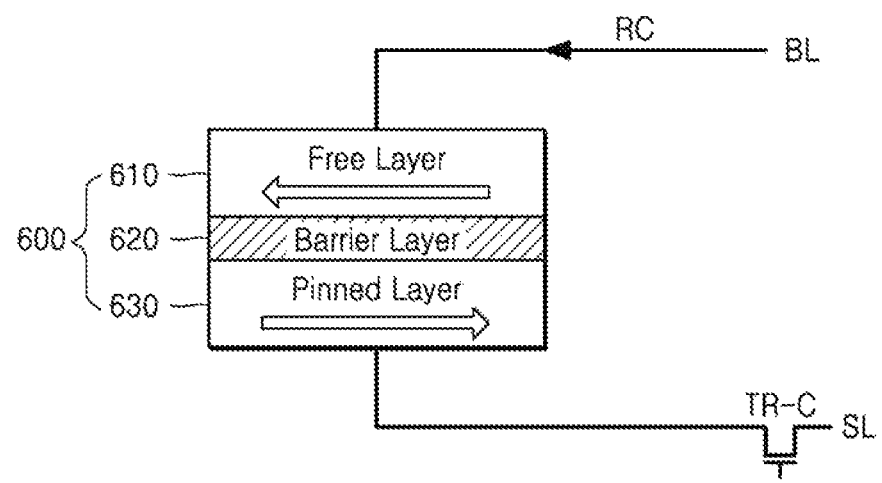
FIG. 33 is a schematic diagram showing an operation of reading data from a magneto-resistive device included in a semiconductor device according to an embodiment disclosed herein.

FIG. 33 is a schematic diagram showing an operation of reading data from the magneto-resistive device 600 included in the semiconductor device 10 according to an embodiment disclosed herein.

Referring to FIGS. 32 and 33, magnetization directions depending on data written to the magneto-resistive device 600 are illustrated. A resistance value of the magneto-resistive device 600 varies depending on the magnetization direction of the free layer 610. If a read current RC is introduced into the magneto-resistive device 600, a data voltage is output according to the resistance value of the magneto-resistive device 600. The magnetization direction of the free layer 610 is not changed by the read current RC because the intensity of the read current RC is much smaller than that of each of the write currents WC1 and WC2 of FIG. 1.

Referring to FIG. 32, the magnetization direction of the free layer 610 and that of the pinned layer 630 are parallel to each other in the magneto-resistive device 600. In this case, the magneto-resistive device 600 has a low-resistance value. In this case, if the read current RC is flowed into the semiconductor device 10, data "0" may be read.

Referring to FIG. 33, the magnetization direction of the free layer 610 and that of the pinned layer 630 are anti-parallel to each other in the magneto-resistive device 600. In this case, the magneto-resistive device 600 has a high-resistance value. In this case, if the read current RC is flowed into the semiconductor device 10, data "1" may be read.

According to the present embodiment, the free layer 610 and the pinned layer 630 of the magneto-resistive device 600 are horizontal magnetic devices. According to other embodiments disclosed herein, however, the free layer 610 and the pinned layer 630 may be vertical magnetic devices.

Figure 34:
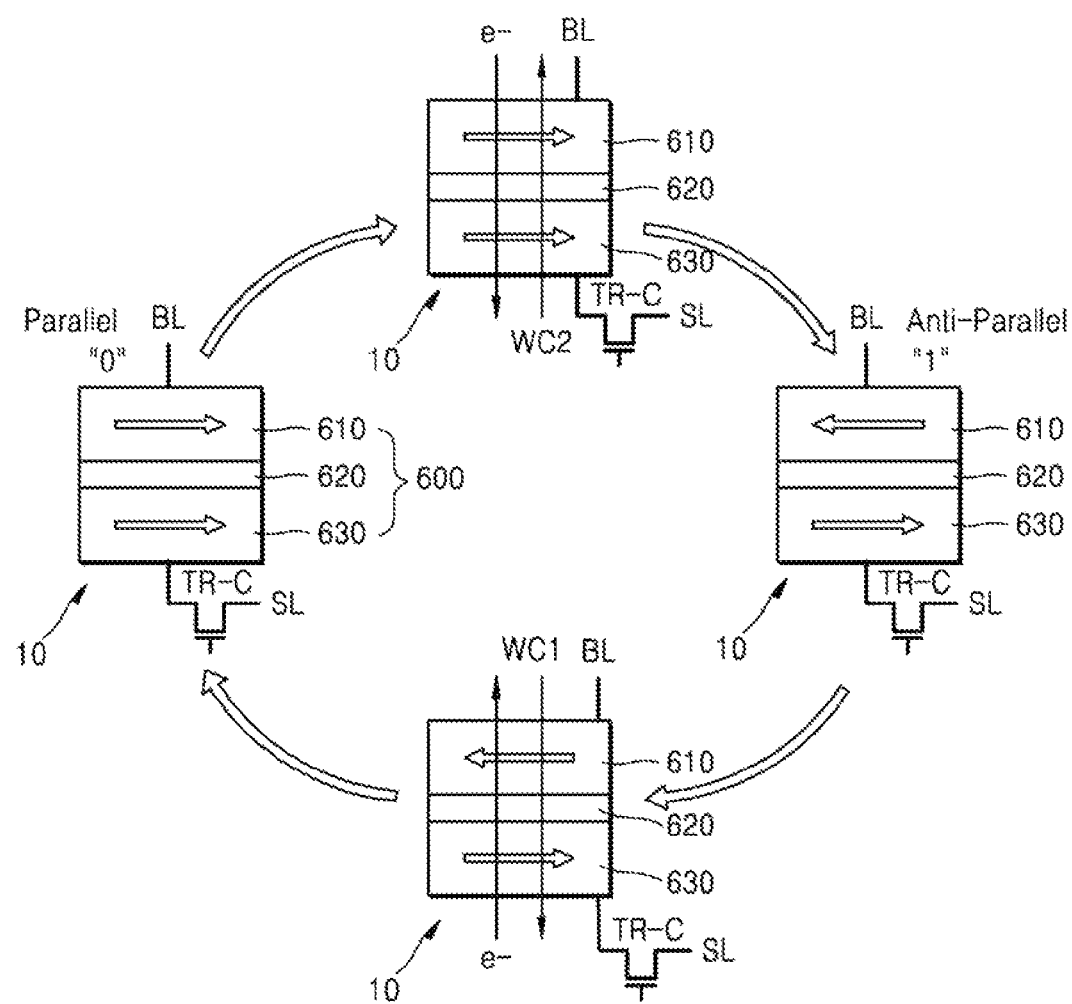
FIG. 34 is a schematic diagram showing a write operation of a magneto-resistive device included in a semiconductor device according to an embodiment disclosed herein.

FIG. 34 is a schematic diagram showing a write operation of the magneto-resistive device 600 included in the semiconductor device 10 according to an embodiment disclosed herein.

Referring to FIG. 34, the magnetization direction of the free layer 610 may be determined according to the directions of the write currents WC1 and WC2 flowing in the magneto-resistive device 600. For example, if the first write current WC1 is applied from the free layer 610 to the pinned layer 630, free electrons having the same spin direction as the pinned layer 630 apply a torque to the free layer 610. Accordingly, the free layer 610 is magnetized in parallel to the pinned layer 630.

If the second write current WC2 is applied from the pinned layer 630 to the free layer 610, free electrons having an opposite direction to the pinned layer 630 return to the free layer 610 and apply a torque to the free layer 610. Accordingly, the free layer 610 is magnetized in a direction anti-parallel to the pinned layer 630. In other words, in the magneto-resistive device 600, the magnetization direction of the free layer 610 may vary according to a spin transfer torque (STT).

Figure 35:
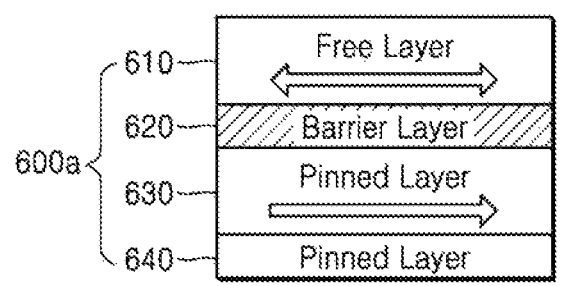
FIG. 35 is a cross-sectional view of a magneto-resistive device included in a semiconductor device according to an embodiment disclosed herein.

FIG. 35 is a cross-sectional view showing a magneto-resistive device 600a included in a semiconductor device according to an embodiment disclosed herein.

Referring to FIG. 35, the magneto-resistive device 600a may include a free layer 610, a barrier layer 620, a pinned layer 630, and an anti-ferromagnetic layer 640. The free layer 610 may include a material having a variable magnetization direction. The magnetization direction of the free layer 610 may be changed according to an electrical/magnetic factor that is provided from the inside and/or outside of the magneto-resistive device 600a. The free layer 610 may include a ferromagnetic material including at least one material selected from cobalt (Co), iron (Fe), and nickel (Ni). For example, the free layer 610 may include at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The barrier layer 620 may have a thickness that is less than a Spin Diffusion Distance. The barrier layer 620 may include a non-magnetic material. The barrier layer 620 may include at least one material selected from, for example, magnesium (Mg), titanium (Ti), aluminum (Al), oxide of Mg-zinc (MgZn), oxide of Mg-boron (MgB), nitride of Ti and nitride of vanadium (V).

The pinned layer 630 may have a magnetization direction that is fixed by the anti-ferromagnetic layer 640. The pinned layer 630 may include a ferromagnetic material. For example, the pinned layer 630 may include at least one selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer 640 may include an anti-ferromagnetic material. For example, the anti-ferromagnetic layer 640 may include at least one selected from PtMn, IrMn, MnO, MnS, MnTe, $MnF_2$, $FeCl_2$, FeO, $CoCl_2$, CoO, $NiCl_2$, NiO, and Cr.

A stray field may be generated on an edge of the ferromagnetic body because each of the free layer 610 and the pinned layer 630 is formed of a ferromagnetic body. The stray field may decrease a magnetic resistance or increase a resistive magnetism of the free layer 610. In addition, the stray field affects switching characteristics, and thus asymmetrical switching may be formed.

Figure 36:
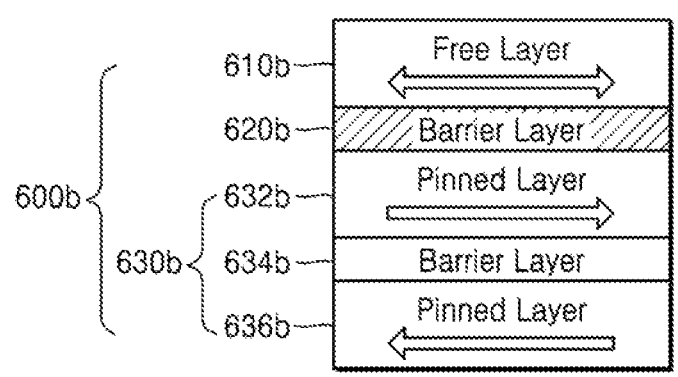
FIG. 36 is a cross-sectional view of a magneto-resistive device included in a semiconductor device according to an embodiment disclosed herein.

FIG. 36 is a cross-sectional view showing a magneto-resistive device 600b included in a semiconductor device according to an embodiment disclosed herein.

Referring to FIG. 36, the magneto-resistive device 600b may comprise a free layer 610b, a first bather layer 620b, and a pinned layer 630b. The pinned layer 630b may have a synthetic antiferromagnetic (SAF) structure. The pinned layer 630b may include, for example, a first pinned layer 632b, a second barrier layer 634b, and a second pinned layer 636b.

For example, each of the first and second pinned layers 632b and 636b may include at least one material selected from CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. In this case, the first pinned layer 632b and the second pinned layer 636b may have different magnetization directions, and the magnetization direction of each of the first and second pinned layers 632b and 636b may be fixed. The second barrier layer 634b may include at least one selected from, for example, Ru, Cu, Al, Au, Ag, and a mixture thereof.

The first and second pinned layers 632b and 636b magnetized in opposite directions may offset stray magnetic fields thereof. Thus, the stray magnetic field generated in the pinned layer 630b may be suppressed or prevented from affecting the free layer 610b.

Figure 37:
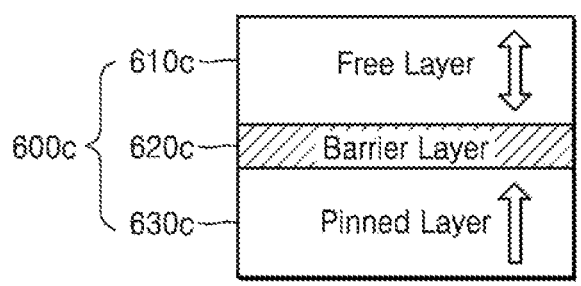
FIG. 37 is a cross-sectional view of a magneto-resistive device included in a semiconductor device according to an embodiment disclosed herein.

FIG. 37 is a cross-sectional view showing a magneto-resistive device 600c included in a semiconductor device according to an embodiment disclosed herein.

Referring to FIG. 37, a magnetization direction of the magneto-resistive device 600c is vertical, and a current-moving direction and a magnetization easy axis are substantially parallel to each other. The magneto-resistive device 600c comprises a free layer 610c, a barrier layer 620c, and a pinned layer 630c. If a magnetization direction of the free layer 610c and a magnetization direction of the pinned layer 630c are parallel to each other, a resistance value decreases. If the magnetization direction of the free layer 610c and the magnetization direction of the pinned layer 630c are anti-parallel to each other, the resistance value increases. Data may be stored in the magneto-resistive device 600c according to such a resistance value.

To obtain a magneto-resistive device 600c having a vertical magnetization direction, the free layer 610c and the pinned layer 630c may be formed of a material having high magnetic anisotropy energy. Examples of the material having high magnetic anisotropy energy include an amorphous rare-earth element alloy, a multi-layered thin film such as (Co/Pt)n or (Fe/Pt)n, and an ordered lattice material having an $L_{10}$ crystal structure. For example, the free layer 610c may be an ordered alloy, and may include at least one selected from Fe, Co, Ni, palladium (Pd), and platinum (Pt). Alternatively, the free layer 610c may include at least one selected from a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$, when being chemically quantitatively represented.

The pinned layer 630c may be an ordered alloy, and may include at least one selected from Fe, Co, Ni, Pd, and Pt. For example, the pinned layer 630c may include at least one selected from a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be $Fe_{50}Pt_{50}$, $Fe_{50}Pd_{50}$, $CO_{50}Pd_{50}$, $CO_{50}Pt_{50}$, $Fe_{30}Ni_{20}Pt_{50}$, $CO_{30}Fe_{20}Pt_{50}$, or $Co_{30}Ni_{20}Pt_{50}$, when being chemically quantitatively represented.

Figure 38:
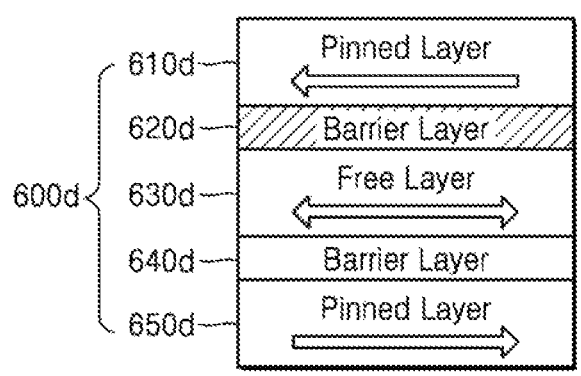
FIG. 38 is a cross-sectional view of a magneto-resistive device included in a semiconductor device according to an embodiment disclosed herein.

FIG. 38 is a cross-sectional view showing a magneto-resistive device 600d included in a semiconductor device according to an embodiment disclosed herein.

Referring to FIG. 38, the magneto-resistive device 600d may comprise a first pinned layer 610d, a first barrier layer 620d, a free layer 630d, a second barrier layer 640d, and a second pinned layer 650d. A material used to form the first and second pinned layers 610d and 650d may be similar to a material used to form the pinned layer 630 of FIG. 35, a material used to form the first and second barrier layers 620d and 640d may be similar to a material used to form the barrier layer 620 of FIG. 35, and a material used to form the free layer 630d may be similar to a material used to form the free layer 610 of FIG. 35.

If a magnetization direction of the first pinned layer 610d and a magnetization direction of the second pinned layer 650d are fixed to be opposite directions, magnetic forces may be substantially offset by the first and second pinned layers 610d and 650d. Accordingly, the magneto-resistive device 600d may perform a write operation by using a small amount of current. The magneto-resistive device 600d may obtain an accurate data value because the magneto-resistive device 600d provides a higher resistance during a read operation due to the second barrier layer 640d.

Figure 39:
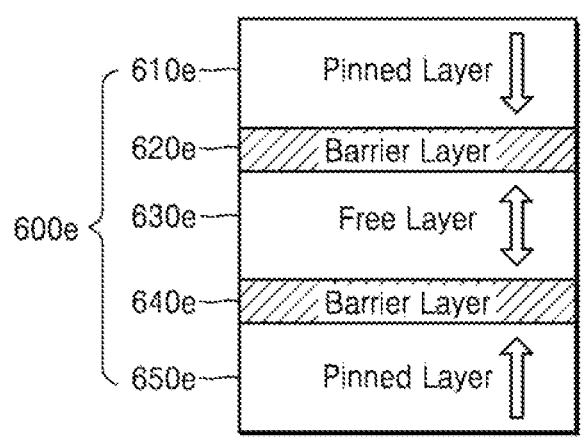
FIG. 39 is a cross-sectional view of a magneto-resistive device included in a semiconductor device according to an embodiment disclosed herein.

FIG. 39 is a cross-sectional view showing a magneto-resistive device 600e included in a semiconductor device according to an embodiment disclosed herein.

Referring to FIG. 39, the magneto-resistive device 600e may comprise a first pinned layer 610e, a first barrier layer 620e, a free layer 630e, a second barrier layer 640e, and a second pinned layer 650e. A material used to form the first and second pinned layers 610e and 650e may be similar to a material used to form the pinned layer 630c of FIG. 37, a material used to form the first and second barrier layers 620e and 640e may be similar to a material used to form the barrier layer 620c of FIG. 37, and a material used to form the free layer 630e may be similar to a material used to form the free layer 610 of FIG. 37.

In this case, if a magnetization direction of the first pinned layer 610e and a magnetization direction of the second pinned layer 650e are fixed to be opposite directions, magnetic forces may be substantially offset by the first and second pinned layers 610e and 650e. Accordingly, the magneto-resistive device 600e may perform a write operation by using a small amount of current.

Figure 40:
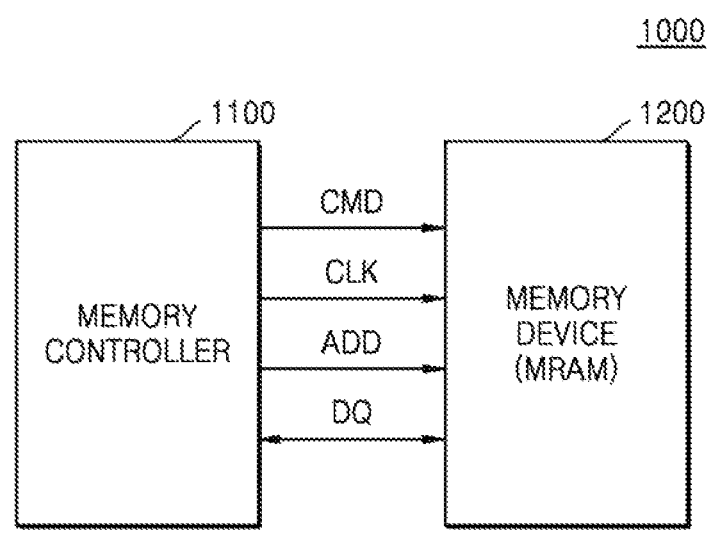
FIG. 40 is a block diagram of a semiconductor memory system including a semiconductor device including a magneto-resistive device according to embodiments disclosed herein.

FIG. 40 is a block diagram of a semiconductor memory system 1000 including a semiconductor device including a magneto-resistive device according to embodiments disclosed herein.

Referring to FIG. 40, the semiconductor memory system 1000 comprises a memory controller 1100 and a memory device 1200. The memory controller 1100 provides various signals for controlling the memory device 1200, for example, a command signal CMD, a clock signal CLK, and an address signal ADD. The memory controller 1100 provides a data signal DQ to the memory device 1200 or receives the data signal DQ from the memory device 1200, by communicating with the memory device 1200. Semiconductor memory system 1000 may be used in, but not limited to, a computing device, a personal digital assistant (PDA), a laptop computer, a mobile computer, a web tablet, a wireless phone, a cell phone, a smart phone, a digital music player, or a wireline or wireless electronic device.

The memory device 1200 may include at least one of the semiconductor devices 1a, 1b, 1c, 1d, 1e, 1f, 1g, 1h, 1i, 1j, 1k, 1l, 1m, 1n, 2a, 2b, 2c, 2d, 2e, 2f, 2g, 2h, 2i, 2j, 2k, 2l, 2m, 2n, 10, and 20 according to the embodiments of the inventive concept illustrated in FIGS. 1-39. Alternatively, the semiconductor memory system 1000 may include at least one of the semiconductor devices 1a, 1b, 1c, 1d, 1e, 1f, 1g, 1h, 1i, 1j, 1k, 1l, 1m, 1n, 2a, 2b, 2c, 2d, 2e, 2f, 2g, 2h, 2i, 2j, 2k, 2l, 2m, 2n, 10, and 20 according to the embodiments illustrated in FIGS. 1-39. In this case, the memory controller 1100 may be implemented in the logic region LR.

Figure 41:
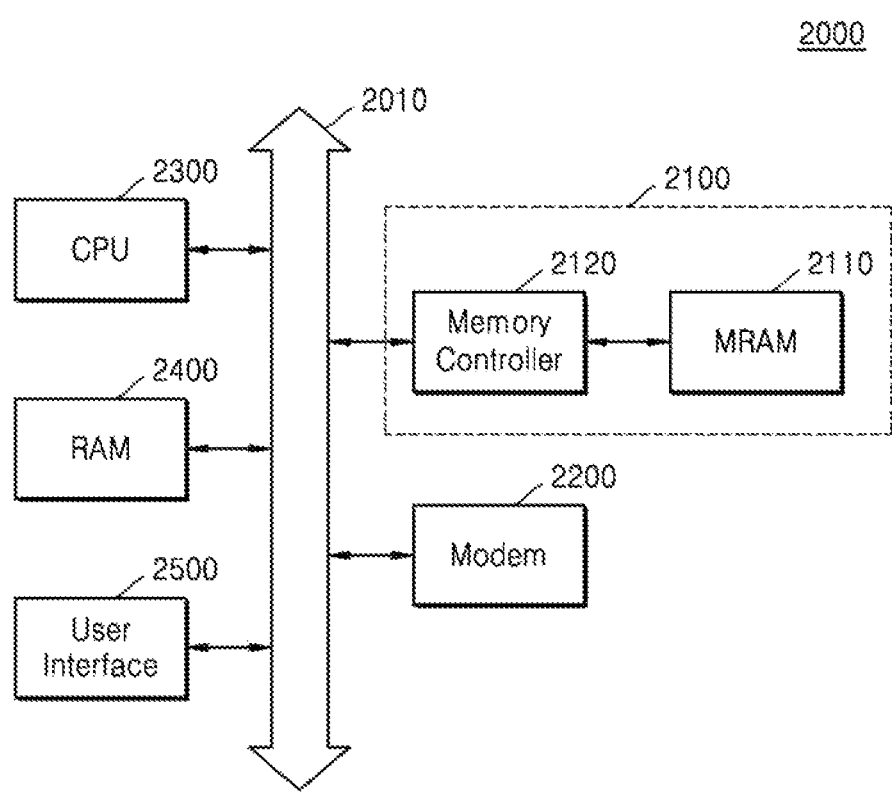
FIG. 41 is a block diagram of an information-processing system including a semiconductor device including a magneto-resistive device according to embodiments disclosed herein.

FIG. 41 is a block diagram of an information-processing system 2000 including a semiconductor device including a magneto-resistive device according to embodiments disclosed herein.

Referring to FIG. 41, the information processing system 2000 comprises a non-volatile memory system 2100, a modem 2200, a central processing unit (CPU) 2300, a RAM 2400, and a user interface (UI) 2500, which are electrically connected via a bus 2010.

The non-volatile memory system 2100 may include a memory 2110 and a memory controller 2120. The non-volatile memory system 2100 stores data processed by the CPU 2300 or data input from the outside. In one exemplary embodiment, user interface (UI) 2500 comprises a touch screen display. Information-processing system 2000 may be used in, but not limited to, a computing device, a personal digital assistant (PDA), a laptop computer, a mobile computer, a web tablet, a wireless phone, a cell phone, a smart phone, a digital music player, or a wireline or wireless electronic device.

At least one selected from the non-volatile memory system 2100, the memory 2110, and the RAM 2400 may include at least one of the semiconductor devices 1a, 1b, 1c, 1d, 1e, 1f, 1g, 1h, 1i, 1j, 1k, 11, 1m, 1n, 2a, 2b, 2c, 2d, 2e, 2f, 2g, 2h, 2i, 2j, 2k, 2l, 2m, 2n, 10, and 20 according to the embodiments illustrated in FIGS. 1-39.

Alternatively, the modem 2200 and/or the CPU 2300 may be implemented in the logic region LR of at least one of the semiconductor devices 1a, 1b, 1c, 1d, 1e, 1f, 1g, 1h, 1i, 1j, 1k, 11, 1m, 1n, 2a, 2b, 2c, 2d, 2e, 2f, 2g, 2h, 2i, 2j, 2k, 2l, 2m, 2n, 10, and 20 according to the embodiments illustrated in FIGS. 1-39.

The information processing system 2000 may be used in a portable computer, a web tablet, a wireless phone, a mobile phone, a digital music player, a memory card, an MP3 player, navigation, a portable multimedia player (PMP), a solid state disk (SSD), or household appliances.

Figure 42:
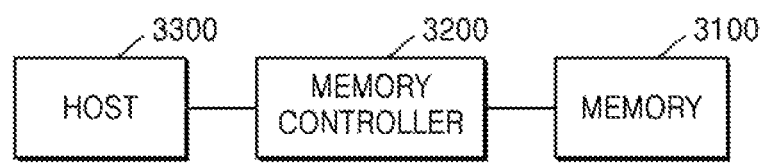
FIG. 42 is a block diagram of a memory card including a semiconductor device including a magneto-resistive device according to embodiments disclosed herein.

FIG. 42 is a block diagram of a memory card 3000 including a semiconductor device including a magneto-resistive device according to embodiments disclosed herein.

Referring to FIG. 42, the memory card 3000 includes a memory 3100 and a memory controller 3200. Memory card 3000 may be used in, but not limited to, a computing device, a personal digital assistant (PDA), a laptop computer, a mobile computer, a web tablet, a wireless phone, a cell phone, a smart phone, a digital music player, or a wireline or wireless electronic device.

The memory 3100 may store data. The memory 3100 may include at least one of the semiconductor devices 1a, 1b, 1c, 1d, 1e, 1f, 1g, 1h, 1i, 1j, 1k, 11, 1m, 1n, 2a, 2b, 2c, 2d, 2e, 2f, 2g, 2h, 2i, 2j, 2k, 2l, 2m, 2n, 10, and 20 according to the embodiments illustrated in FIGS. 1-39.

The memory controller 3200 may read data from the memory 3100 or write data to the memory 3100, in response to a read/write request from a host 3300. The memory controller 3200 may be implemented in the logic region LR of at least one of the semiconductor devices 1a, 1b, 1c, 1d, 1e, 1f, 1g, 1h, 1i, 1j, 1k, 1l, 1m, 1n, 2a, 2b, 2c, 2d, 2e, 2f, 2g, 2h, 2i, 2j, 2k, 2l, 2m, 2n, 10, and 20 according to the embodiments illustrated in FIGS. 1-39.

In a semiconductor device including a magneto-resistive device according embodiments disclosed herein, a threshold voltage of a transistor that is connected to the magneto-resistive device may be set to vary according to a current direction, and thus leakage current may be reduced if a read operation is performed. Therefore, a read margin may be provided, and power consumption may be reduced. In addition, if a write operation is performed, a difference in the current driving capability of the semiconductor device according to write current directions may be reduced.

Accordingly, a semiconductor device including a magneto-resistive device having low-power consumption and high driving capability may be provided.

Moreover, a process of manufacturing a multi-functional semiconductor device may be simplified because a logic transistor may be formed together with a cell transistor connected to the magneto-resistive device.

While the subject matter disclosed herein has been particularly shown and described with reference to exemplary embodiments thereof, it will be understood that various changes in form and details may be made therein without departing from the spirit and scope of the following claims.

What is claimed is:

1. A semiconductor device, comprising:
a cell transistor comprising a channel region, a first impurity region and a second impurity region, the first impurity region and the second impurity region being respectively arranged on both sides of the channel region in a channel direction of the cell transistor, the first impurity region and the second impurity region being asymmetrical about a center of the cell transistor in the channel direction with respect to at least one of a shape or an impurity concentration distribution, the first impurity region comprising a first hollow region formed in contact with a lower portion of a first source/drain region, and the first source/drain region and the first hollow region comprising different conductivity types;
a source line coupled to the first impurity region of the cell transistor; and
a magneto-resistive device coupled to the second impurity region of the cell transistor.

2. The semiconductor device of claim 1, wherein a lowermost surface of the first impurity region is on a level that is lower than a lowermost surface of the second impurity region.

3. The semiconductor device of claim 1, wherein the first impurity region and the second impurity region respectively comprise the first source/drain region and a second source/drain region that are symmetrical to each other about the center of the cell transistor in the channel direction.

4. The semiconductor device of claim 3, wherein
the second impurity region further comprises second hollow region that is formed in contact with a lower portion of the second source/drain region, the second hollow region comprising a different conductivity type from the second source/drain region, and
an impurity concentration of the first hollow region is greater than an impurity concentration of the second hollow region.

5. The semiconductor device of claim 3, wherein
the first impurity region and the second impurity region respectively comprise first and second Lightly Doped Drain (LDD) regions that respectively extend from the first and second source/drain regions toward the channel region, the first and second LDD regions comprising a same conductivity type as the first and second source/drain regions, and
the first LDD region and the second LDD region are asymmetrical in terms of at least one a shape or an impurity concentration distribution about the center of the cell transistor in the channel direction.

6. The semiconductor device of claim 5, wherein an impurity concentration of each of the first and second LDD regions is less than an impurity concentration of each of the first and second source/drain regions.

7. The semiconductor device of claim 5, wherein the impurity concentration of the first LDD region is less than the impurity concentration of the second LDD region.

8. The semiconductor device of claim 1, wherein a threshold voltage of the cell transistor for a current flow in a direction from the first impurity region to the second impurity region is less than a threshold voltage of the cell transistor for a current flow in a direction from the second impurity region to the first impurity region.

9. The semiconductor device of claim 8, wherein the cell transistor is an n-type metal oxide semiconductor field effect transistor (n-MOSFET).

10. A semiconductor device, comprising:
first and second cell transistors, the first and second cell transistors comprising a common impurity region, a first individual impurity region and a second individual impurity region, the common impurity region comprising a first end and a second end, a first channel region being disposed between the first end of the common impurity region and the first individual impurity region and a second channel region being disposed between the second end of the common impurity region and the second individual impurity region, the first end of the common impurity region and the first individual impurity region being asymmetrical to each other about a center of the first channel region with respect to at least one of a shape, an impurity concentration distribution about a center of the channel region of the first individual impurity region in the channel direction, and the second end of the common impurity region and the second individual impurity region being asymmetrical to each other about a center of the second channel region with respect to at least one of a shape and an impurity concentration distribution, the common impurity region comprising first and second hollow regions respectively formed in contact with the first end and the second end of a lower portion of a common source/drain region, and the first and second hollow regions respectively facing the first and second individual impurity regions;
a source line coupled to the common impurity region; and
first and second magneto-resistive devices respectively coupled to the first and second individual impurity regions.

11. The semiconductor device of claim 10, wherein
the common impurity region, the first individual impurity region, and the second individual impurity region respectively comprise the common source/drain region, a first individual source/drain region, and a second individual source/drain region each having lowermost surfaces that are on an identical level.

12. The semiconductor device of claim 11, wherein
the first and second individual impurity regions respectively further comprise third and fourth hollow regions respectively formed in contact with respective lower portions of the first and second source/drain regions, the third and fourth hollow regions respectively facing the common impurity region, and
an impurity concentration of each of the first and second hollow regions is greater than an impurity concentration of each of the third and fourth hollow regions.

13. A semiconductor device, comprising:
a cell region comprising a cell transistor, a source line and a magneto-resistive device, the cell transistor comprising a cell channel region, a first cell impurity region and a second cell impurity region that are arranged on both sides of the cell channel region in a channel direction, the source line being coupled to the first cell impurity region, and the magneto-resistive device being coupled to the second cell impurity region, and the first cell impurity region and the second cell impurity region being asymmetrical to each other about a center of the cell transistor in a cell channel direction with respect to at least one of a shape or an impurity concentration distribution; and
a logic region comprising a logic transistor, the logic transistor comprising a logic channel region, a first logic impurity region and a second logic impurity region that are arranged on both sides of the logic channel region in a channel direction, and the first logic impurity region and the second logic impurity region being substantially symmetrical to each other about a center of the logic transistor in a logic channel direction.

14. The semiconductor device of claim 13, wherein
the first cell impurity region and the second cell impurity region respectively comprise first and second cell source/drain regions that are substantially symmetrical to each other about the center of the cell transistor in the cell channel direction, and
the first logic impurity region and the second logic impurity region respectively comprise first and second logic source/drain regions that are symmetrical to each other about the center of the logic transistor in the logic channel direction.

15. The semiconductor device of claim 14, wherein
the first and second cell impurity regions further respectively comprise first and second cell hollow regions, the first and second cell hollow regions being respectively formed in contact with lower portions of the first and second cell source/drain regions, and
an impurity concentration of the first cell hollow region is greater than an impurity concentration of the second cell hollow region.

16. The semiconductor device of claim 15, wherein
the first and second logic impurity regions respectively further comprise first and second logic hollow regions, the first and second logic hollow regions being respectively formed in contact with lower portions of the first and second logic source/drain regions, and
an impurity concentration of the first cell hollow region is greater than an impurity concentration of each of the first and second logic hollow regions.

17. The semiconductor device of claim 14, wherein an impurity concentration of each of the first and second logic hollow regions is greater than an impurity concentration of the second cell hollow region.

18. The semiconductor device of claim 13, wherein a threshold voltage of the cell transistor is greater if a current flow between the first cell impurity region and the second cell impurity region for reading data from the magneto-resistive device is in a first direction than if the current flow for reading data from the magneto-resistive device is in a second direction that is opposite to the first direction.

19. The semiconductor device of claim 13, wherein a first threshold voltage of the logic transistor for a current flow in a first direction between the first logic impurity region and the second logic impurity region and a second threshold voltage of the logic transistor for a current flow in a second direction between the first logic impurity region and the second logic impurity region are substantially the same as each other, the second direction being opposite to the first direction.

* * * * *